(12) United States Patent
Kashihara

(10) Patent No.: US 8,618,479 B2
(45) Date of Patent: Dec. 31, 2013

(54) MAGNIFYING OBSERVATION APPARATUS

(75) Inventor: Mitsuhiro Kashihara, Osaka (JP)

(73) Assignee: Keyence Corporation, Osaka (JP)

( * ) Notice: Subject to any disclaimer, the term of this patent is extended or adjusted under 35 U.S.C. 154(b) by 89 days.

(21) Appl. No.: 13/152,331

(22) Filed: Jun. 3, 2011

(65) Prior Publication Data

US 2012/0001069 A1 Jan. 5, 2012

(30) Foreign Application Priority Data

Jul. 2, 2010 (JP) ................................. 2010-152534

(51) Int. Cl.
G01N 23/00 (2006.01)

(52) U.S. Cl.
USPC ............ 250/311; 250/306; 250/307; 250/310

(58) Field of Classification Search
USPC ..................... 250/306, 307, 310, 311, 440.11
See application file for complete search history.

(56) References Cited

U.S. PATENT DOCUMENTS

| | | | | |
|---|---|---|---|---|
| 4,212,575 A * | 7/1980 | Patrick et al. | ..................... | 414/8 |
| 4,316,087 A * | 2/1982 | Yanaka et al. | ................ | 250/307 |
| 4,948,971 A * | 8/1990 | Vogen et al. | .................. | 250/310 |
| 6,855,940 B2 * | 2/2005 | Mutou | ..................... | 250/440.11 |
| 7,372,051 B2 * | 5/2008 | Tsuneta et al. | ............ | 250/492.3 |
| 7,592,606 B2 * | 9/2009 | Ishiguro et al. | .......... | 250/442.11 |
| 7,652,263 B2 * | 1/2010 | Feuerbaum | ............... | 250/396 R |
| 7,952,082 B2 * | 5/2011 | Sugizaki | ..................... | 250/492.1 |
| 2003/0066963 A1 * | 4/2003 | Parker et al. | ..................... | 250/310 |
| 2003/0089852 A1 * | 5/2003 | Ochiai et al. | ..................... | 250/310 |
| 2004/0222377 A1 * | 11/2004 | Shinada et al. | ................ | 250/310 |
| 2006/0108526 A1 * | 5/2006 | Tanaka et al. | ................. | 250/310 |
| 2006/0219914 A1 * | 10/2006 | Suga et al. | ..................... | 250/311 |
| 2006/0289752 A1 * | 12/2006 | Fukunishi et al. | ............ | 250/310 |
| 2007/0235644 A1 * | 10/2007 | Nakasuji et al. | .............. | 250/307 |
| 2007/0262255 A1 * | 11/2007 | Feuerbaum | ................... | 250/307 |
| 2008/0029699 A1 * | 2/2008 | Kaneoka et al. | .............. | 250/307 |
| 2008/0121791 A1 * | 5/2008 | Nakayama et al. | ........ | 250/252.1 |
| 2009/0101816 A1 * | 4/2009 | Noji et al. | ...................... | 250/310 |
| 2010/0140470 A1 * | 6/2010 | Shachal | ......................... | 250/307 |
| 2010/0237243 A1 * | 9/2010 | Noji et al. | ..................... | 250/310 |
| 2011/0174974 A1 * | 7/2011 | Tokuda et al. | ................ | 250/310 |
| 2011/0297827 A1 * | 12/2011 | Asai et al. | ...................... | 250/310 |
| 2012/0032079 A1 * | 2/2012 | Nakasuji et al. | .............. | 250/310 |
| 2012/0145895 A1 * | 6/2012 | Biberger et al. | .............. | 250/307 |

FOREIGN PATENT DOCUMENTS

| | | |
|---|---|---|
| JP | 05-041194 | 2/1993 |
| JP | 09-097585 | 4/1997 |
| JP | 10-214583 | 8/1998 |
| JP | 2006-040768 | 2/2006 |

* cited by examiner

Primary Examiner — David A Vanore
Assistant Examiner — Wyatt Stoffa
(74) Attorney, Agent, or Firm — Kilyk & Bowersox, P.L.L.C.

(57) ABSTRACT

Observation fields of an electron microscope image and an optical magnifying observation image are smoothly switched. A magnifying observation apparatus includes: a pair of end-face plates closes end faces of a body portion; an electron beam imaging device mounted on a first position of a cylindrical shaped outer surface of the body portion; an optical imaging device mounted on a second position being different from the first position in the outer surface; a rotating device that rotates the both imaging devices along the outer surface such that a distance from each of the both imaging devices to a common rotation axis of the both imaging devices is kept constant and optical axes of the both imaging devices are oriented toward the rotation axis; a specimen stage that is disposed in the chamber, and arranged to a position that is substantially the same to a height of the rotation axis.

24 Claims, 25 Drawing Sheets

Prior Art

MAGNIFYING OBSERVATION APPARATUS

CROSS-REFERENCE TO RELATED APPLICATIONS

The present application claims foreign priority based on Japanese Patent Application No. 2010-152534, filed Jul. 2, 2010, the contents of which is incorporated herein by reference.

BACKGROUND OF THE INVENTION

1. Field of the Invention

The present invention relates to a magnifying observation apparatus in which an optical imaging device that can obtain an optical image with an optical observation device such as an optical microscope is added to an electron microscope such as a Scanning Electron Microscope (SEM).

2. Description of Related Art

For example, a transmission electron microscope and a scanning electron microscope are well known as a charged particle beam apparatus in which a signal obtained by irradiating an observation target specimen with a charged particle beam is detected to obtain an observation image. In the electron microscope, for example, an electron traveling direction is freely deflected and an image formation system as in an optical microscope is designed in an electro-optical manner. Examples of the electron microscope includes a transmission electron microscope that forms an image of electrons transmitted through a specimen or a sample using an electron lens, a reflection electron microscope that forms an image of electrons reflected from a specimen surface, a scanning electron microscope in which the specimen surface is scanned with a focused electron beam to form an image using secondary electrons from each scanning point, and a surface emission type electron microscope (field ion microscope) that forms an image of electrons emitted from the specimen by heating or ion irradiation (for example, see Japanese Unexamined Patent Publication No. 9-97585).

In the Scanning Electron Microscope (SEM), which is one example of the electron microscope, secondary electrons and reflection electrons generated in irradiating the observation target specimen with a thin electron beam (electron probe) are taken out using detectors such as a secondary electron detector and a reflection electron detector and are displayed on a display screen such as a CRT and an LCD, and a surface mode of the specimen is mainly observed. On the other hand, in the Transmission Electron Microscope (TEM), the electron beam is transmitted through the thin-film specimen, the electrons scattered and diffracted by atoms in the specimen at this time are obtained as an electron diffraction pattern or a transmission electron microscope image, and an internal structure of a substance can mainly be observed.

When a solid-state specimen is irradiated with the electron beam, the electrons are transmitted through the solid-state specimen by electron energy. At this time, elastic collision, elastic scattering, and inelastic scattering associated with energy loss are generated by interaction between electrons and atomic nuclei constituting the specimen. In-shell electrons of a specimen element or X-rays are excited by the inelastic scattering, and the secondary electrons are emitted to lose the energy corresponding to the inelastic scattering. An emission amount of secondary electron depends on a collision angle. On the other hand, an emission amount of reflection electrons that are scattered backward by the elastic scattering and emitted again from the specimen is unique to the atomic number. In the SEM, the secondary electrons and the reflection electrons are utilized. In the SEM, the specimen is irradiated with the electrons, and the emitted secondary electrons or reflection electrons are detected to form the observation image. A Scanning Transmission Electron Microscope (STEM) in which the detector receives light transmitted through the specimen is also well known as one type of the scanning electron microscope.

Although the electron microscopes such as the SEM, the TEM, and the STEM are effectively used in the observation at a high magnifying power, the electron microscopes do not well display at a low magnifying power. Generally, the electron microscope can perform the display of tens thousands times to hundreds thousands times or millions times at the maximum magnifying power. On the other hand, the electron microscope can perform the display of several times to tens times at the minimum magnifying power. For example, in the SEM, the observation can generally be performed at the minimum magnifying power of about 5 times to about 50 times. In the observation with the electron microscope, because the display is performed at the high magnifying power from the beginning, an observation visual field becomes extremely narrow range. Therefore, it is difficult to perform visual field search that is work to finally find a site to be observed on the specimen. Preferably, the visual field search is gradually performed from the wide visual field state, namely, the state in which the specimen is displayed at the low magnifying power to the state in which the visual field is narrowed at the high magnifying power.

In order to facilitate the visual field search of such an electron microscope, there is known a method of utilizing an optical microscope in which visible wavelength light or infrared wavelength light is used and an optical observation apparatus (optical imaging device) (for example, see Japanese Unexamined Patent Publication No. 9-97585). In the observation with the optical imaging device, the display can generally be performed at a low magnifying power of the same size or less. After the specimen is observed at the low magnifying power with the optical imaging device to roughly perform the visual field search, observation is performed with the electron microscope. In order to realize this, the electron microscope is used in conjunction with the observation optical system in which the display can be performed at the lower magnifying power. The visual field search is performed based on the display performed at the low magnifying power with the observation optical system of a CMOS camera or the like. Then, the observation is performed at the high magnifying power while the observation optical system is switched to the electron beam imaging device of the SEM or the like.

In the configuration of Japanese Unexamined Patent Publication No. 9-97585, as illustrated in FIG. 27, a specimen stage provided in a chamber is moved between two imaging devices in order to obtain the images of the specimen in the same visual field from the imaging devices of the optical imaging device and the electron beam imaging device. That is, an imaging device side is fixed, and a specimen side is moved or tilted by a stage driving section, thereby moving and changing the visual field of the observation image. For example, after one specimen is focused from immediately above to obtain the image, an angle between the imaging device and the specimen is changed in order to take the image in a tilt posture. At this time, because a focal distance between each imaging device and the specimen varies each time the angle is changed, it is necessary to correct the focal position. When the images of the specimen are obtained at the same tilt angle with respect to the specimen using the two imaging devices, the angle used in one of the imaging devices is stored, the specimen stage is moved to the other imaging device side, and the angle used in one of the imaging devices is reproduced to fix the focal position. Thus, extremely troublesome adjustment work is required to obtain the same image with the two imaging devices.

Additionally, there is a problem in that the position shift is generated for the heavy specimen in the type in which the specimen stage is oscillated to change a viewpoint while the imaging device side is fixed. That is, when the specimen stage is tilted, a component in a direction along the stage tilting surface is generated in a weight of the specimen. When the specimen stage has a stroke function in the XY-direction, the weight of the XY-stroke may be increased or decreased, and a spring provided to prevent backlash of an XY-axis gear may not work. Therefore, even if the specimen is fastened to the specimen stage so as not to slide down when the specimen stage is tilted, unfortunately the heavy specimen falls unless being securely fastened.

In order to solve the above problems, there is proposed an observation apparatus in Japanese Unexamined Patent Publication No. 5-41194. In the observation apparatus, as illustrated in FIG. 28, XY-stages are prepared for the optical imaging device and the electron microscope, which constitute an observation device 10 in order to place a specimen stage 33X, a specimen SAx is placed on the specimen stage 33X, and the specimen stage 33X placed on the XY-stage is translated by a transfer rod, thereby obtaining the observation position. However, in this configuration, the specimen stage 33X is translated after being pulled out from one of the XY-stages, and the specimen stage 33X is returned to the other XY-stage. Therefore, it is necessary to move the specimen stage 33X in a U-shape, which results in a problem in that a moving mechanism of the specimen stage 33X becomes complicated.

Because the coordinate positions on the XY-stages are independent of each other, coordinates of the XY-stages are not completely matched with each other. Even if XY-coordinate positions on the XY-stages are matched with each other, because the focal position between the observation device and the specimen changes when the image of the specimen is obtained in the tilted posture, it is necessary to correct the focal position. When the images of the same specimen are obtained at the same tilt angle with the two observation devices, the angle used in one of the imaging devices is stored, the specimen stage is moved to the other observation device side, and the angle is adjusted to the stored angle to fix the focal position. Such extremely troublesome adjustment work is required to correctly obtain the images having the same visual field and viewpoint.

Japanese Unexamined Patent Publication No. 10-214583 discloses an electron microscope. As illustrated in FIG. 29, the electron microscope includes a linear translation mechanism that directly moves the specimen stage pulled out from a vacuum chamber to the observation position of the optical imaging device. However, in the electron microscope, because basically the specimen stage is physically moved, it is difficult to correctly match the relative coordinate positions between the plurality of observation devices similarly to Japanese Unexamined Patent Publication No. 5-41194. In both the electron microscopes, it is necessary to insert and pull out the specimen stage in and from the vacuum chamber in switching between the observation devices. Unfortunately, a waiting time is generated in switching between the observation devices, because it takes a long time to evacuate the vacuum chamber after the vacuum chamber is opened and closed. When the translation mechanism is incorporated in the vacuum chamber, unfortunately the vacuum chamber is enlarged to require a large-capacity vacuum pump, and a time necessary for the evacuation is lengthened.

SUMMARY OF THE INVENTION

As described above, in the conventional observation apparatus, there is a problem in that it is not easy to obtain the images having the same visual field by the optical imaging device and the electron microscope imaging device, which have the different optical axes. The present invention has been made in view of the above circumstances, and an object thereof is to provide a magnifying observation apparatus that smoothly switches between an electron microscope image and an optical magnification observation image.

In order to achieve the above object, according to one embodiment of the invention, a magnifying observation apparatus may include: a body portion has a substantially cylindrical shaped outer surface and an internal space of the body portion being able to decompress as a specimen chamber; a pair of end-face plates that closes end faces of the body portion, the end faces being disposed opposite to each other; an electron beam imaging device as a first observation device, the electron beam imaging device being mounted on a first position of the cylindrical shaped outer surface of the body portion to obtain an electron microscope image in the specimen chamber; an optical imaging device as a second observation device, the optical imaging device being mounted on a second position in the cylindrical shaped outer surface of the body portion to obtain an optical image in the specimen chamber, the second position being different from the first position; a rotating device that rotates the electron beam imaging device and the optical imaging device along the cylindrical shaped outer surface of the body portion such that a distance from each of the electron beam imaging device and the optical imaging device to a common rotation axis of the electron beam imaging device and the optical imaging device is kept constant and optical axes of the electron beam imaging device and the optical imaging device are oriented toward the rotation axis; a specimen stage that is disposed in the specimen chamber to place a specimen of an observation target; and a specimen stage adjusting section that adjusts a height of an observation surface for the specimen placed on the specimen stage to a position that is substantially the same to a height of the rotation axis. With this configuration, the electron beam imaging device and the optical imaging device are moved in the rotation manner, and the specimen stage is substantially the same to a height of the rotation axis. Therefore, the distance from the electron beam imaging device to the specimen of the observation target and the distance from the optical imaging device to the specimen are always kept constant irrespective of the rotation positions of the electron beam imaging device and the optical imaging device. As a result, even if the electron beam imaging device and the optical imaging device are switched, the distance to the specimen, namely, the working distance does not change before and after the switching. Therefore, work such as a focal point adjustment associated with the switching can largely be eliminated, and a user can easily switch between the optical image and the electron microscope image. Moreover, one rotating device functions as the mechanism that moves the optical imaging device and moves the electron beam imaging device. Therefore, advantageously the mechanism that switches the optical imaging device and the electron beam imaging device can be simplified.

According to another embodiment of the invention, in the magnifying observation apparatus, the rotating device may be configured to simultaneously rotate the electron beam imaging device and the optical imaging device, and a range in which the electron beam imaging device and the optical imaging device is rotated by the rotating device is configured such that loci of the electron beam imaging device and the optical imaging device at least partly overlap each other. With this configuration, advantageously one of the observation devices can be located in the observation position of the other observation device by the rotating device, and the same specimen can be easily observed from the same viewpoint while different observation devices are switched.

According to still another embodiment of the invention, in the magnifying observation apparatus, the first position and the second position are provided on a substantially identical plane that is substantially orthogonal to the rotation axis on the cylindrical shaped outer surface of the body portion. With this configuration, the rotation planes of the electron beam imaging device and the optical imaging device are substantially identical to each other, so that advantageously the length of the body portion can be shortened to miniaturize the outer shape of the magnifying observation apparatus.

According to still another embodiment of the invention, in the magnifying observation apparatus, the first position and the second position may be fixed while brought close to each other to a degree to which the optical imaging device and the electron beam imaging device do not interfere with each other. In this configuration, the observation devices are disposed while brought close to each other to a degree to which the leading ends of the observation devices do not interfere with each other. Therefore, when the other observation device is moved to one observation position, a moving amount is suppressed to the minimum to eliminate the unnecessary moving amount, so that the switching can quickly be performed.

According to still another embodiment of the invention, in the magnifying observation apparatus, at least part of the cylindrical shaped outer surface of the body portion and one of the end-face plates constitute a rotation part that is rotated by the rotating device, the other end-face plate constitutes a fixed part that is not rotated irrespective of rotation motion of the rotating device, and the specimen stage may be fixed onto the fixed part side. With this configuration, the specimen stage is fixed irrespective of the movements, namely, the rotations of the electron beam imaging device and the optical imaging device. Therefore, the observation target is fixed to move the observing viewpoint side to the desired position, so that an observation environment in which the user can easily recognize the positional relationship can be implemented.

According to still another embodiment of the invention, in the magnifying observation apparatus, the rotating device may be disposed between the rotation part of the body portion and the fixed part of the end-face plate. Therefore, the body portion can smoothly be rotated while the rotating device is mounted on the end-face plate on the fixed part side.

According to still another embodiment of the invention, in the magnifying observation apparatus, any one of the end-face plates may form an opening and closing cover portion. Therefore, the cover portion can be opened and closed to easily take out and put in the specimen.

According to still another embodiment of the invention, in the magnifying observation apparatus, the cover portion is the fixed part, and the specimen stage may be mounted on the cover portion. Therefore, the specimen stage can be maintained in the fixed state irrespective of the rotation of the cylindrical shaped outer surface. Moreover, an orientation in which the cover portion is opened and closed can always be maintained in a constant direction by not rotating the cover portion, and the opening and closing operation of the cover portion can easily be performed while the structure is simplified.

According to still another embodiment of the invention, in the magnifying observation apparatus, the specimen stage may include a horizontal surface moving mechanism that moves the specimen stage in a horizontal plane while the specimen stage is maintained in a non-tilted state in a horizontal posture and a height adjusting mechanism that adjusts the height of the specimen stage. With this configuration, the specimen stage can be moved only in X-, Y-, and Z-axes, and tilt and oscillation are prohibited in the specimen stage. Therefore, the specimen placed on the specimen stage does not shift or slide down due to the tilt, the work to fix the specimen with an adhesive tape is eliminated to enhance workability, and breakage of the specimen caused by such an adhesive tape is also eliminated.

According to still another embodiment of the invention, in the magnifying observation apparatus, the horizontal surface moving mechanism and the height adjusting mechanism of the specimen stage may be mounted on the fixed part side.

According to still another embodiment of the invention, in the magnifying observation apparatus, the horizontal surface moving mechanism includes rotary operation knobs that adjust moving amounts of the specimen stage in an X-axis direction and a Y-axis direction, and the height adjusting mechanism may further include a rotary operation knob that adjusts a moving amount of the specimen stage in a Z-axis direction. With this configuration, operability is unified such that the moving amounts in the XY-plane and the Z-axis can be adjusted by the rotary operation knobs, so that the operation feeling of the user can be unified.

According to still another embodiment of the invention, in the magnifying observation apparatus, the cover portion may be mounted on the body portion so as to be opened and closed in a sliding manner, and the cover portion is configured to pull out the specimen stage together with the cover portion from an inside of the specimen chamber. With this configuration, the specimen stage can be pulled out from the specimen chamber in the sliding manner together with the cover portion, and the access to the specimen stage can be facilitated to easily place or exchange the specimens.

According to still another embodiment of the invention, in the magnifying observation apparatus, the height adjusting mechanism may be configured to lower the specimen stage from the position that is the same to a height of the rotation axis. With this configuration, the specimen is placed on the specimen stage while the specimen stage is the same to a height of the rotation axis, and the specimen stage is lowered by the height of the specimen. Therefore, the upper surface of the specimen, namely, the observation surface can be the same to a height of the rotation axis, and the focal distance to the observation surface of the specimen can be maintained in the same state irrespective of the rotation positions of the electron beam imaging device and the optical imaging device.

According to still another embodiment of the invention, in the magnifying observation apparatus, a moving locus of the height adjusting mechanism may include focal point variable ranges of the electron beam imaging device and the optical imaging device. With this configuration, the focal points of the electron beam imaging device and the optical imaging device can be adjusted by the height adjusting mechanism.

According to still another embodiment of the invention, in the magnifying observation apparatus, the electron beam imaging device may include an electron gun that irradiates the specimen with an electron beam, and a detector may be further provided in the fixed part in an internal surface of the specimen chamber in order to detect secondary electrons and/or reflection electrons irradiated from the electron gun and reflected by the specimen.

According to still another embodiment of the invention, in the magnifying observation apparatus, a suction port may be provided in one of the end-face plates, the suction port that sucks air in the specimen chamber to a decompression pump that decompresses the specimen chamber.

According to still another embodiment of the invention, the magnifying observation apparatus further includes an in-specimen-chamber observation device as a third observation device to observe an environment in the specimen chamber, wherein the in-specimen-chamber observation device obtains an optical image in which at least the specimen stage, the specimen placed on the specimen stage, and a leading end part of the electron beam imaging device are included in a visual field. With this configuration, the positional relationship among the specimen in the specimen chamber, the optical imaging device, and the electron beam imaging device can easily be recognized.

According to still another embodiment of the invention, in the magnifying observation apparatus, the in-specimen-chamber observation device may be provided on the fixed part side. With this configuration, in rotating the electron gun or the optical imaging device, the positional relationship among the specimen, the optical imaging device, and the electron beam imaging device can be recognized from the fixed part side, so that the presence or absence of interference between the specimen stage and the specimen on the specimen stage can easily be confirmed.

According to still another embodiment of the invention, in the magnifying observation apparatus, an optical axis of the in-specimen-chamber observation device may be substantially parallel to the rotation axis. With this configuration, when the observation device is rotated, advantageously the locus of the observation device is formed into an arc shape, and movement caused by the rotation can easily be recognized in a visual manner.

According to still another embodiment of the invention, in the magnifying observation apparatus, the optical axis of the in-specimen-chamber observation device may be located above the rotation axis. With this configuration, the relationship between the electron gun and the upper surface of the specimen placed on the specimen stage can be observed.

According to still another embodiment of the invention, the magnifying observation apparatus may further include a display section that displays an electron microscope image obtained by the electron beam imaging device and/or an optical image obtained by the optical magnifying observation device. With this configuration, the obtained electron microscope image and the obtained optical image can simultaneously be confirmed and compared by the display section, or the obtained electron microscope image and the obtained optical image can be confirmed and compared by the display section while switched.

According to still another embodiment of the invention, in the magnifying observation apparatus, an angle formed by the first position and the second position and a rotating center ranges from 30° to 50°. With this configuration, the rotating amount of which one of the observation devices is rotated to the position of the other observation device can be shortened.

According to still another embodiment of the invention, in the magnifying observation apparatus, an overlapping rotating range where a rotatable range of the optical imaging device and a rotatable range of the electron beam imaging device overlap each other may range from 60° to 180°. With this configuration, the range where the observation image can be obtained at the same observation angle can widely be secured in each observation device to enhance a degree of freedom of the observation.

According to still another embodiment of the invention, in the magnifying observation apparatus, the electron beam imaging device may include an electrostatic type or magnetic field type electron lens. With this configuration, the type of the electron beam imaging device can properly be selected according to the purpose and the application. For example, the use of the electrostatic type electron lens can achieve weight reduction, and therefore the observation device can stably be rotated to improve reliability. When the magnetic field type electron lens is selected, high magnifying power can be achieved.

According to still another embodiment of the invention, in the magnifying observation apparatus, a handgrip may be provided in the body portion in order to manually rotate the body portion. With this configuration, the user can grasp the handgrip to rotate the body portion, which allows the user to easily adjust the angle of the observation device.

According to still another embodiment of the invention, in the magnifying observation apparatus, the electron beam imaging device may be mounted on the first position in a non-exchangeable manner, and the optical imaging device may be detachably mounted on the second position. With this configuration, the optical imaging device provided in the electron microscope can be exchanged according to the observation purpose, and a degree of freedom of the optical observation used along with the electron microscope observation can be enhanced.

BRIEF DESCRIPTION OF THE DRAWINGS

FIG. 17A illustrates an overlapping rotating range of the electron beam imaging device and the optical imaging device, FIG. 17B illustrates the rotatable range of the electron beam imaging device, and FIG. 17C illustrates the rotatable range of the optical imaging device;

DETAILED DESCRIPTION OF THE INVENTION

Figure 1:
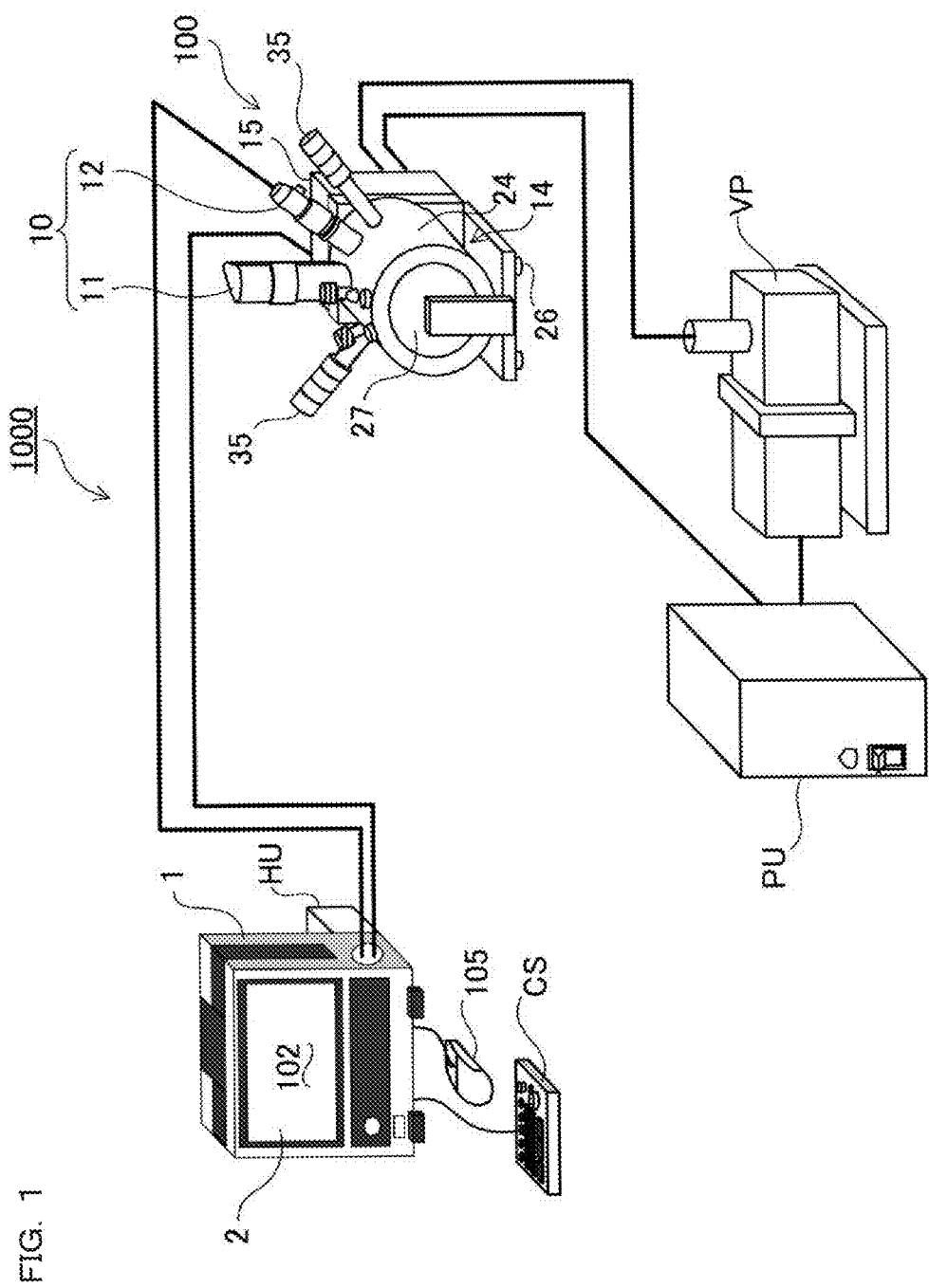
FIG. 1 is a schematic diagram illustrating an outline of a magnifying observation system.

Hereinafter, embodiments of the present invention will be described with reference to the drawings. It should be noted that the embodiments illustrate a magnifying observation apparatus in order to specify the technical concept of the invention, and the present invention is not limited to the magnifying observation apparatus described below. The member described in the claims of the present invention is not limited to the member of the embodiment. In particular, the scope of the invention is not limited to the sizes, materials, shapes, and relative disposition of the components are described merely as illustrative examples in the embodiments unless otherwise noted. The sizes and positional relationship of the members illustrated in each of the drawings may be exaggerated for the purpose of clear explanation. In the following description, the same name or reference numeral denote the same or equivalent member, and the detailed description thereof is appropriately omitted. In each element constituting the invention, a plurality of elements may include the same member, and one member may act as a plurality of elements, or the function of one member may be shared by a plurality of members.

Herein, a magnifying observation apparatus and a computer, a printer, an external storage device, and other peripherals, which are connected to the magnifying observation apparatus to perform operation, control, input/output, display, and other pieces of processing, conduct communication with each other by being electrically connected through IEEE 1394, RS-232x, RS-422, RS-423, RS-485, serial connection such as USB, parallel connection, and a network such as 10BASE-T, 100BASE-TX, and 1000BASE-T. The connection is not limited to a physical connection in which a wire is used, but a wireless LAN such as IEEE802.1x and a wireless connection such as Bluetooth (registered trademark) in which radio wave, infrared ray, and optical communication are used may also be utilized. A memory card, a magnetic disk, an optical disk, a magneto-optical disk, and a semiconductor memory can be used as a recording medium in order to store observation image data and setting.

As used herein, the electron microscope image means a monochrome image that is obtained by an electron beam imaging device of an electron microscope to mainly include luminance information on an observation target and displayed by shades. The optical image means a color image that is obtained by an optical imaging device with visible light or ultraviolet light to mainly include color information. In the optical image, an infrared observation image obtained by an infrared camera can be used in addition to a visible-light observation image obtained by a visible-light camera. As described below, the electron microscope image can be colored based on the color information on the optical image. "The electron beam imaging device or the optical imaging device obtains the image" generally means that the image is obtained with the electron beam imaging device or the optical imaging device. However, "the electron beam imaging device or the optical imaging device obtains the image" also means a concept that the image obtained by the other member is captured in the electron microscope. The meaning of obtaining the image includes such a concept.

In the following embodiments, a SEM that is one of electron microscopes is described as an implementation example of the magnifying observation apparatus of the present invention. However, the present invention can also be applied to a TEM, a STEM, and other charged particle beam apparatuses. In such cases, the electron beam imaging device can be replaced with a charged particle beam imaging device. The present invention can also be applied to a near field microscope, an atomic force microscope, and an electrostatic force microscope. Further, the optical imaging device of the present invention can also applied to an optical microscope, a laser microscope, a digital microscope, and the like.

Figure 2A:
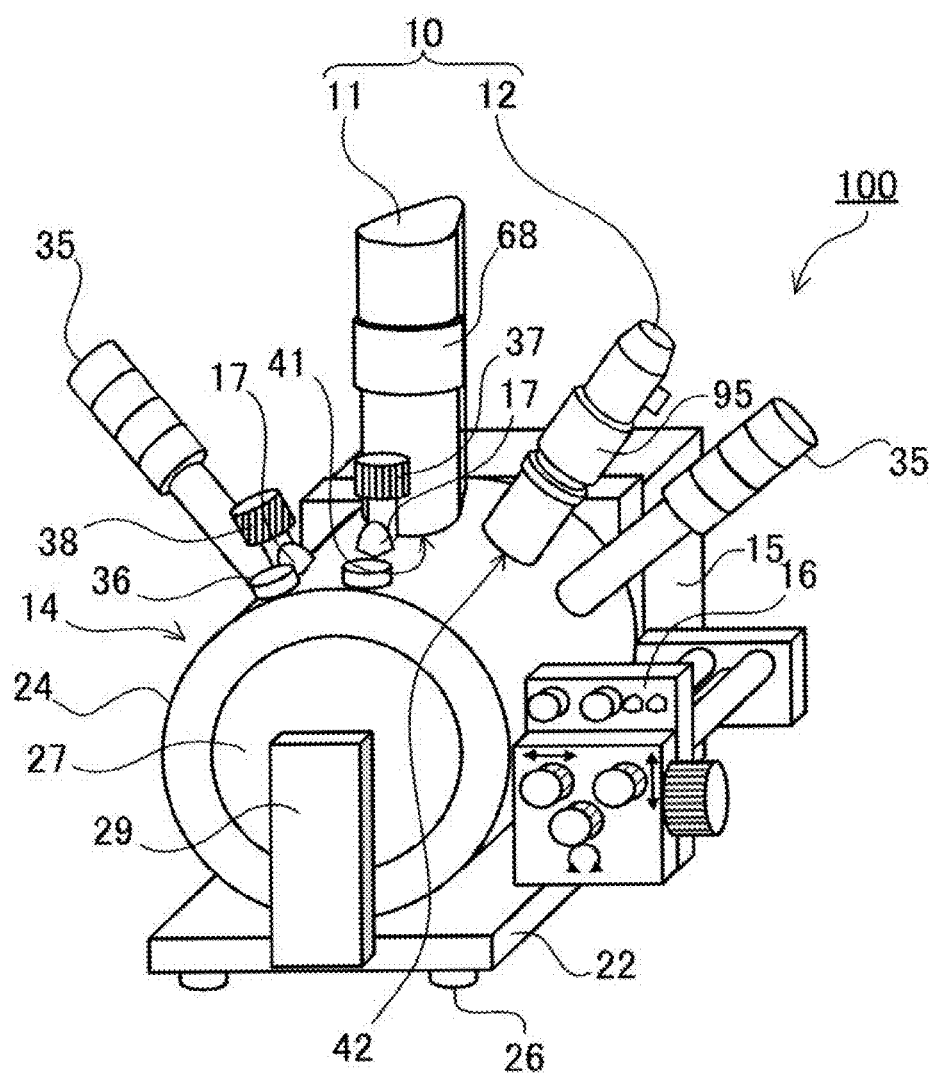
FIG. 2A is a perspective view illustrating an appearance of a magnifying observation apparatus.
Figure 2B:
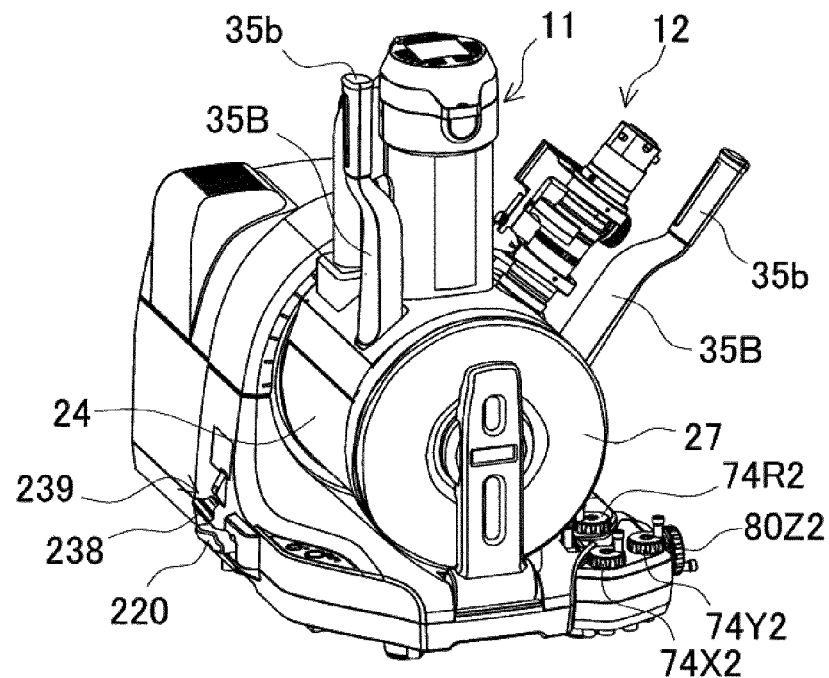
FIG. 2B is a perspective view illustrating an appearance of a magnifying observation apparatus according to a modification when viewed from the left.
Figure 2C:
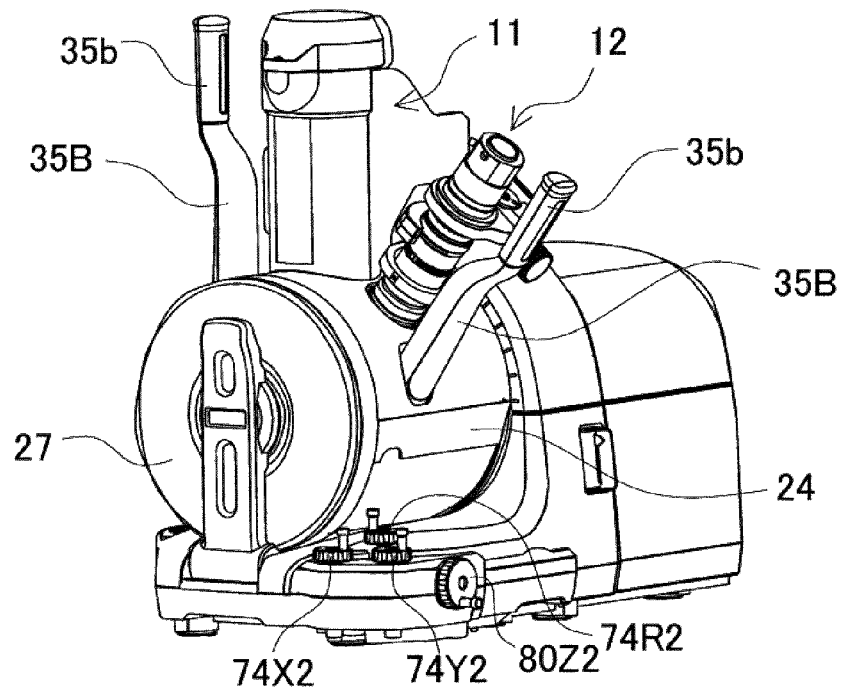
FIG. 2C is a perspective view illustrating the appearance of the magnifying observation apparatus of FIG. 2B when viewed from the right.
Figure 3:
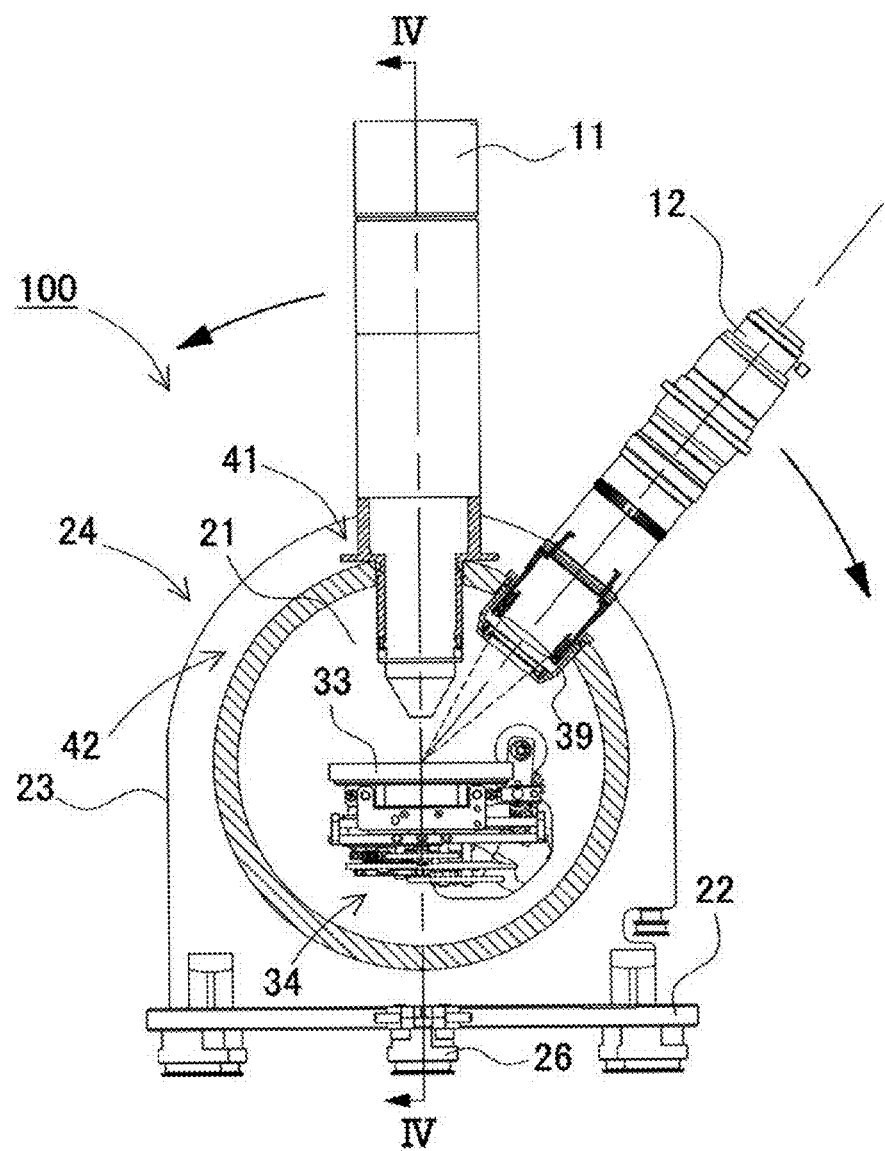
FIG. 3 is a front sectional view illustrating an inside of a specimen chamber of the magnifying observation apparatus.
Figure 4:
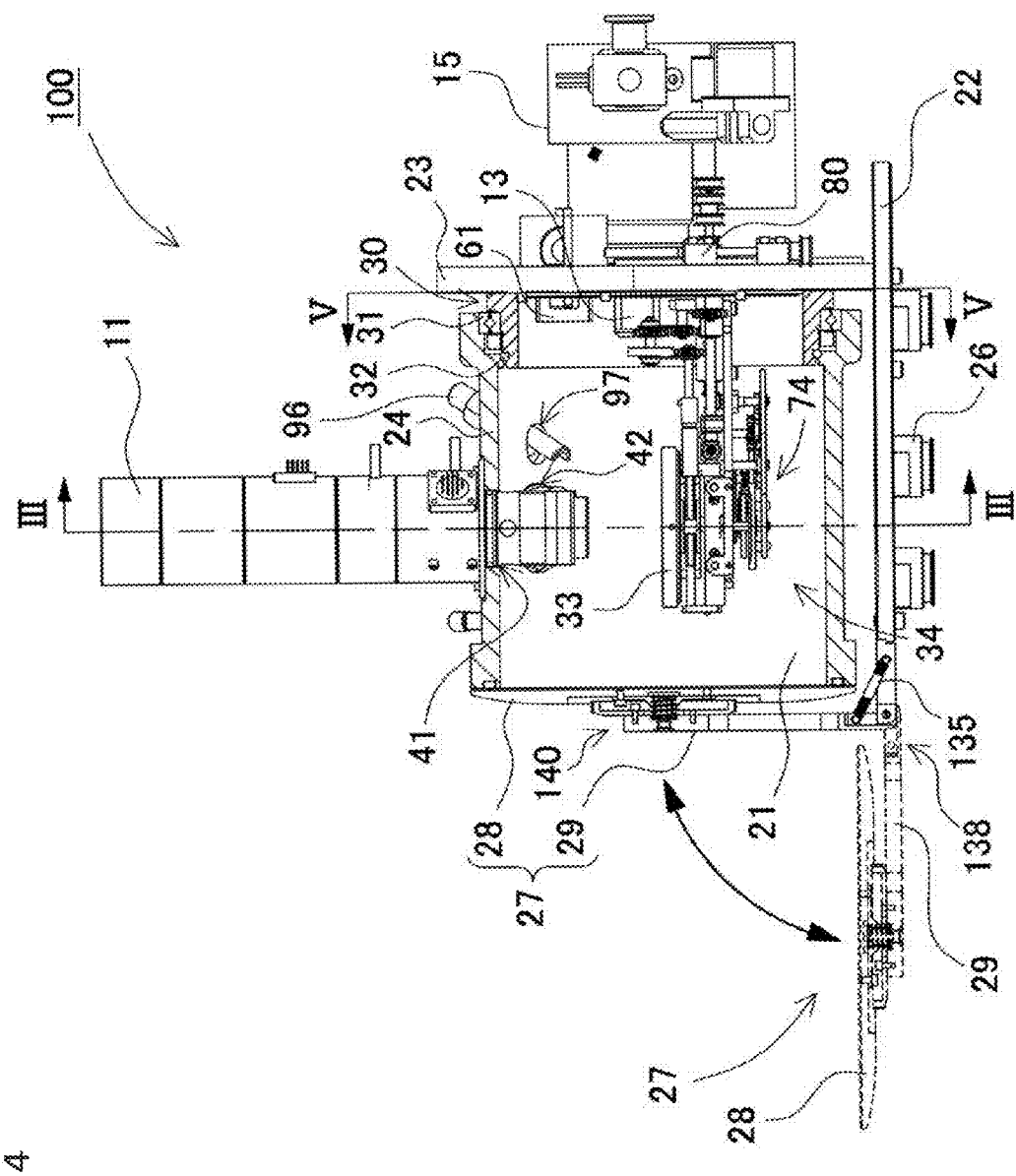
FIG. 4 is a sectional side view when viewed from line IV-IV of FIG. 3.
Figure 5:
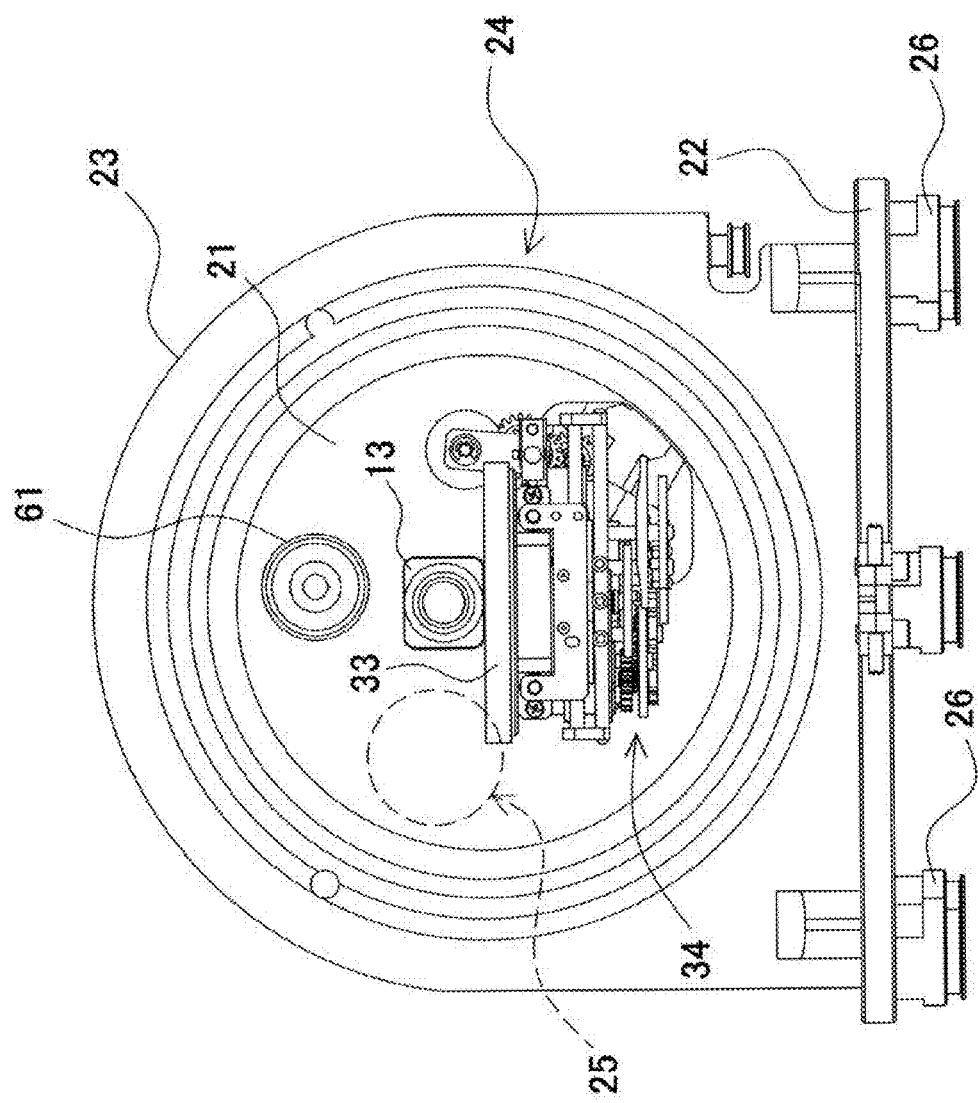
FIG. 5 is a sectional view taken along line V-V of FIG. 4.
Figure 6:
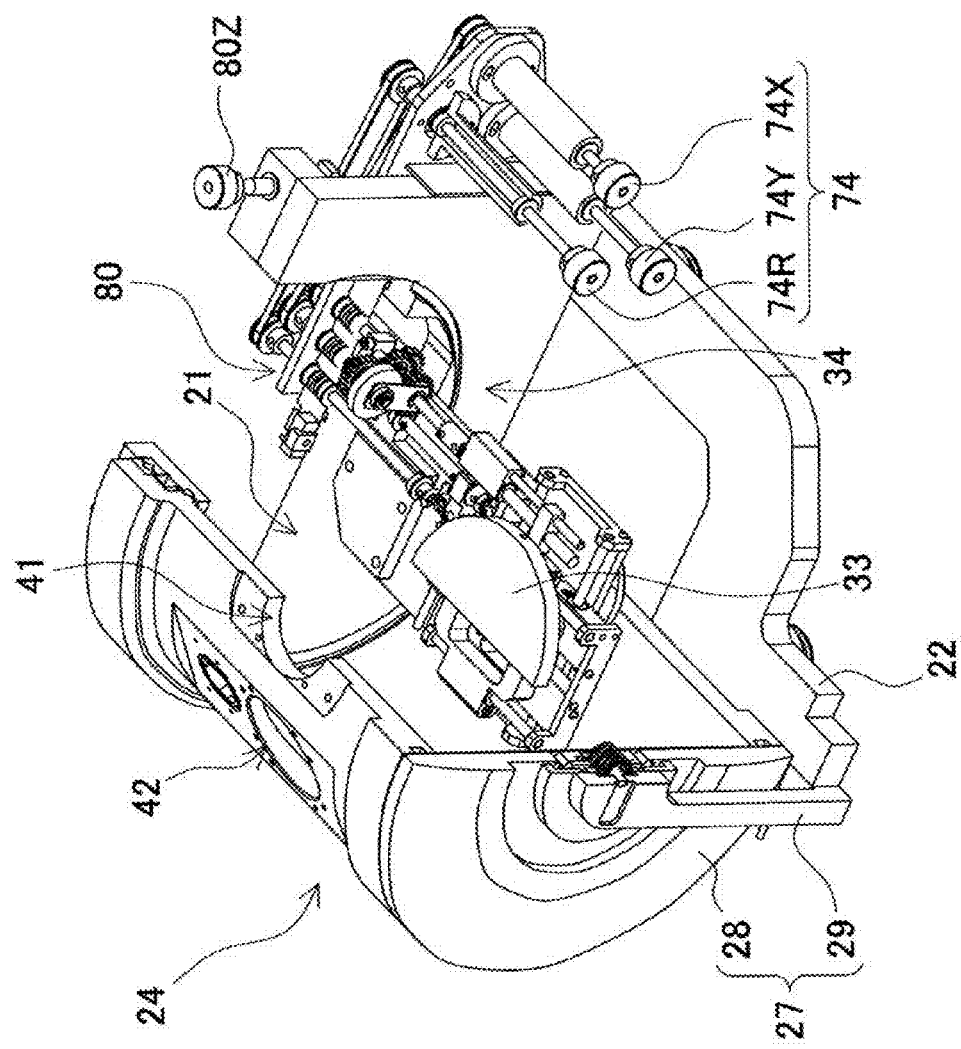
FIG. 6 is a partially sectional perspective view illustrating a horizontal surface moving mechanism of a specimen stage when viewed from the obliquely right front.
Figure 7:
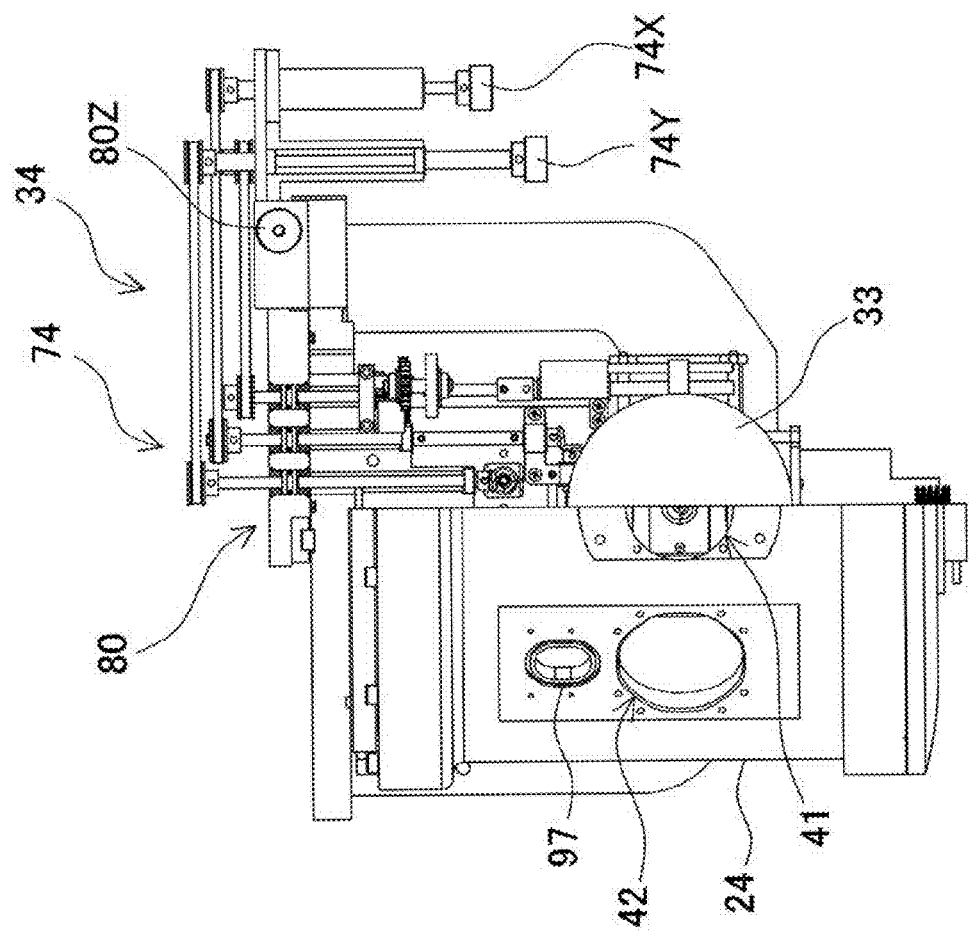
FIG. 7 is a partially sectional plan view illustrating the horizontal surface moving mechanism of FIG. 6 when viewed from above.
Figure 8:
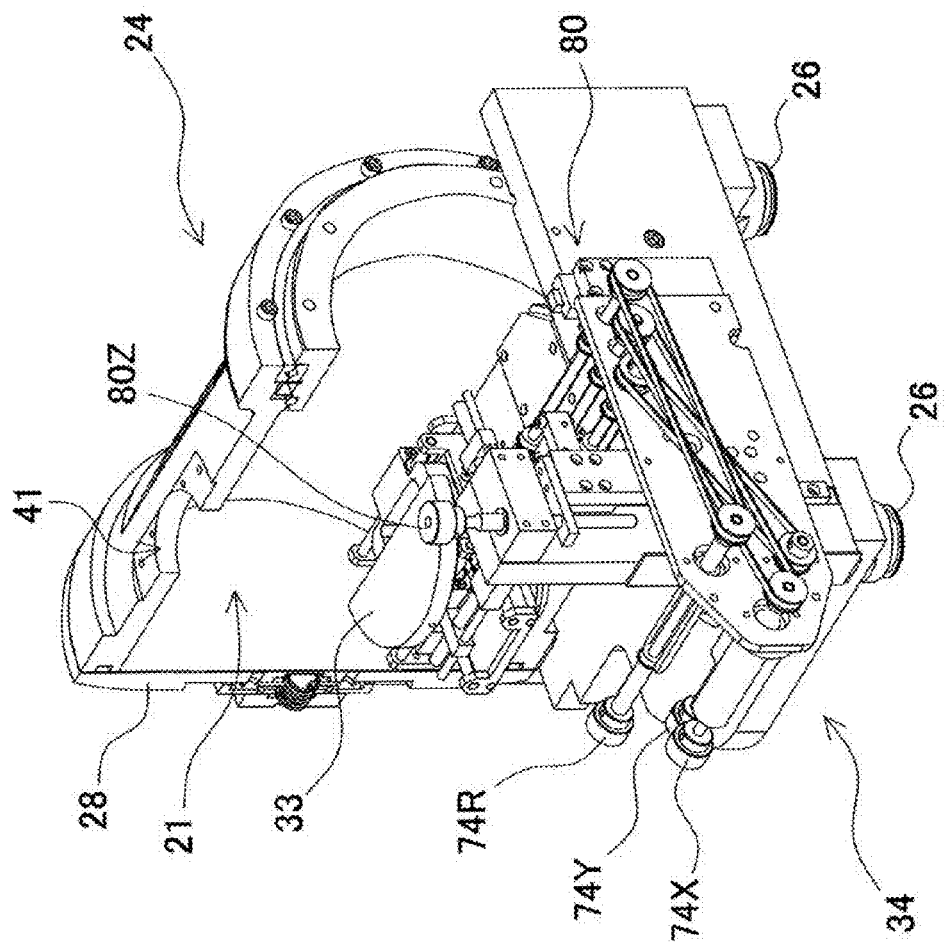
FIG. 8 is a partially sectional perspective view illustrating the horizontal surface moving mechanism of FIG. 6 when viewed from the obliquely right back.

FIGS. 1 to 8 illustrate a magnifying observation apparatus according to an embodiment of the present invention. FIG. 1 is a schematic diagram illustrating an outline of a magnifying observation system, FIG. 2A is a perspective view illustrating an appearance of a magnifying observation apparatus, FIG. 2B is a perspective view illustrating an appearance of a magnifying observation apparatus according to a modification, FIG. 2C is a perspective view illustrating the appearance of the magnifying observation apparatus of FIG. 2B when viewed from the right, FIG. 3 is a front sectional view illustrating an inside of a specimen chamber of the magnifying observation apparatus, FIG. 4 is a sectional side view when viewed from line IV-IV of FIG. 3, FIG. 5 is a sectional view taken along line V-V of FIG. 4, FIG. 6 is a partially sectional perspective view illustrating a horizontal surface moving mechanism of a specimen stage when viewed from the obliquely right front, FIG. 7 is a partially sectional plan view illustrating the horizontal surface moving mechanism of FIG. 6 when viewed from above, and FIG. 8 is a partially sectional perspective view illustrating the horizontal surface moving mechanism of FIG. 6 when viewed from the obliquely right back.

(Magnifying Observation System)

A magnifying observation system 1000 illustrated in FIG. 1 includes a magnifying observation apparatus 100, a decompression pump VP, a power-supply unit PU, and display section 2. The magnifying observation apparatus 100 includes a chamber unit 14 that maintains a specimen in an airtight manner and a decompression unit 15 that decompresses an inside of a specimen chamber 21. An electron beam imaging device 11 and an optical imaging device 12 are mounted as an observation device 10 on the chamber unit 14. The decompression unit 15 is connected to the external decompression pump VP to constitute an evacuation system pump 70 that decompresses the inside of the specimen chamber 21 to a predetermined vacuum such as high vacuum and low vacuum. Each observation device 10 is connected to the display section 2 to transmit obtained image data to the display device 2. The display section 2 includes a display, and an electron microscope image obtained by the electron beam imaging device 11 or an optical image obtained by the optical imaging device 12 can be displayed on the display.

(Power-Supply Unit PU)

A controller 1, the magnifying observation apparatus 100, and the decompression pump VP are connected to the power-supply unit PU. The power-supply unit PU is connected to an external commercial power source (not illustrated) to supply electric power to the magnifying observation apparatus 100 and the like. In this example, based on an instruction from the controller 1, the power-supply unit PU supplies a predetermined voltage to the magnifying observation apparatus 100, action of the magnifying observation apparatus 100 is controlled by the controller 1, and the obtained image is displayed in the display section 2.

(Controller 1)

In addition to a dedicated device, a general-purpose computer in which a magnifying observation apparatus operation program is installed can be used as the controller 1. An external console CS that operates the controller 1 and the display section 2, and a high-acceleration voltage unit HU that applies a high acceleration voltage to an electron gun 47 of the electron beam imaging device 11 can be attached if needed. In the example of FIG. 1, the controller 1 controls the magnifying observation apparatus 100 through the power-supply unit PU. Alternatively, the magnifying observation apparatus 100 may be directly controlled while the power-supply unit is integrated the controller.

(Display Section 2)

In FIG. 1, the controller 1 includes the display section 2. The display section 2 includes a display portion 102 on which the electron microscope image and the optical image are displayed. The images can simultaneously be displayed on one screen, or can be displayed while switched from one another. The switching of the display is manually performed from the console CS. A monitor such as a CRT, an LCD, and an organic EL can be used as the display section 2. In the example of FIG. 1, the display section 2 and the controller 1 are integrally configured. Alternatively, the display section 2 and the controller 1 may separately be configured. The console CS may also be incorporated in the controller 1 or the display section 2. For example, a touch-panel display section can be used. A connection example of each member is illustrated in FIG. 1 by way of example. Alternatively, a different connection mode or wiring can be utilized. Obviously, each member can be connected in a wireless manner if needed.

The magnifying observation system 1000 of FIG. 1 is a system that combines magnifying observation in which an optical lens such as a digital microscope is used and electron microscope observation in which an electron microscope such as a SEM is used. That is, the optical imaging device 12 is added inside the specimen chamber 21 of the electron microscope. The optical imaging device 12 as a first observation device obtains an optical image with visible light or infrared light. For example, an optical microscope and an optical camera, in which the light having a visible wavelength or an infrared wavelength is used, can be used as the optical imaging device 12. A user can arbitrarily use the obtained optical image. For example, the optical image is used as an extensive image to search a visual field during observation of an electron microscope image such as a SEM image, or the optical image can be used for the auxiliary purpose of electron beam observation such as a confirmation of an observation target specimen. The plurality of imaging systems, i.e., the observation device 10 including the electron beam imaging device 11 that obtains the image with a charged particle such as an electron beam and the optical imaging device 12 that obtains the image with the visible light, is configured to switch between the electron beam imaging device 11 and the optical imaging device 12.

Figure 9:
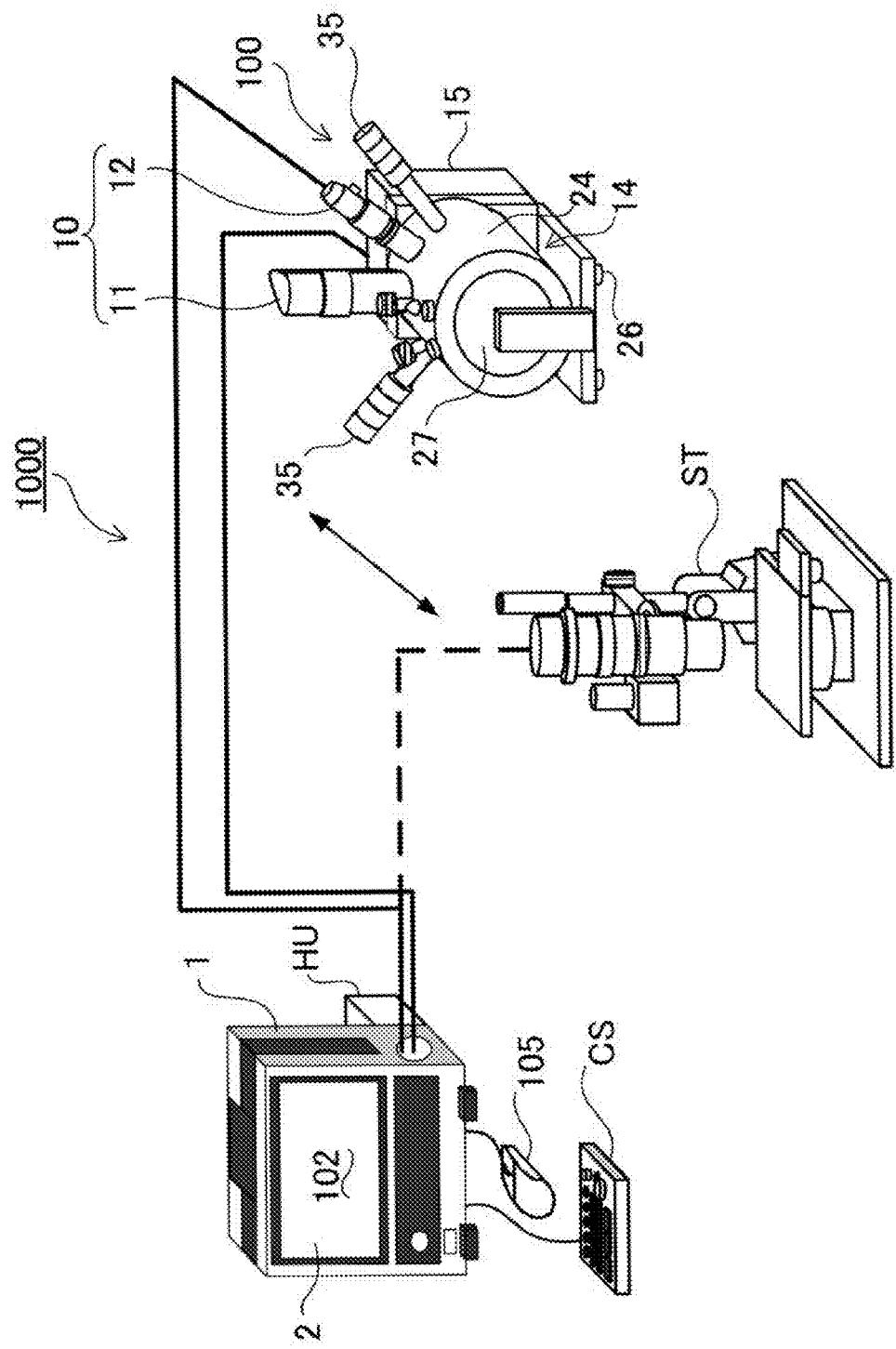
FIG. 9 is a schematic view illustrating a state in which an optical imaging device is connected while switched to a SEM or a stand.

In the observation device 10, as illustrated in FIG. 9, the optical imaging device 12 is demounted from the magnifying observation apparatus 100 constituting the SEM and connected to a digital microscope stand ST, which allows the observation of the specimen placed on a stage of the stand ST. From the standpoint of the magnifying observation system such as the digital microscope in which the optical lens is used, it is seen that the configuration of FIG. 9 allows the electron beam imaging device 11 such as the SEM to be connected as one of exchangeable head portions. That is, in the conventional digital microscope, only the optical observation device can be mainly connected as a camera unit or a lens unit like the stand type camera unit illustrated in FIG. 9. On the other hand, in this embodiment, the electron beam imaging device 11 such as the SEM can be connected, and the optical imaging device 12 can also be used as the camera unit that obtains the optical image in the specimen chamber 21 in which the electron beam imaging device 11 is provided. In such cases, the magnifying observation apparatus 100 including the electron beam imaging device 11 of FIG. 9 constitutes one of the exchangeable head portions of the magnifying observation system. Therefore, the head portion such as the SEM and the optical lens is selectively mounted as one of the exchangeable camera or lens that are used in the magnifying observation system, the observation can be performed while the proper observation device is connected according to the desired application, a magnifying observation available range can be expanded not only to the optical system but also to the electron microscope system, and various magnification observations can be implemented.

On the other hand, from the standpoint of the magnifying observation apparatus including the electron beam imaging device 11, it can be seen that the digital microscope is added to the magnifying observation apparatus. In either case, advantageously the optical image and the electron microscope image can be obtained for the same specimen. Particularly, the optical image and the electron microscope image, which are obtained by the different observation devices, can be compared in the same visual field at the same magnifying power. Therefore, the observation can be performed from various viewpoints by taking advantage of each observation image, and information amount obtained by the magnification observation can dramatically be increased.

(Observation Device 10)

The magnifying observation apparatus includes a plurality of observation devices 10 that observe the specimen in the specimen chamber 21. In the magnifying observation apparatus 100 illustrated in FIG. 2A, the electron beam imaging device 11 as the first observation device that can obtain the electron microscope image and the optical imaging device 12 as the second observation device that can obtain the optical image are fixed while projected from a body portion 24. Each imaging device is configured such that a display switching section 36 can switch between use and non-use. In the example of FIG. 2A, a push button is provided as the display switching section 36 in a cylindrical shaped outer surface of the body portion 24. In addition to the alternation of the use of the first and second imaging sections, the first and second imaging sections may be configured to be simultaneously used. In the example of FIG. 2A, although the optical imaging device 12 is disposed on the right side of the electron beam imaging device 11, the similar effect is also obtained even if the electron beam imaging device 11 and the optical imaging device 12 are switched around.

(Magnifying Power Adjusting Section)

Each observation device 10 includes a magnifying power adjusting section that adjusts the magnifying power. Specifically, the electron beam imaging device 11 includes an electron microscope magnifying power adjusting section 68 that adjusts an electron microscope magnifying power. On the other hand, the optical imaging device 12 includes an optical magnifying power adjusting section 95 that adjusts an optical magnifying power. For example, each magnifying power adjusting section adjusts the magnifying power by rotating a ring rotatably provided in an outer circumference of each barrel as illustrated in FIG. 2A. Particularly, similarly to the optical magnifying power adjusting section 95, the electron microscope magnifying power adjusting section 68 is formed into a ring shape in which the electron microscope magnifying power adjusting section 68 is rotated around the barrel, an operation feeling of magnifying power adjustment on each observation device is unified to provide an excellent user interface. Preferably, antislip finishing is provided in a surface of each ring. For example, the electron microscope magnifying power adjusting section 68 has an adjustable magnifying power range of 20 times to 10000 times. For example, the optical magnifying power adjusting section 95 has the adjustable magnifying power range of 50 times to 500 times.

A higher-magnifying-power image can also be obtained when a digital zoom is used in combination with an optical zoom.

(Focus Adjusting Section)

Each observation device 10 may include a focus adjusting section that adjusts a focal distance along each optical axis. For example, the electron beam imaging device 11 includes a microscopic focus adjusting section 37 that adjusts the focal distance along the optical axis thereof, and the optical imaging device 12 includes an optical focus adjusting section 38 that adjusts the focal distance along the optical axis thereof. The optical focus adjusting section 38 mechanically moves up and down the optical lens in an optical axis direction to adjust the focal position. In the example of FIG. 2A, a dial knob is provided as the focus adjusting section near each observation device, and the focal position can be adjusted by a rotation amount of the knob. Herein, an axis on which electron gun irradiates the specimen with the electron beam when the electron beam imaging device 11 obtains the electron microscope image is referred to as an "optical axis". In more detail, the "optical axis" is that an optical path of the electron beam irradiated from the electron gun has the smallest of an aberration of lens formed by a magnetic field or an electrical field or is a path to be provided the most efficient electron beam.

The color optical image including color information can be obtained by using the optical imaging device 12 in combination with the electron beam imaging device 11 in addition to the mainly-monochrome electron microscope image without color information. In addition to the visible light observation image in which the visible light or ultraviolet light is used, an infrared observation image obtained with an infrared camera can also be used in the optical imaging device 12. The electron microscope image can be colored based on the color information of the optical image. For example, a high-magnifying-power, high-accuracy color image can be obtained by combining the optical image with the electron microscope image.

(Magnifying Observation Apparatus 100)

Next, the outline of the magnifying observation apparatus 100 will be described. As illustrated in FIG. 2A to FIG. 4, an appearance of the magnifying observation apparatus 100 has a shape in which the box-shaped decompression unit 15 is coupled to the cylindrical chamber unit 14. As illustrated in FIG. 4, the chamber unit 14 is placed on the flat-plate base portion 22. A fixing plate 23 is mounted on an upper surface of the base portion 22 so as to be projected in a vertical posture. The fixing plate 23 acts as an end-face plate that closes one of opening ends of the body portion 24. The decompression unit 15 is mounted on a back surface of the fixing plate 23. A rotating device 30 that rotates the body portion 24 is provided in a front surface of the fixing plate 23. In the configuration of FIG. 4, the fixing plate 23 closes one-side end face of the body portion 24 in an airtight manner while the rotating device 30 is interposed therebetween, and the body portion 24 is rotatable while the specimen chamber 21 is maintained in the decompression state. In order to permit the rotation of the body portion 24, the fixing plate 23 is separated from the base portion 22 so as to float on the base portion 22 while retaining the body portion 24 on the base portion 22 in a cantilever manner, and a gap is provided between the base portion 22 and the body portion 24. An opening edge of the body portion 24 is not in contact with the fixing plate 23, and a gap is provided such that the rotation of the body portion 24 is not obstructed.

The chamber unit 14 includes the body portion 24 and a pair of end-face plates and constitutes a main body portion of the magnifying observation apparatus 100. An outer shape of the body portion 24 is formed into a substantially cylindrical shape. An internal space of the body portion 24 is closed in the airtight manner by the two end-face plates to constitute the specimen chamber 21 that can be decompressed. One of the end-face plates constitutes an opening and closing cover portion 27 while the other end-face plate constitutes the fixing plate 23 mounted on the body portion 24, thereby closing the specimen chamber 21 in the airtight manner. As illustrated in a sectional view in FIG. 5, a suction port 25 is opened in the fixing plate 23 in order to suck air in the specimen chamber 21 to the decompression unit 15. A secondary electron detector 61 and an in-specimen-chamber observation device 13, to be described later, are provided in the fixing plate 23.

(Decompression Unit 15)

The specimen chamber 21 is connected to the decompression unit 15 through the suction port 25. The decompression unit 15 constitutes an evacuation system to implement a decompression environment such that the electron beam of the accelerated electron reaches the specimen without losing energy in passing through a gas component as much as possible. A rotary pump, an oil diffusion pump, a Turbo-Molecular Pump (TPM), and the like can be used as the decompression unit 15 to adjust the specimen chamber 21 to the desired vacuum from the high vacuum to the low vacuum. For example, the vacuum can be adjusted in a range of $10^{-6}$ Torr to $10^{-10}$ Torr. The decompression unit 15 is coupled to the back surface of the chamber unit 14 in the airtight manner. Preferably, the suction port 25 is provided in the fixing plate 23 that is the fixed part. However, obviously the suction port 25 may be provided on a rotation part side.

(Decompression Unit Operation Panel 16)

A decompression unit operation panel 16 is provided in the decompression unit 15 in order to operate the action of the decompression unit. In the example of FIG. 2A, the decompression unit operation panel 16 is provided beside the body portion 24, and evacuation or venting is started by button operation. An indicator is provided in the decompression unit operation panel 16 to indicate an underway evacuation operation or completion of the operation. In this example, two LEDs are provided as the indicator, the state of the specimen chamber 21 is displayed by a combination of lighting patterns while divided into four states, i.e., an atmospheric state, underway evacuation, the vacuum state, and underway venting.

(Leg Portion 26)

In the magnifying observation apparatus 100, leg portions 26 are projected from four corners of a bottom surface of the base portion 22. The magnifying observation apparatus 100 is horizontally installed on a ground surface with the leg portions 26 interposed therebetween. Preferably, an adjusting section that can adjust a level of each leg portion 26 is provided in the leg portion 26. Therefore, advantageously a specimen stage 33 is maintained in a horizontal posture to stably perform the magnification observation irrespective of a tilt of the ground surface. For example, a well-known configuration such as a mechanism that can adjust a projection amount of the adjusting section by progression of a screw can appropriately be used as the adjusting section. As illustrated in a side view in FIG. 4, the leg portion 26 is provided in the base portion 22 on the side of the chamber unit 14. Alternatively, the leg portions may be provided in the decompression unit 15.

(Body Portion 24)

The body portion 24 has a hollow cylindrical shape, and both end faces of the body portion 24 is sealed by the end-face plates to form the airtight specimen chamber 21. At least one of the end-face plates constitutes the opening and closing cover portion 27. The optical imaging device 12 and the electron beam imaging device 11 are mounted onto the cylindrical shaped outer surface of the body portion 24. Specifically, the electron beam imaging device 11 is mounted in a first position 41, and the optical imaging device 12 is mounted in a second position 42 separated from the first position 41.

The optical imaging device 12 and the electron beam imaging device 11 are configured to be formed into the cylindrical shape in which the lens is incorporated. In the optical imaging device 12, a plurality of optical lenses are incorporated in the cylindrical optical lens barrel. Similarly, in the electron beam imaging device 11, the electron lens is incorporated in the electron lens barrel. As illustrated in a sectional view in FIG. 3, the optical imaging device 12 and the electron beam imaging device 11 are mounted on the outer surface of the body portion 24 while radially projected from the center axis of the specimen chamber 21 whose inside is formed into the cylindrical shape. In other words, the electron lens barrel and the optical lens barrel of the observation devices 10 are fixed while oriented toward the rotation centers, respectively, and the optical axis of the electron gun 47 of the electron beam imaging device 11 and the optical axis of the optical imaging device 12 are radially extended about the rotation axis of the rotating device 30.

(Cover Portion 27)

One of the end-face plates constitutes the opening and closing cover portion 27. As illustrated in the side view in FIG. 4, the cover portion 27 includes a disc part 28 that closes the end face of the body portion 24 and an arm 29 that journals the disc part 28 for the rotation of the disc part 28. In FIG. 4, the left side is the front surface side. As illustrated in FIG. 4, a lower end of the arm 29 is pivoted at a leading end of the base portion 22 by a hinge, the disc part 28 is opened downward by pulling down the arm 29, and the disc part 28 is located in the end face of the body portion 24 to close the body portion 24 by making the arm 29 upright. The user can place the specimen on the specimen stage 33 provided in the specimen chamber 21 while the cover portion 27 is opened. In the example illustrated in FIG. 6, the arm 29 that journals the center of the cover portion 27 is mounted on the leading end of the base portion 22 in a bendable manner. Therefore, the arm 29 is pulled down frontward, and the cover portion 27 can be located in an opened position. According to such a structure, irrespective of the rotation position of the body portion 24, the opening and closing direction of the cover portion 27 can be constantly kept downward while the cover portion 27 is rotated while being in close contact with the body portion 24.

The end face of the body portion 24 is opened and closed by the cover portion 27, so that advantageously the inside of the specimen chamber 21 can largely be opened to easily set a large-size specimen. Particularly, in combination with the configuration in which the specimen stage 33 is not tilted, it is only necessary to simply place the specimen on the specimen stage 33, and it is not necessary to fix the specimen on the specimen stage 33 so as not to slip. Therefore, advantageously the work to take in and out the specimen and the work to place the specimen can simply be performed.

Figure 13A:
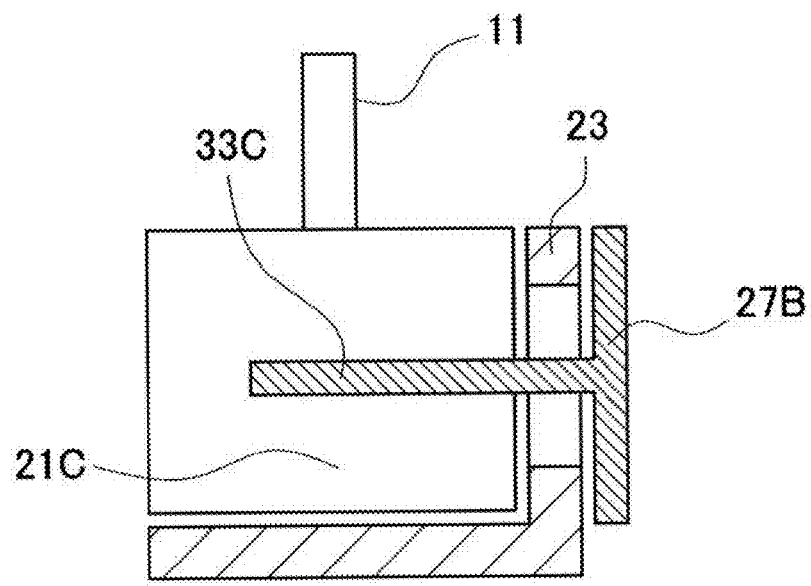
FIG. 13A is a sectional side view schematically illustrating a state in which the specimen chamber is closed by the cover portion integrated with the specimen stage.
Figure 13B:
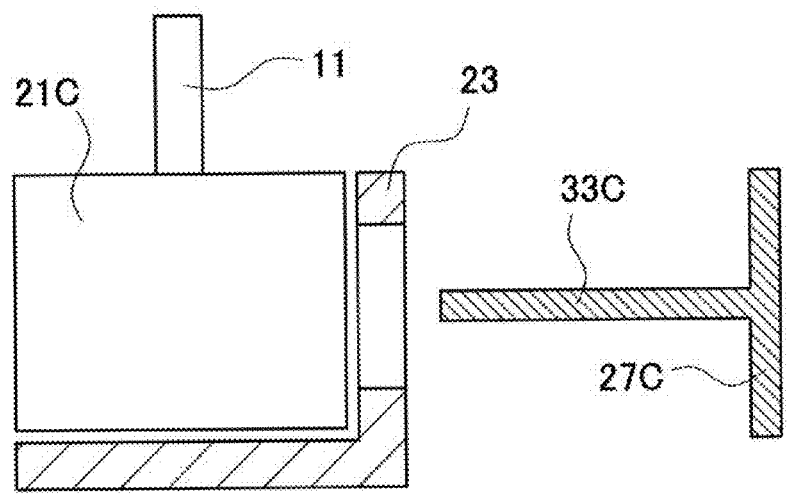
FIG. 13B is a sectional side view schematically illustrating a state in which the cover portion of the specimen chamber of FIG. 13A is opened.

In order to easily place the specimen on the specimen stage 33, a slide type in which the specimen stage 33 is pulled out frontward while the cover portion 27 is opened can also be adopted (for example, see FIGS. 13A and 13B, to be described later). Therefore, the user can easily access the specimen stage 33. In addition to the cover portion 27, the end-face plate and the body portion 24 are made of a sufficiently-durable member that can maintain the high vacuum.

(Fixed Part)

In the body portion 24, at least part of the cylindrical shaped outer surface can be rotated by the rotating device 30. Therefore, the body portion 24 and the end-face plate are divided into a rotation part that is rotated in association with rotation motion of the body portion 24 and a fixed part that remains still without the rotation. In other words, the body portion 24 and the end-face plate are divided into the fixed part and the rotation part by the rotating device 30. For example, a horizontal surface moving mechanism 74 and a height adjusting mechanism 80, which are a specimen stage driving section 34 that drives the specimen stage 33, the cover portion 27, the in-specimen-chamber observation device 13, the base portion 22, and the fixing plate 23 constitute the fixed part. On the other hand, each observation device 10 and a light source port 97 of an illumination portion that is associated with or cooperates with the observation device 10 are provided on the rotation part side.

(Rotating Device 30)

The body portion 24 includes the rotating device 30 as a moving device that can move each observation device such that the optical axis direction of one of the observation devices is aligned with the optical axis direction of the other observation device. The rotating device 30 rotates the side surface, to which the observation devices 10 are fixed, along the circumference about the center axis of the cylindrical body portion 24. For example, a mechanism in which a bearing or a gear provided in the rotation axis direction of the body portion 24 is rotated by engagement with a gear provided on the side of the base portion 22 or decompression unit 15 that is the fixed side can be used as the rotating device 30. An external force necessary to rotate the rotating device 30, namely, a resistance force against the rotation is set to a degree to which the user can manually rotate the rotating device 30 and a degree to which the resistance force can maintain the posture when the user releases the user's hand from the rotating device 30 while the body portion 24 is rotated such that the observation device 10 becomes the desired position. An oil amount of the bearing and a weight of the gear are adjusted such that the resistance force and frictional force of the rotation can be maintained. With such a configuration, the plurality of observation devices 10 can easily be switched to the same position without generating the change of the visual field. Because the observation device 10 can be tilted by the rotating, advantageously tilt observation can simply be performed at the high magnifying power by a multi-angle mechanism.

As described above, the rotating plane in which the electron beam imaging device 11 rotates is substantially aligned with the rotating plane in which the optical imaging device 12 rotates. Because the optical axes of the imaging devices intersect each other, the observation image of the same visual field can be obtained only by rotating one of the imaging devices to the position of the other imaging device. Therefore, advantageously the user operations, such as visual field matching by the position switching and adjustment of the focal point, which switch to the different imaging device in order to perform the imaging in the same visual field can be performed extremely easily.

The specimen stage 33 is fixed onto the fixed part side, because the specimen is in a fixed posture while the observation device 10 is rotated by the rotating device 30. In the example of FIG. 4, the horizontal surface moving mechanism 74 and the height adjusting mechanism 80, which are the specimen stage driving section 34 that drives the specimen stage 33, are mounted on the back surface of the body portion 24 with the end-face plate interposed therebetween.

Conventionally, because the side of the specimen stage 33 is rotated or tilted, it is not easy for the user to recognize a positional relationship between the camera and the specimen when a viewpoint is changed, and confusion is frequently generated in the moving direction or the like. On the other hand, in the present embodiment, because of the natural observation method in which the observation target is fixed while the viewpoint of the viewer is changed, advantageously the positional relationship is physically easily recognized, misunderstanding or confusion is hardly generated in the adjustment work in moving or changing the viewpoint, and it is easy to understand even for a beginner.

Figure 10:
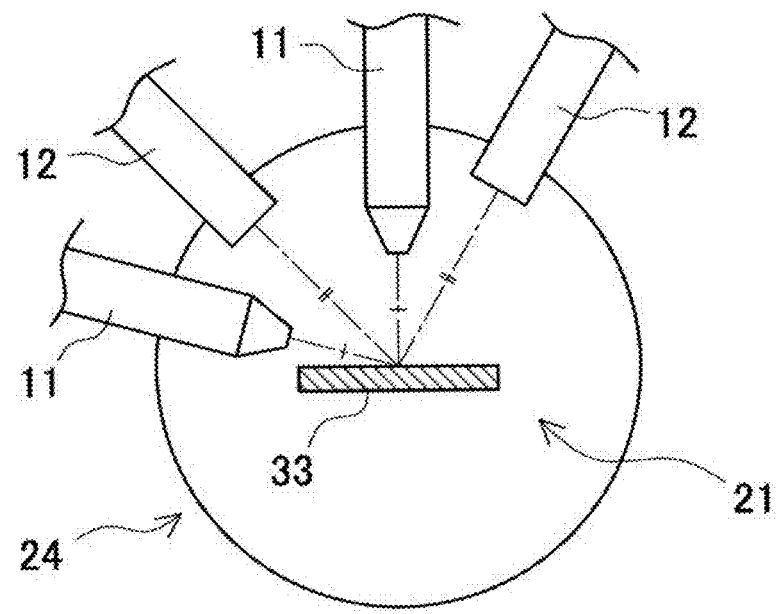
FIG. 10 is a schematic front view illustrating a distance between each observation device and the specimen stage.

The optical imaging device 12 and the electron beam imaging device 11, which are the observation devices 10, can simultaneously be moved by rotating the side surface of the body portion 24. Advantageously, the mechanisms that move the two observation devices 10 can be simplified as one rotating device 30 that functions as the moving mechanisms for the optical imaging device 12 and the electron beam imaging device 11. The observation devices 10 can easily be switched to the same position by the rotation, and the specimen is immobilized in the position of the rotation axis, whereby the change of the visual field is not generated. FIG. 10 is a schematic front view illustrating a distance between each observation device 10 and the specimen stage 33. As illustrated in FIG. 10, in the observation devices 10 of the optical imaging device 12 and the electron beam imaging device 11, because the distance to the specimen located on the rotation axis can substantially be kept constant by a rotational transfer, once the focal distance is adjusted, the focused state is always obtained even if the position is changed. Therefore, there is realized an environment suitable for in-focus tilt observation in which only a rotation angle, namely, the viewpoint can be changed.

Preferably, the cover portion 27 is fixed onto the fixed part side in the opening and closing manner. For example, as illustrated in the side view in FIG. 4, the rotation axis of the disc part 28 is journaled on the arm 29 while the disc part 28 of the cover portion 27 is detachably mounted on the opened end of the body portion 24, and the lower end of the arm 29 is mounted on the leading end of the base portion 22 in the bendable manner. Therefore, as described above, the direction in which the cover portion 27 is opened and closed can be kept constant irrespective of the rotation position of the body portion 24. In this case, the cover portion 27 closes the front surface side of the end face of the body portion 24, the end-face plate of the back surface is fixed while integrated with the body portion 24, and the specimen stage driving section 34 that drives the specimen stage 33 is mounted on the decompression unit 15 that is the fixed part so as to penetrate part of the body portion 24. That is, in this example, the disc part 28 of the cover portion 27 is integrated with the rotation part while the body portion 24 is closed, and the arm 29 is mounted on the fixed part. A tension spring 135 is provided near a hinge portion 138 that is a folded portion of the arm 29 and the base portion 22. The tension spring 135 biases the hinge portion 138 in the direction in which the hinge portion 138 is easy to fold. That is, the tension spring 135 enables the arm 29 to be easily made upright from a horizontal posture in the opened state to a vertical posture in the closed state. The tension spring 135, which is an unlock mechanism that unlocks a lock state of a retaining mechanism 140 even after the vertical posture, also biases the arm 29 onto the side of the body portion 24.

When the cover portion 27 is fixed onto the rotation part side, the opening and closing direction of the cover portion 27 varies according to the rotation position of the body portion 24, and unfortunately the user is required to confirm the opening and closing direction in each case. When the cover portion 27 is made of heavy metal having high rigidity, it may be difficult for the user to manually open and close the cover portion 27 depending on the direction of the cover portion 27, or a load on the hinge portion that supports the opening and closing of the cover portion 27 may be increased depending on the direction of the cover portion 27. Therefore, in order to avoid the change of the opening and closing posture, the fixed position of the cover portion 27 is effectively provided on the fixed part side. Additionally, the opening and closing of the cover portion 27 are always oriented toward a constant direction, which allows the opening and closing structure of the cover portion 27 to be advantageously simplified.

However, in the present embodiment, there is no limitation to the opening and closing direction of the cover portion 27, and a system in which the cover portion 27 is opened and closed upward may be adopted when the cover portion 27 is laterally opened and closed, or when sufficient strength is maintained. Alternatively, a slide system in which the cover portion 27 is moved outward in the rotation axis direction may also be adopted. In this case, the cover portion 27 is pulled out frontward while maintained in parallel with the bottom surface of the body portion 24. With this configuration, advantageously the cover portion 27 and the specimen stage 33 can simultaneously be pulled out to facilitate the access to the specimen stage 33 as described above. Irrespective of the opening and closing system of the cover portion 27, the specimen stage 33 alone may be configured to be pulled out to the outside of the specimen chamber 21. For example, the specimen stage 33 and the arm of the specimen stage driving section 34 that drives the specimen stage 33 are freely projected onto the front side, which allows the implementation of the configuration in which the specimen stage 33 is pulled out.

As described later, the specimen stage 33 can be moved and rotated in a plane while the horizontal posture is maintained such that the specimen stage 33 is not tilted or oscillated. As used herein, "fixing" the specimen stage 33 in the horizontal posture means that the specimen stage 33 is not tilted or oscillated about the rotation axis with respect to the body portion 24. That is, sliding the specimen stage 33 in the rotation axis direction is included in the concept of "fixing".
(Modification of Rotating Device)

Figure 11:
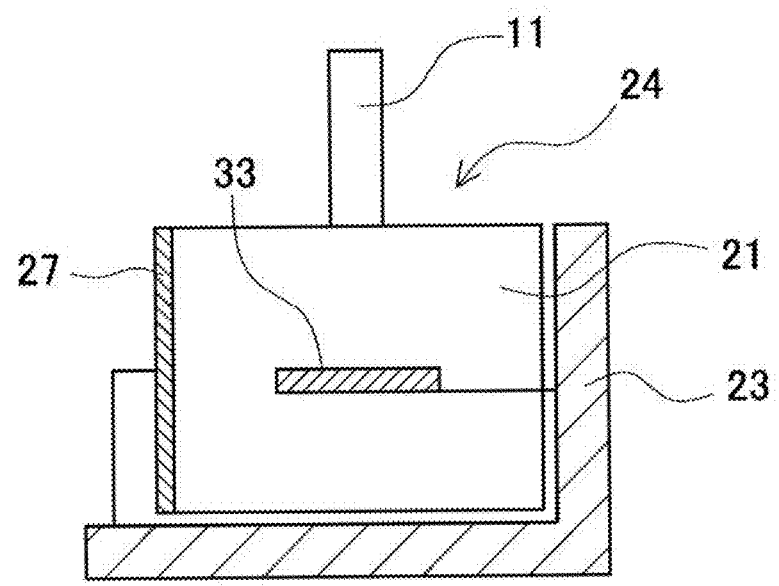
FIG. 11 is a schematic side view illustrating divisions of a rotation part and a fixed part.
Figure 12:
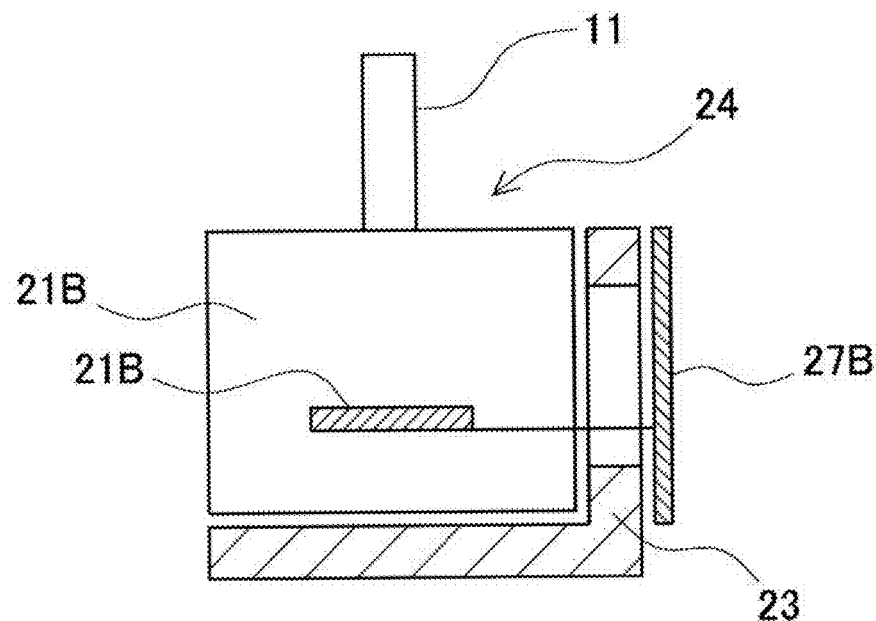
FIG. 12 is a sectional side view schematically illustrating a specimen chamber in which a cover portion is provided in the fixed part.

FIG. 11 is a schematic side view mainly illustrating the division of the configuration of FIG. 4 into the rotation part and the fixed part. In this configuration, the whole of the body portion 24 rotates with respect to one of the end-face plates (back surface side located on the right side in FIG. 11), and the rotating device 30 is provided between the end-face plate and the body portion 24 to perform the rotating of the body portion 24. The rotation part such as the cover portion and the body portion and the fixed part are not limited to such a configuration, but various modes can be utilized. FIGS. 12, 13A and 13B illustrate rotating devices according to modifications. In FIGS. 12, 13A and 13B, FIG. 12 is a sectional side view schematically illustrating a specimen chamber 21B in which a cover portion 27B is provided in the fixed part, FIG. 13A illustrates a state in which a specimen chamber 21C is closed by a cover portion 27C integrated with a specimen stage 33C, and FIG. 13B illustrates a state in which the cover portion 27C is opened. For the sake of convenience, the decompression unit and the like are omitted in FIGS. 12, 13A and 13B.

In the example of FIG. 12, the front surface side (left side in FIG. 12) of the body portion 24 is closed by the end-face plate, and the opening and closing cover portion 27B is provided on the back surface side (right side in FIG. 12). In this configuration, the cover portion 27B constitutes the fixed part that is not rotated by the rotation of the body portion 24. In the examples of FIGS. 13A and 13B, the specimen stage 33C is integrally mounted on the cover portion 27C provided in the fixed part. In this configuration, as illustrated in FIGS. 13A and 13B, the specimen stage 33C is preferably mounted on the cover portion 27C and the cover portion 27C is pulled out from the back surface of the apparatus, whereby the specimen stage 33C mounted on the cover portion 27C is pulled out to the outside of the specimen chamber 21C while the cover portion 27C is opened. With this configuration, the access to the specimen stage 33C is facilitated, and the specimen is easily placed, taken out, and exchanged.

Figure 14:
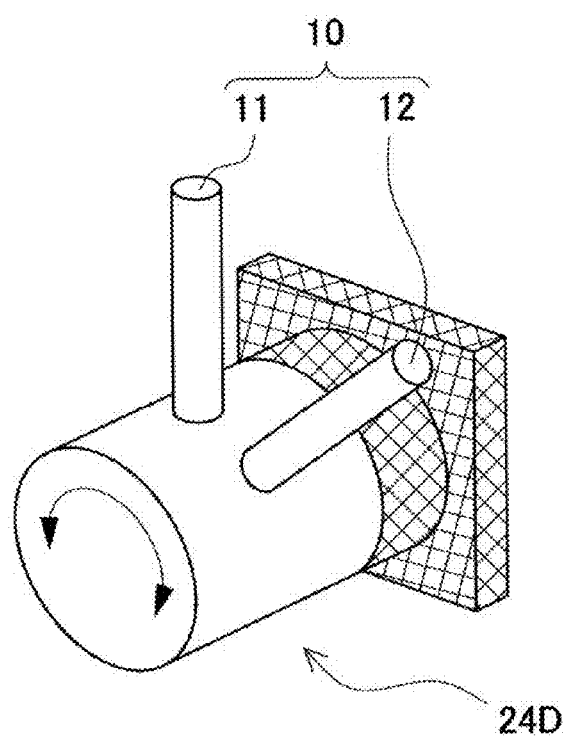
FIG. 14 is a schematic perspective view illustrating an example of the specimen chamber in which only one side of the body portion is rotated.

Although the whole of the body portion is rotated in the examples of FIGS. 11 and 12, only part of the body portion may be rotated. For example, as illustrated in the perspective view in FIG. 14, a body portion 24D is divided into two, one of the end-face plates (back surface side on the right side in FIG. 14) constitutes the fixed part (illustrated by oblique lines in FIG. 14), and the other end-face plate (front surface side) constitutes the rotation part, thereby rotating part of the cylindrical shaped outer surface (front surface side). In the example illustrated in a perspective view in FIG. 15, a body portion 24E is divided into three, both end faces constitute the fixed part (illustrated by oblique lines in FIG. 15), and only an intermediate part of the side surface, to which the observation device 10 is fixed, is slid. Therefore, advantageously the end-face plate and a cover portion 27E constitute the fixed part side, and particularly the opening and closing structure of the cover portion 27E can easily be formed.

Figure 15:
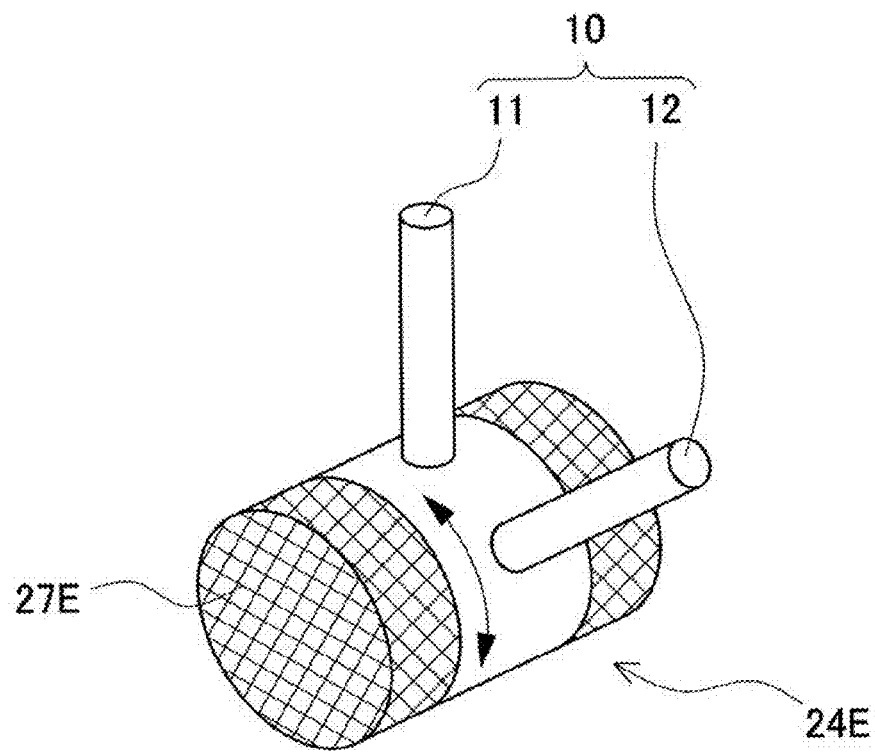
FIG. 15 is a schematic perspective view illustrating an example of the specimen chamber in which only an intermediate part of the body portion is rotated.

In such configurations, when the fixed part is provided in part of the end-face plate or body portion 24, the fixed part supports the specimen stage driving section 34 that drives the specimen stage 33. Specifically, as illustrated in FIG. 4 and the like, the opening is provided in the end-face plate, and the specimen stage driving section 34 that drives the specimen stage 33 is provided inside the opening and on the fixing plate 23. That is, the arm of the specimen stage driving section 34 is inserted in the specimen chamber 21 from the opening that is the fixed part, and the specimen stage 33 is supported at the leading end of the arm while driven in X-, Y-, and Z-directions. In the example of FIG. 15, the specimen stage driving section 34 may be provided in the front-surface-side end-face plate that is another fixed part. Alternatively, the body portion 24 and both the end-face plates may be journaled about the rotation axis on the base portion 22. In this case, the specimen stage 33 can be supported only by part of the end-face plate.

In any of the configurations, there is a demand for the structure in which the body portion 24 can be rotated in the airtight manner such that the decompression state can be maintained in the specimen chamber 21 even if the rotating device is rotated. Particularly, the body portion 24 has a considerable weight because it includes the plurality of observation devices 10, and the body portion 24 is rotated in the cantilever posture by the fixing plate 23. Therefore, a sufficient mechanical strength is also required. Therefore, in the example illustrated in FIG. 4, a crossed-roller bearing 31 having high rotation accuracy and an excellent weight bearing resistance property is used as the bearing in a rotation plane between the fixing plate 23 and the body portion 24, which constitute the end-face plate. Additionally, an O-ring 32 is interposed in order to maintain the airtightness in the rotation plane. Therefore, the stable rotation mechanism can be implemented while the airtightness of the specimen chamber 21 is maintained in the body portion 24.

Figure 16:
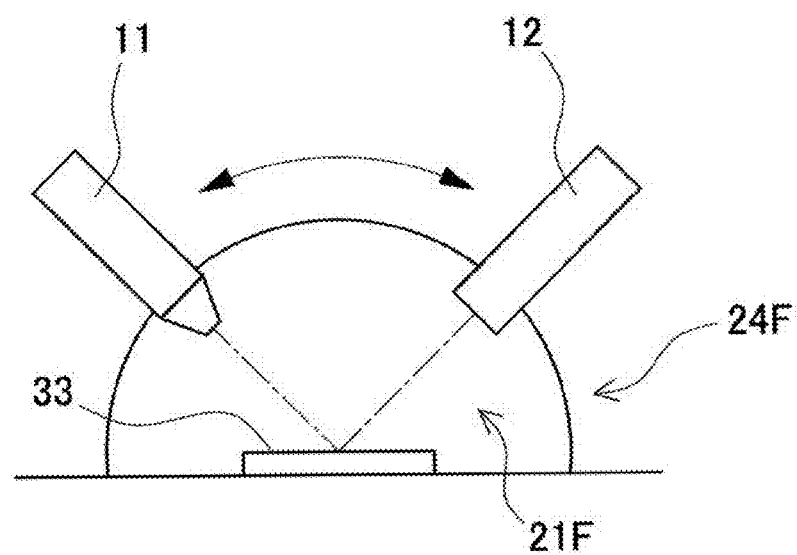
FIG. 16 is a sectional side view schematically illustrating the specimen chamber in which a body portion is formed into a semicircular shape.

As used herein, it is not always necessary that the rotation and the rotating mean the complete circular motion, but the rotation and the rotating include an arc movement locus. For example, as illustrated in a schematic sectional side view in FIG. 16, a body portion 24F is formed into a semicircular shape, and the electron beam imaging device 11 and the optical imaging device 12 are moved along the curved side surface to enable the tilt observation to be performed in a specimen chamber 21F. Similarly, not only a complete cylinder but also a partial cylinder such as a semicircular or an arc in section can be used as the cylindrical shaped outer surface of the body portion.

(Handgrip 35)

A handgrip 35 can also be provided in the body portion 24 so as to manually easily rotate the body portion 24. Similarly to the observation device 10, the handgrip 35 illustrated in FIG. 2A is a chamber tilt knob that is fixed while projected from the cylindrical shaped outer surface of the body portion 24. A grip part is provided at the leading end of the handgrip 35 such that the user can easily grasp the handgrip 35 by hand. The user can grasp the grip part of the handgrip 35 to rotate the body portion 24 in the desired direction. Two handgrips 35 are provided spaced apart such that the user can grasp the handgrips 35 with both hands. Preferably, the two handgrips 35 are provided on the outside of the positions, where the electron beam imaging device 11 and the optical imaging device 12 that are two observation devices projected from the side surface of the body portion 24, such that the two observation devices are sandwiched between the two handgrips 35. When the two observation devices are located between the handgrips 35, breakage caused by the end portion of the circumferentially-projected observation device coming into contact with an external member during the rotating is effectively prevented by the handgrips 35 disposed outside the observation device. The handgrips 35 are projected longer than the electron beam imaging device 11 and the optical imaging device 12, which allows the protection effect of the observation devices to be further enhanced. Additionally, in the modification illustrated in FIGS. 2B and 2C, the grip part provided at the leading end of a handgrip 35B is bent outward, which allows the user to more easily grasp the handgrip 35B. In addition to the rod shape, the handgrip 35 may be formed into an L-shape, a U-shape, and a semicircular shape. Alternatively, only one handgrip 35 may be provided. Alternatively, the observation device can also be used as the handgrip when the observation device is mounted on the body portion with the sufficient strength.

(Display Switching Section 36)

The magnifying observation apparatus includes the display switching section 36 that switches the imaging devices to be used. A hardware change-over switch can be cited as an example of the display switching section 36. In the example of FIG. 2A, push buttons are provided as the display switching section 36 in front of the electron beam imaging device 11 and the optical imaging device 12 in the cylindrical shaped outer surface of the body portion 24. An indicating lamp 17 such as an LED lamp is provided in front of each button. In the display switching section 36, when one of the push buttons is pressed, the observation device in the back surface of the push button is selected, a moving image displayed in real time on the display section is automatically switched to the image obtained by the observation device, and the corresponding indication lamp 17 is turned on to indicate that the observation device is currently selected. In this manner, the user can sensuously be aware of the switching operation by the mechanical switching operation that presses the push button, and the currently-selected state can visually be recognized by pressed position of the push button and the turning-on/turning-off of the indication lamp 17. In the example of FIG. 2A, one of the push buttons can alternatively be selected, and the non-selected push button is automatically turned off. In other words, one of the observation devices is selected by the display switching section 36, and only the selected observation device is operated. Therefore, the two observation devices cannot simultaneously be used. However, the two observation devices may be configured to be able to be simultaneously used in addition to the configuration in which the observation devices are alternately used.

In addition to the hardware operation that operates the change-over switch provided in each observation device, software switching may be adopted when the observation devices are switched by the display switching section 36. For example, the selection state of the observation device may automatically be switched when a window on which the observation image of the observation device to be selected is selected and activated on the screen of the display section.

In the display switching section 36, in addition to the hardware configuration, a configuration may be adopted in which a switching instruction is provided in an electronic or software manner such as a configuration in which an operation program of the magnifying observation apparatus 100 is operated. Alternatively, a hardware change-over switch and a software change-over switch such as the operation program may simultaneously be used. For example, when the rotating device 30 rotates the body portion 24, the observation devices 10 may automatically be switched. The change-over switch may be provided in the handgrip 35 for the rotating operation. Particularly, the operation to switch the observation device 10 is frequently performed in the timing the observation device 10 is physically moved, namely, the rotating device 30 is operated. Therefore, the display switching section 36 of the observation device 10 may be provided in the handgrip 35 grasped by the user during the rotating, which allows the switching operation and the rotating operation to be substantially simultaneously performed to improve the operability. For example, in the end face or side surface of a handle portion 35b of the handgrip 35, a push button switch is provided as the display switching section 36 in a position where the user can easily press the push button switch by a thumb or an index finger while grasping the handle portion 35b. The push button switch switches between the electron beam imaging device and the optical imaging device in a toggle manner. Alternatively, a dedicated switching button may be provided to switch to each observation device. For example, the change-over switch that switches to the observation device disposed on the right side can be provided in the right handgrip 35, that is, the change-over switch that switches to the optical imaging device can be provided in the optical imaging device. For example, the change-over switch that switches to the observation device disposed on the left side can be provided in the left handgrip 35, that is, the change-over switch that switches to the electron beam imaging device can be provided in the electron beam imaging device.

(Specimen Chamber 21)

A sealing structure is provided in the specimen chamber 21 so as to be able to maintain the decompression state. A port is opened in an inner wall of the specimen chamber 21 in order to dispose or connect various members. Each port is sealed in an airtight manner such that the inside of the specimen chamber 21 can be maintained in the decompression state. For example, a gasket such as the O-ring is used at the coupling point in order to implement the sealing structure.

(First Position 41 and Second Position 42)

In the observation device 10, the electron beam imaging device 11 constituting the first observation device is mounted on the first position 41 in the cylindrical shaped outer surface of the body portion 24, and the optical imaging device 12 constituting the second observation device is similarly mounted on the second position 42 near the first position 41 in the cylindrical shaped outer surface of the body portion 24. In the example of FIG. 3, a distance between the first position 41 to which the electron beam imaging device 11 is fixed and the second position 42 to which the optical imaging device 12 is fixed is a fixed value. That is, when the cylindrical body portion 24 is rotated, the optical imaging device 12 and the electron beam imaging device 11 rotate together. Therefore, the moving mechanisms of the observation devices 10 can be simplified into one mechanism.

Figure 17:
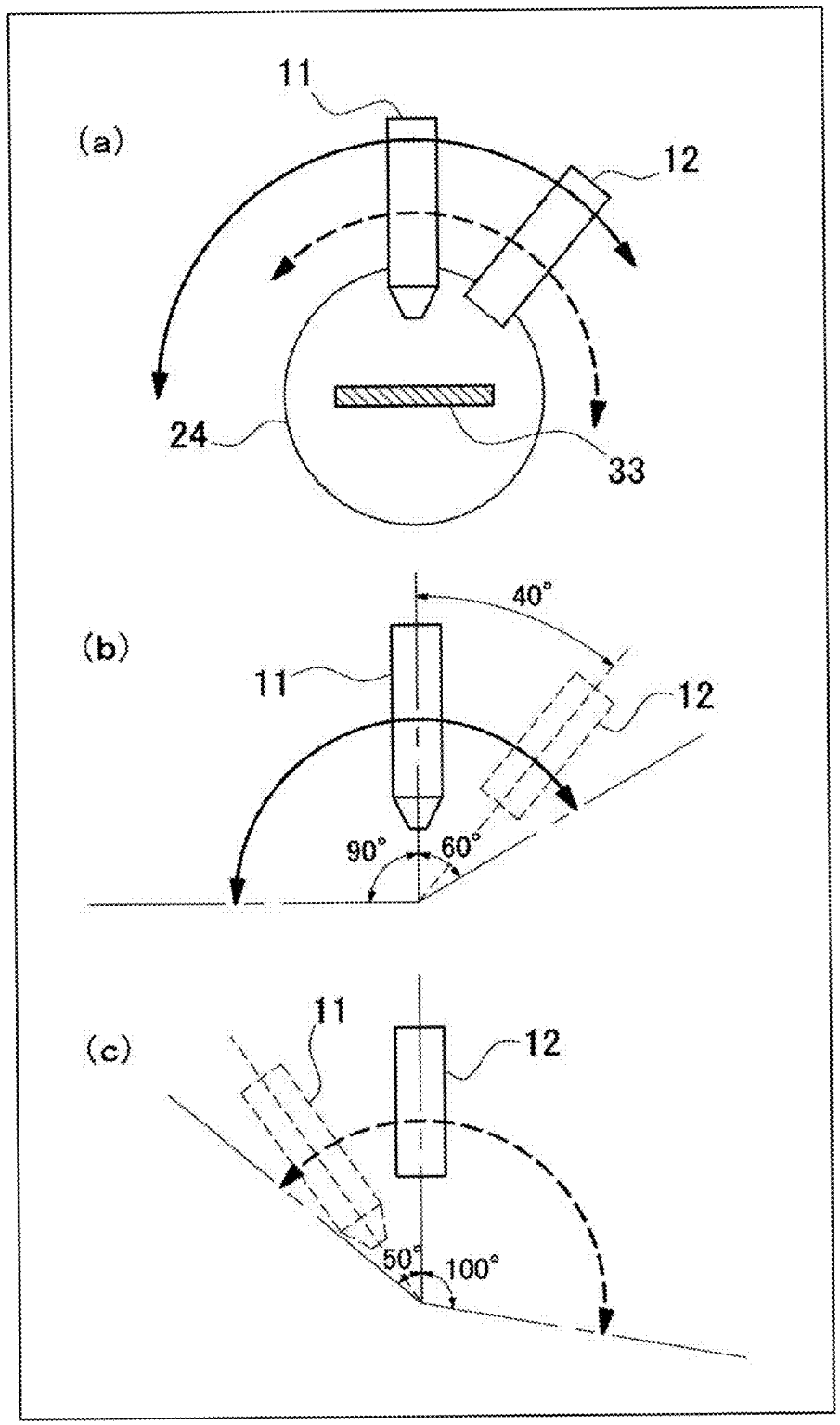
FIGS. 17A to 17C are schematic diagrams conceptually illustrating rotatable ranges of the optical imaging device and an electron beam imaging device, where

The second position 42 is a position in which the leading end of the optical imaging device 12 does not interfere with the optical axis of the electron gun 47 of the electron beam imaging device 11. Preferably, the second position 42 is the position in which the leading end of the optical imaging device 12 is brought close to the optical axis of the electron gun 47 as much as possible while not interfering with the optical axis of the electron gun 47. As illustrated in FIG. 3, the optical imaging device 12 can be brought close to the electron beam imaging device 11, and as a result, a rotation amount necessary to rotate to the positions of the observation devices 10 is suppressed to the minimum to smoothly and quickly perform the imaging position switching work. As illustrated in FIGS. 17A to 17C, by bringing the positions of the observation devices 10 close to each other, advantageously an overlapping range (overlapping rotating range to be described later) between rotatable ranges of the observation devices 10 can be widened.

Therefore, an offset angle between the rotating center and the first position 41 or second position 42 is preferably made as small as possible. Specifically, the offset angle ranges from 30° to 50°. In the example of FIG. 3, the optical imaging device 12 and the electron beam imaging device 11 are mounted on the body portion 24 such that an angle difference of 40° is generated between the optical axis of the optical imaging device 12 and the optical axis of the electron beam imaging device 11. The rotating device 30 can be rotated at the offset angle or more, and therefore one of the observation devices can be rotated to the position of the other observation device. The rotatable range in the rotating device 30 is the maximum rotating range controlled by a rotating control section. The rotating device 30 can be rotated to a wider rotating range control value by releasing the rotating control section.

In this example, the electron beam imaging device 11 is mounted on the body portion 24 in a non-exchangeable manner, and the optical imaging device 12 is detachably mounted on the body portion 24. Therefore, as illustrated in FIG. 9, the optical imaging device 12 can be detached from the magnifying observation apparatus 100 to replace the optical imaging device 12 with the digital microscope stand ST. An optical imaging device mounting portion is provided in the second position 42 in order to implement this detachably mounting structure.

(Optical Imaging Device Mounting Portion)

The optical imaging device mounting portion is provided in the cylindrical shaped outer surface of the body portion 24 in order to detachably mount the optical imaging device 12 at the second position 42. The optical imaging device mounting portion includes a port that is opened so as to insert the optical lens barrel of the optical imaging device 12 therein, and a mount 39 is provided in the port in order to mount the optical imaging device 12. As illustrated in FIG. 3, the mount 39 is formed into a cylindrical shape with a bottom, and an inner diameter of the mount 39 is designed slightly larger than the outer shape of the optical imaging device 12 such that the optical imaging device 12 can be mounted. A structure, such as a screw groove, to which the optical imaging device 12 is inserted and fixed, is provided in the cylindrical inner surface of the mount 39.

An opening window is provided in the bottom surface of the mount 39, and a translucent window is fitted in the opening window such that the optical lens of the mounted optical imaging device 12 is not obstructed. The mount 39 is sealed by the O-ring such that the optical imaging device 12 can be mounted while the airtightness of the specimen chamber 21 is maintained. The O-rings are provided in the coupling plane between the mount 39 and the body portion 24 and the coupling plane between the mount 39 and the translucent window, respectively. In the example of FIG. 3, the optical imaging device mounting portion is vacuum-sealed by four members, i.e., a first O-ring, the port, a second O-ring, and the translucent window.

The optical imaging device 12 is detachably mounted on the mount 39 provided in the airtight manner in the cylindrical shaped outer surface of the body portion 24, which allows the optical observation to be performed while the airtightness is maintained. A degree of freedom of the optical observation is dramatically increased since the optical imaging device 12 mounted on the mount 39 can easily be exchanged. Particularly, in electron microscopes such as the conventional SEM, although there is an electron microscope including an optical lens that can perform the optical observation, in principle the optical lens is subsidiary used to search the visual field of the electron microscope, and there are few electron microscopes including full-fledged optical lens. On the other hand, in the present embodiment, because the optical lens can be exchanged, advantageously, options of the optical lenses are widened in the optical observation combined with the electron microscope, and the degree of freedom of the observation is largely increased.

Conventionally, after the visual field is searched by the optical imaging device 12, the fine observation is performed by the electron beam imaging device 11. When the optical image and electron microscope image of the same visual field are displayed at the same magnifying power to perform contrast and switching by the combination of the optical image and the electron microscope image, the work to align the optical image and the electron microscope image to obtain the same visual field becomes troublesome. On the other hand, in the present embodiment, the magnifying powers of the optical imaging device 12 and the electron microscope are overlapped, and the specimen is placed on the rotation axis while the optical imaging device 12 and the electron microscope are rotated, so that the optical image and the electron microscope image can dramatically easily be obtained in the same visual field range.

As illustrated in FIG. 3, the optical imaging device 12 and the electron beam imaging device 11 are mounted on the first position 41 and the second position 42 while brought close to each other to a degree in which the optical imaging device 12 and the electron beam imaging device 11 do not interfere with each other. Specifically, the leading end part of the observation device 10 may physically interfere in the specimen chamber 21, and one of the optical axes may be interrupted by the other barrel. Particularly, as illustrated in FIG. 3, because the electron beam imaging device 11 is projected into the specimen chamber 21 while the optical imaging device 12 is mounted on the mount 39, an amount of invasion in the specimen chamber 21 is relatively small, and the optical axis may be obstructed by the leading end of the electron beam imaging device 11. Therefore, it is necessary that the optical imaging device 12 and the electron beam imaging device 11 be spaced apart from each other such that the physical or optical interference is not generated.

On the other hand, when the optical imaging device 12 and the electron beam imaging device 11 are excessively spaced apart, the moving distance is lengthened when the body portion 24 is rotated and moved to the positions of the optical imaging device 12 and the electron beam imaging device 11, and disadvantageously the overlapping of the loci in which both the observation devices 10 can be located, namely, the overlapping rotating range is narrowed. Therefore, the optical imaging device 12 and the electron beam imaging device 11 are disposed close to each other to a degree in which the optical imaging device 12 and the electron beam imaging device 11 do not interfere with each other, the moving amount is suppressed to the minimum to eliminate the unnecessary moving amount when one of the observation devices 10 is moved to the observation position of the other observation device 10, and advantageously the switching can quickly be performed.

The positions to which the optical imaging device 12 and the electron beam imaging device 11 are fixed are located substantially on the same plane that is substantially orthogonal to the rotation axis of the cylindrical body portion 24. Therefore, because the optical imaging device 12 and the electron beam imaging device 11 are always moved in the same circumference, the loci of the optical imaging device 12 and the electron beam imaging device 11 are matched with each other, and the observation images of the same visual field can be obtained. Particularly, because the moving ranges of the optical axes of the observation devices 10 are matched with each other by substantially matching the rotating plane in which the electron beam imaging device 11 rotates and the rotating plane in which the optical imaging device 12 rotates, advantageously the observation images of the same visual field can be obtained only by rotating one of the observation devices 10 to the position of the other observation device 10, and user operations, such as the visual field matching and the focal point adjustment due to the position switching, which switch to the different observation device 10 in order to perform the imaging in the same visual field can extremely easily be performed.

The optical imaging device 12 and the electron beam imaging device 11 are mounted on the same plane. Therefore, advantageously the length of the body portion 24 can be shortened, the compact apparatus can be achieved in the rotation axis direction, and the outer shape of the magnifying observation apparatus can be miniaturized. The tilt observation can easily be performed at different tilt angles (observation angles) by the structure in which the side of the specimen stage 33 is mounted on tilt the side of the observation device 10, which allows the high-magnifying-power tilt observation to be performed at multi-angle.

since the first position 41 to which the electron beam imaging device 11 is fixed differs from the second position 42 to which the optical imaging device 12 is fixed, the first position 41 differs from the second position 42 in the tilt angle at which the specimen image is obtained by each observation device 10. As a result, although the electron microscope image and the optical image are simultaneously obtained at different tilt angles, the observation devices 10 can easily be moved to the position of each observation device 10 by rotating the body portion 24. That is, by the extremely simple operation of rotating the body portion 24, the electron beam imaging device 11 is quickly and correctly moved to the position in which the optical imaging device 12 is located, or the optical imaging device 12 is quickly and correctly moved to the position in which the electron beam imaging device 11 is located. This is a great advantage compared to the conventional electron microscope.

According to the present embodiment, when the observation images at the same tilt angle are to be obtained by the electron beam imaging device 11 and the optical imaging device 12, after the observation image (for example, optical image) is obtained by one of the observation devices (for example, optical imaging device 12), the cylindrical body portion 24 is rotated to rotate the other observation device (for example, electron beam imaging device 11) to the position in which the observation image is obtained by one of the observation devices. Since the rotating becomes the arc locus along the center axis of the rotation motion, namely, the rotation axis, the optical axis of the observation device is always maintained anywhere in the posture in which the optical axis is oriented toward the rotation axis. Therefore, once the focal distance is adjusted, the focusing operation is extremely easily performed since the focal distance is substantially maintained during the rotating.

In other words, when first picking up the observation image in one of the observation devices, if the focused position is also adjusted in the other observation device, the focused state is maintained before and after the rotating, and the observation image can quickly be obtained after the rotating. Therefore, according to the present embodiment, the observation images at the same position can quickly and easily be obtained using the two different observation devices 10.

As described above, in the configuration of FIGS. 3 and 17, the body portion 24 is rotated in order to observe the same visual field from the same direction (tilt angle). Examples of a method of recognizing that one of the observation devices is located in the position in which the other observation device is originally located include a method in which a rotating position detection section such as a rotary encoder and an angle sensor is disposed in the body portion to electrically detect the rotation angle and a method in which scales and marks are provided in the body portion and the fixed side to visually recognize the rotation angle.

The two observation devices are mounted on the body portion 24 so as to have the optical axis passing through the rotating center of the rotating device 30 in any rotating position that can be provided by the rotating device 30. The position of one of the observation devices (for example, electron beam imaging device 11) is rotated and fixed to the desired position of the observer using the rotating device 30, which allows the magnification observation in a specific point of the specimen placed on the specimen stage from the specific visual field direction.

As used in the present embodiment, the "substantially same observation position" means as follows. After the image in the specific point of the specimen placed on the specimen stage by one of the observation device positioned by the above-described technique, the other observation device (for example, optical imaging device 12) is rotated and fixed to the rotating position in which one of the observation devices is located, and the magnification observation is performed in the specific point of the specimen placed on the specimen stage from the substantially same specific visual field direction. In this case, the "substantially same observation position" means the position in which one of the observation devices and the other observation device are positioned.

The substantially same observation position is provided to the two observation devices, and the two observation devices obtain the images at the substantially same magnifying power. In such cases, it is assumed that the position of the specimen stage and the position of the specimen, placed on the specimen stage, relative to the specimen stage are substantially identical to each other. Therefore, the magnifying power of the image obtained by each observation device and the image in the specific point of the specimen are enabled to improve the subsequent comparative observation of the two images.

In other words, the observation visual field range in which the specimen is observed at the specific magnifying power from the specific visual field direction by one of the observation devices is substantially equal to the observation visual field range in which the specimen is observed at the same magnifying power as the specific magnifying power from the same direction as the specific visual field direction by the other observation device after the body portion 24 is rotated by the rotating device 30 such that the specimen can be observed from the same direction as the specific visual field direction by the other observation device. Obviously, the substantially same observation position herein may not become the completely same observation position due to a mechanical error of the rotating device 30.

(Rotatable Range)

The ranges in which the optical imaging device 12 and the electron beam imaging device 11 can rotate are configured such that at least parts of the ranges overlap each other, namely, such that the observation devices 10 can be moved to each position. FIGS. 17A to 17C are schematic diagrams conceptually illustrating the ranges in which the optical imaging device 12 and the electron beam imaging device 11 can rotate. FIG. 17A illustrates the overlapping rotating range of the electron beam imaging device 11 and the optical imaging device 12, FIG. 17B illustrates a rotatable range of the electron beam imaging device 11, and FIG. 17C illustrates a rotatable range of the optical imaging device 12. In FIGS. 17A to 17C, a solid line indicates the rotatable range of the electron beam imaging device 11, and a broken line indicates the rotatable range of the optical imaging device 12. As described above, because the optical imaging device 12 and the electron beam imaging device 11 rotate together by the rotation of the body portion 24, the rotatable range in which each observation device 10 can rotate depends on the rotatable range of the body portion 24.

(Overlapping Rotating Range)

More accurately, an angle at which the angle difference between the first position 41 and the second position 42, namely, the offset angle is subtracted from the rotatable range of the body portion 24 is the overlapping rotating range in which the optical imaging device 12 and the electron beam imaging device 11 overlap each other. For example, in the case of the rotatable range of 150° of the body portion 24 and the offset angle of 40°, the overlapping rotating range becomes 150°−40°=110°. Preferably, both the electron microscope image and the optical image can be obtained at various tilt angles with increasing overlapping rotating range. Ideally, the overlapping rotating range of 0° to 180° covers the whole upper surface of the specimen stage 33. In this case, the electron microscope image and the optical image can be obtained at almost all tilt angles. However, because the rotation of the observation device 10 is interrupted when the observation device 10 projected from the body portion 24 comes into contact with the surface on which the magnifying observation apparatus is installed, there is physical restriction by the length in which each observation device 10 is projected from the body portion 24 and the height of the leg portion 26 used to install the magnifying observation apparatus on the floor surface. Therefore, the overlapping rotating range becomes about 60° to about 180°. Preferably, the projection length of each observation device 10 and the length of the leg portion 26 are set such that the overlapping rotating range of 180° or the overlapping rotating range close to 180° is implemented. Herein, the tilt angle is computed assuming that the tilt angle is set to 0° when the electron beam imaging device 11 is located in the vertical posture. For example, in the example of FIG. 17B, the electron beam imaging device 11 has the total rotatable range of 150°, namely, the rotatable range of 90° on the left side from the vertical posture and the rotatable range of 60° on the right side from the vertical posture. Because the rotatable range of the optical imaging device 12 is fixed while tilted by 40° on the right side from the electron beam imaging device 11, the optical imaging device 12 has the total rotatable range of 150°, namely, the rotatable range of 50° on the left side from the vertical posture and the rotatable range of 100° on the right side from the vertical posture as illustrated in FIG. 17C.

As described above, in the observation devices 10 (optical imaging device 12 and electron beam imaging device 11), the distance to the specimen located on the rotation axis can substantially be kept constant during the rotational transfer (rotating). Therefore, once the focal distance is adjusted, advantageously only the rotation angle, namely, the viewpoint can be changed in the in-focus state even if the position is changed.

(Outline of Electron Beam Imaging Device 11)

Figure 18:
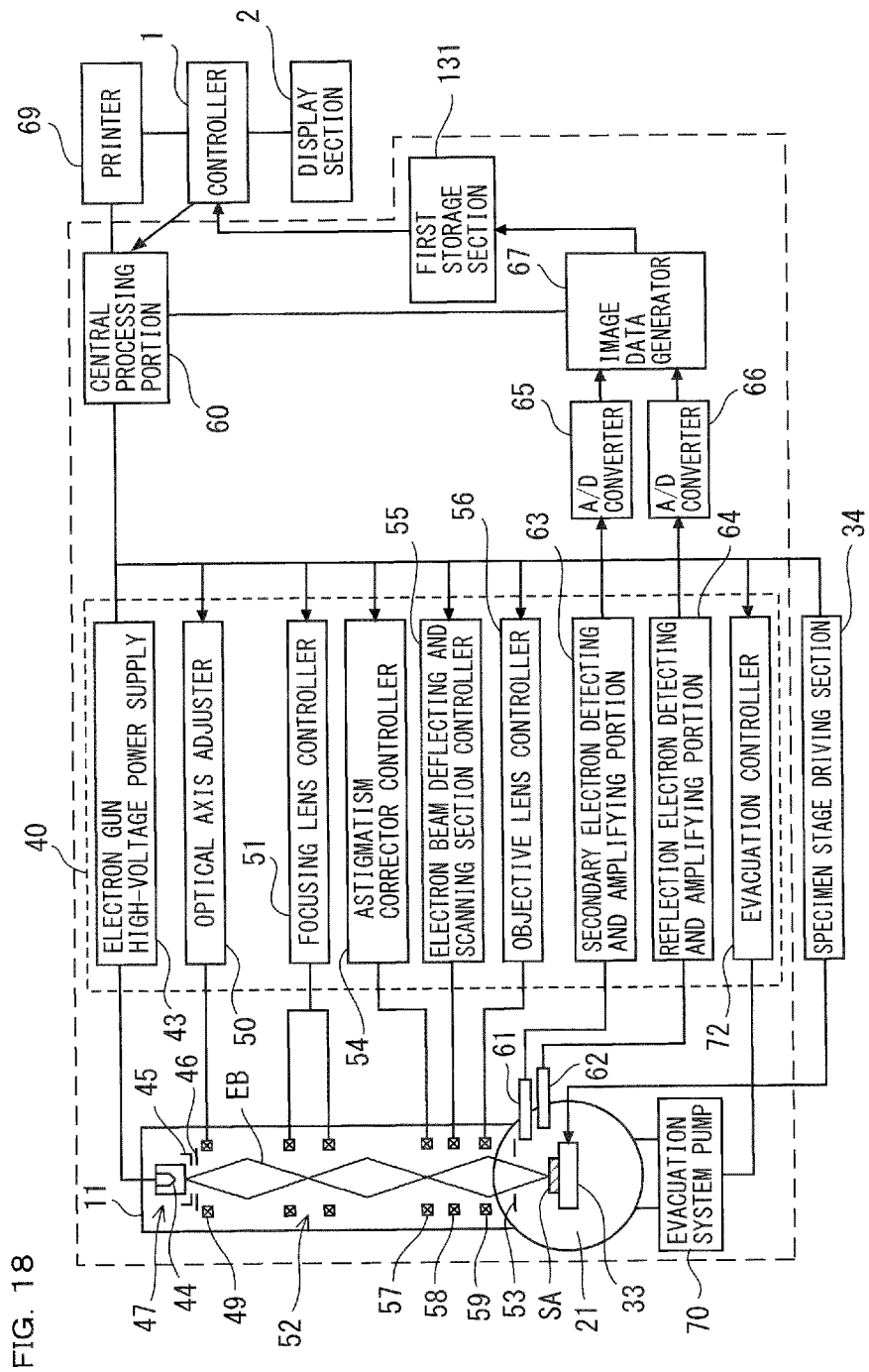
FIG. 18 is a block diagram illustrating a configuration of the electron beam imaging device.

An outline of the electron beam imaging device 11 will be described with reference to FIG. 18. FIG. 18 is a block diagram illustrating a system configuration of the electron beam imaging device 11. In FIG. 18, the SEM in which the electrostatic type electrostatic lens is used is utilized. The SEM includes an electron lens system that emits the electron beam of the accelerated electrons to cause the electron beam to reach a specimen SA, a specimen chamber 21 (chamber) in which the specimen SA is disposed, an evacuation system that evacuates the specimen chamber 21, and an operation system for the image observation. The electron beam imaging device 11 of FIG. 18 controls each member using an electron microscope controller 40 in order to observe the electron microscope image that is the electron beam observation image obtained by the charged particle beam. The electron beam imaging device 11 also performs settings of image observation conditions and various operations of the electron microscope using an electron microscope operation program executed by the controller 1 of FIG. 18 and displays the observation image on the display section 2.

(Electron Lens System)

The electron lens system includes the electron gun 47 that emits an electron beam EB of the accelerated electrons, an electron lens system that narrows an accelerated electron flux to form a fine beam, and a detector that detects secondary electrons and reflection electrons generated from the specimen SA. The electron beam imaging device 11 of FIG. 18 includes the electron gun 47 that is the electron lens system to irradiate the specimen with the electron beam EB, a gun aligner 49 that is the optical axis adjuster to correct the electron beam EB emitted from the electron gun 47 such that the electron beam EB passes through the center of the electron lens system, a condenser lens that is a focusing lens 52 to finely narrow a spot size of the electron beam EB, an electron beam deflecting and scanning section 58 that scans the specimen SA with the electron beam EB focused by the focusing lens 52, a secondary electron detector 61 that detects the secondary electrons emitted from the specimen SA in association with the scanning, and a reflection electron detector 62 that detects the reflection electrons.
(Evacuation System)

The specimen chamber 21 includes the specimen stage 33, a specimen introducing device, and an X-ray detecting spectroscope. The specimen stage 33 (stage) is controlled by a specimen stage controller 34, and the specimen stage 33 has a moving function in X-, Y-, and Z (height)-directions and a rotation (R) function. The four axes are motor-driven, or part of or all the four axes can manually be driven. The evacuation system includes the decompression unit 15 described above.
(Operation System)

The operation system performs adjustment of an irradiation current and focusing while displaying and observing the secondary electron image, the reflection electron image, the X-ray image, and the like. Generally, an output of the secondary electron image is film photographing with a camera for an analog signal. Recently, the image is outputted while converted into a digital signal, and various pieces of processing such as data storage, image processing and printing can be performed. The SEM of FIG. 18 includes the display section 2 that displays the observation images such as the secondary electron image and the reflection electron image and a printer 69 for the printing. The operation system includes a guidance section that guides a sequence for setting items necessary to set at least the acceleration voltage and the spot size (diameter of incident electron beam flux) as image observation conditions.
(Details of Electron Beam Imaging Device 11)

Next, the electron beam imaging device 11 will be described in detail with reference to FIG. 18. The SEM of FIG. 18 is connected to the controller 1 and the display section, the electron beam imaging device 11 is operated by the controller 1, the result is displayed on the display section, and the image observation condition and the image data are stored or the image processing and computation are performed if needed. A central processing portion 60 of FIG. 18 including a CPU and an LSI controls each block constituting the electron beam imaging device 11. The central processing portion 60 controls an electron gun high-voltage power supply 43 to cause the electron gun 47, which includes a filament 44, a Wehnelt electrode 45, and an anode 46, to emit the electron beam EB. The electron beam EB emitted from the electron gun 47 does not always pass through the center of the electron lens system, and the gun aligner 49 is controlled by an optical axis adjuster 50 to perform the correction such that the electron beam EB passes through the center of the electron lens system. Then, the electron beam EB is finely narrowed by the condenser lens that is the focusing lens 52 controlled by a focusing lens controller 51. The focused electron beam EB passes through an electron beam deflecting and scanning section 58, an objective lens 59, and an objective diaphragm 53, which deflect the electron beam EB, and an astigmatism corrector 57 that determines a beam spread angle of the electron beam EB, and the electron beam EB reaches the specimen SA. The astigmatism corrector 57 that controls a scanning speed or the like is controlled by an astigmatism corrector controller 54. Similarly, the electron beam deflecting and scanning section 58 is controlled by an electron beam deflecting and scanning section controller 55, the objective lens 59 is controlled by an objective lens controller 56, and the specimen SA is scanned with the electron beam EB by the action of the electron beam deflecting and scanning section 58 and the objective lens 59. Information signals such as the secondary electrons and the reflection electrons are emitted from the specimen SA by scanning the specimen SA with the electron beam EB, and the information signals are detected by the secondary electron detector 61 and the reflection electron detector 62. An A/D converter 65 performs A/D conversion to the information signals of the detected secondary electrons through a secondary electron detecting and amplifying portion 63. The information signals of the reflection electrons are detected by the reflection electron detector 62, and an A/D converter 66 performs A/D conversion to the information signals of the reflection electrons through a reflection electron detecting and amplifying portion 64. Then, the information signals of the detected secondary electrons and the information signals of the reflection electrons are transmitted to an image data generator 67 to form image data. The image data is transmitted to the controller 1 and displayed on the display section 2, such as the monitor, which is connected to the controller 1, and the image data is printed by a printer 69 if needed. The evacuation system pump 70 evacuates the specimen chamber 21. An evacuation controller 72 connected to the evacuation system pump 70 adjusts the vacuum, and the evacuation controller 72 controls the vacuum from the high vacuum to the low vacuum according to the specimen SA and the observation purpose.
(Electron Gun 47)

The electron gun 47 is a source that generates the accelerated electron having a certain level of energy. Examples of the electron gun 47 include a thermal electron gun that heats a W (tungsten) filament or a $LaB_6$ filament to emit electrons and a field emission electron gun that applies a strong electric field to a pointed tip of W to emit electrons. On the other hand, the electron lens system is controlled by an electron microscope magnifying power adjusting section 68 to adjust the electron microscope magnifying power. The focusing lens 52, the objective lens 59, the objective diaphragm 53, the electron beam deflecting and scanning section 58, the astigmatism corrector 57, and the like are mounted on the electron lens system. The focusing lens more finely narrows the electron beam EB emitted from the electron gun 47. The objective lens 59 finally focuses an electron probe onto the specimen SA. The objective diaphragm 53 is used to reduce an aberration. The detector includes the secondary electron detector 61 that detects the secondary electrons and the reflection electron detector 62 that detects the reflection electrons. Because of low energy, the secondary electrons are captured by a collector, converted into photoelectrons by a scintillator, and signal-amplified by a photomultiplier. On the other hand, the reflection electrons are detected by the scintillator or a semiconductor detector. The invention is not limited to the secondary electron signal detection and the reflection electron signal detection, but signal detectors for Auger electrons, transmission electrons, an internal electromotive force, cathode luminescence, an X-ray, and absorption electrons can be applied to the present invention. Alternatively, the reflection electron detector may be eliminated.
(Electron Lens System)
(Electrostatic Lens)

Figure 19:
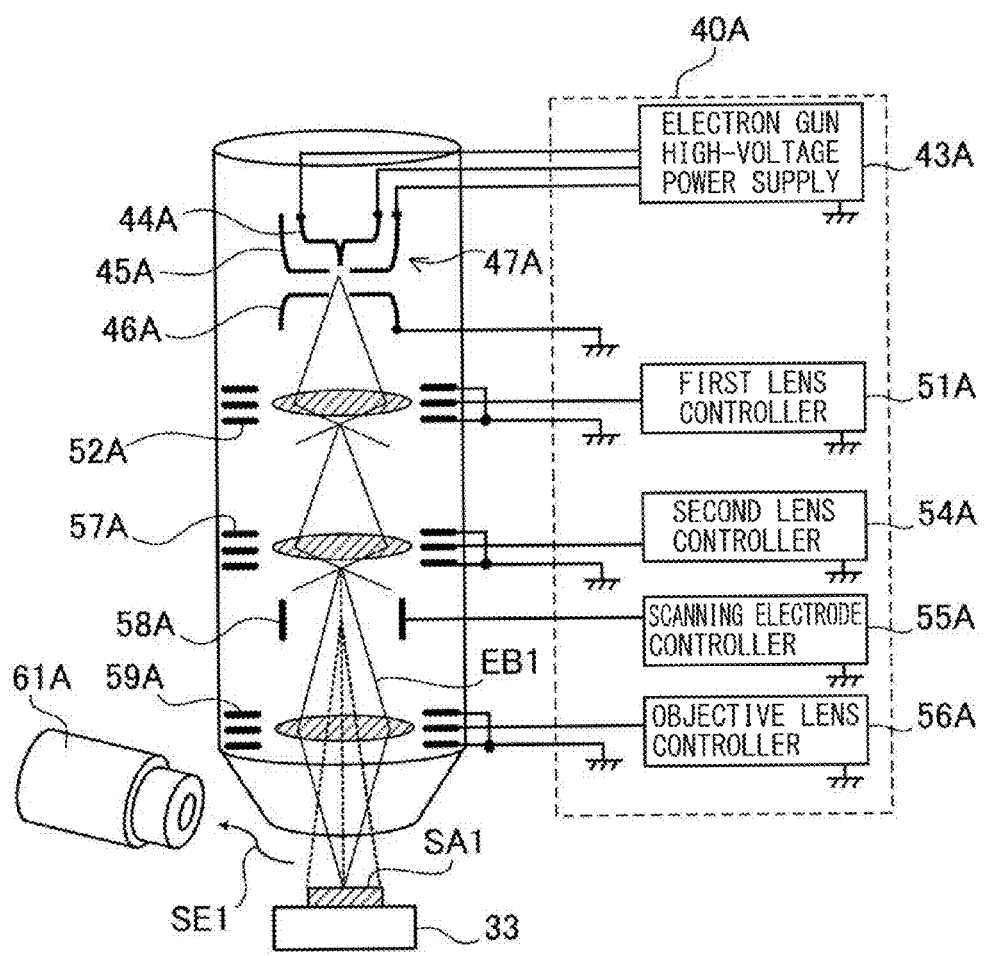
FIG. 19 is a block diagram illustrating a configuration of an electron lens system of an electrostatic lens.

In the SEM that is the electron beam imaging device 11, the electrostatic lens that is the electrostatic type electron lens is used as the electron lens. Because the electrostatic type SEM is light in weight, the electrostatic type SEM is suitable to the structure of the present embodiment in which the electron beam imaging device 11 is tilted. FIG. 19 is a block diagram illustrating an outline of the electrostatic lens. As illustrated in FIG. 19, the electrostatic lens has the structure in which each electron lens in the electron lens barrel is electrically controlled by an electrostatic lens controller 40A. The electron lens barrel includes an electron gun 47A, a first condenser lens 52A, a second condenser lens 57A, an electron beam deflecting and scanning section 58, a scanning electrode 58A that scans the specimen with an electron beam EB1, and an objective lens 59A. The electron gun 47A includes a filament 44A that is an electron beam source, a Wehnelt electrode 45A that is the electron beam focusing cylindrical electrode, and an anode 46A. The electrostatic lens controller 40A includes an electron gun high-voltage power supply 43A that controls the filament 44A and the Wehnelt electrode 45A to cause the electron gun 47A to emit the electron beam EB1, a first lens controller 51A that controls the first condenser lens 52A, a second lens controller 54A that controls the second condenser lens 57A, a scanning electrode controller 55A that controls the scanning electrode 58A, and an objective lens controller 56A that controls the objective lens 59A. In the electrostatic lens, the plurality of electrodes are combined, the specimen SA is irradiated with the electron beam EB1 by utilizing focusing action of the positive electric field on the electron beam EB1, and a secondary electron SE1 emitted from the specimen SA is detected by a secondary electron detector 61A. Although the electron lens having such a structure has the large aberration, advantageously the structure can be simplified to reduce the weight of the electron beam imaging device 11, and therefore the observation device 10 can stably be rotated to improve reliability. In the example of FIG. 19, the electron beam deflecting and scanning section 58 includes one-stage scanning electrode 58A. Alternatively, the electron beam deflecting and scanning section 58 may include a plural-stage scanning electrode.

(Electromagnetic Lens)

Figure 20:
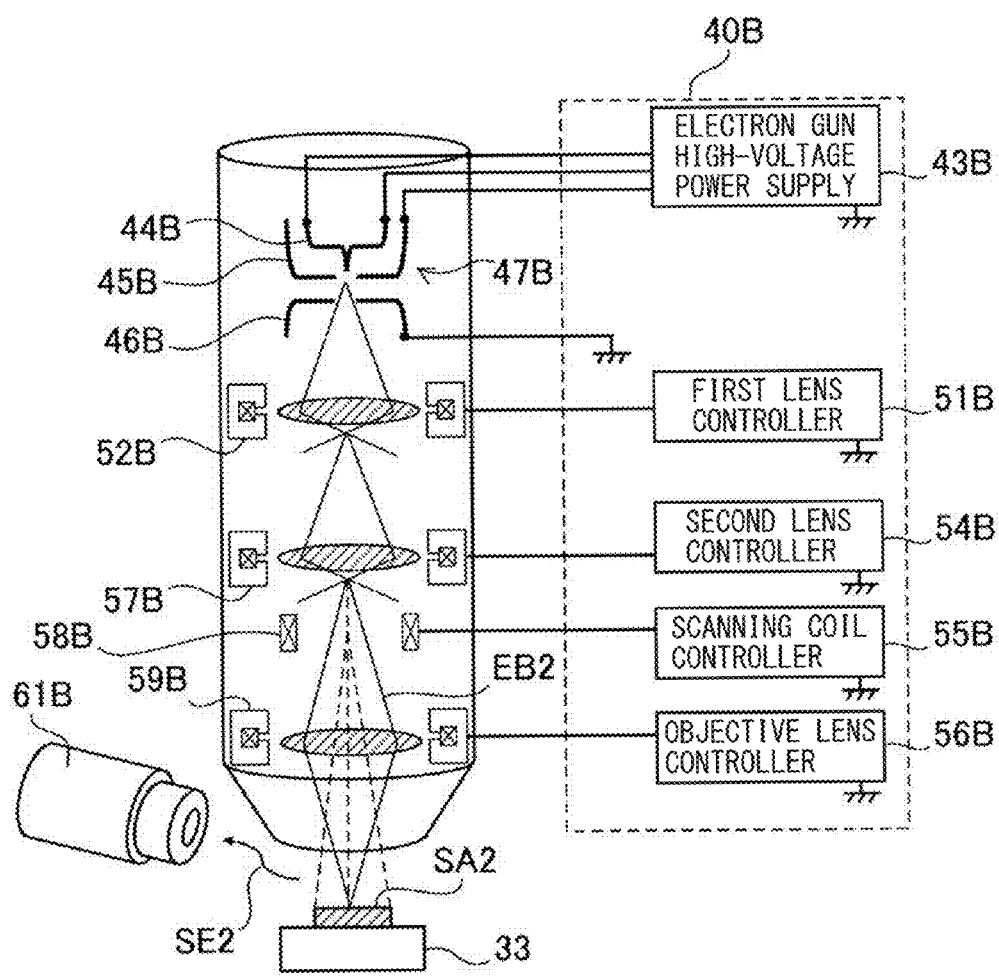
FIG. 20 is a block diagram illustrating a configuration of an electron lens system of an electromagnetic lens.

The present invention is not limited to the electrostatic lens of the electron beam imaging device 11, and another electron lens may be used as appropriate. For example, an electromagnetic lens that is a magnetic field type electron lens may be used as the electron lens as long as the mechanical strength can sufficiently be maintained. Advantageously, the electromagnetic lens is suitable to the high magnifying power. FIG. 20 illustrates an outline of the electromagnetic lens. The electromagnetic lens of FIG. 20 has the structure in which the each electron lens in the electron lens barrel is electrically controlled by an electromagnetic lens controller 40B. The electron lens barrel includes an electron gun 47B, a first condenser lens 52B, a second condenser lens 57B, a scanning coil 58B that scans the specimen with an electron beam EB2, and an objective lens 59B. The electron gun 47B includes a filament 44B that is the electron beam source, a Wehnelt electrode 45B that is the electron beam focusing cylindrical electrode, and an anode 46B. The electromagnetic lens controller 40B includes an electron gun high-voltage power supply 43B that controls the filament 44B and the Wehnelt electrode 45B to cause the electron gun 47B to emit the electron beam EB2, a first lens controller 51B that controls the first condenser lens 52B, a second lens controller 54B that controls the second condenser lens 57B, a scanning coil controller 55B that controls the scanning coil 58B, and an objective lens controller 56B that controls the objective lens 59B. In the electromagnetic lens, the specimen SA2 is irradiated with the electron beam EB2, and a secondary electron SE2 emitted from the specimen SA2 is detected by a secondary electron detector 61B. The above-described electrostatic lens utilizes the electric field while the electromagnetic lens utilizes the magnetic field of the electromagnet to irradiate the specimen SA2 with the electron beam EB2.

The electromagnetic lens in which the electromagnet is used is generally utilized in the magnetic field type electron lens. Alternatively, by using not the electromagnet but a permanent magnet as a magnetic field generating section, the simplification, miniaturization, and weight reduction of the lens structure can be achieved. However, in such cases, the focal distance becomes a fixed value because the magnetic field cannot be adjusted unlike the electromagnet. For the sake of convenience, the electromagnetic lens in which the permanent magnet is used is also referred to herein as the electromagnetic lens.

(Detector)

In the example of FIG. 3, the secondary electron detector (SED) 61 is used as the detector. As described above, another detector can be used instead of or in addition to the secondary electron detector 61. In the example of FIG. 3, the secondary electron detector 61 is provided in the fixed part. Preferably, the secondary electron detector 61 is provided in the end-face plate located on the back surface side. Because both the specimen stage 33 and the secondary electron detector 61 are located in the fixed part, the positional relationship between the specimen stage 33 and the secondary electron detector 61 is invariable, and the secondary electron can stably be detected. Particularly, in the tilt observation in which the specimen stage is tilted, advantageously the secondary electron does not become a shadow of the specimen stage, but the secondary electron can securely be captured. That is, in the conventional configuration in which the specimen stage side is tilted while the electron gun and the secondary electron detector are fixed, sometimes the specimen surface becomes a shadow of the specimen stage when viewed from the secondary electron detector, which results in a problem in that detection sensitivity of the secondary electron is degraded. On the other hand, in the above configuration in which the specimen stage side is fixed while the electron gun side is tilted, because the specimen stage is not tilted even in the tilt observation, such a shadow problem is not generated. As a result, advantageously the stable observation result can be obtained even in the tilt observation. However, the present invention is not limited to such a configuration. For example, the detector may be provided on the rotation part side.

(Specimen Stage 33)

As illustrated in FIGS. 6 to 8, the specimen stage 33 is disposed in the specimen chamber 21 in order to place the observation target specimen. The specimen stage 33 is a circular table having the flat upper surface. FIGS. 6 to 8 illustrate the specimen stage 33 broken away in a semicircle for the purpose of explanation. The specimen stage 33 is disposed in the position that is substantially aligned with the center axis of the cylindrical specimen chamber 21. Strictly speaking, since the specimen stage 33 can vertically be elevated and lowered while maintained in the horizontal posture, the moving mechanism is adjusted such that the specimen placement surface of the specimen stage 33 is matched with an intersection of the optical axes of the two observation devices 10.

The specimen is disposed in the substantial center of the rotation axis, and the specimen is observed while each observation device 10 is retained while oriented toward the center axis. Therefore, even if each observation device 10 is rotated along the rotation axis, the optical axis is always oriented toward the specimen, and the specimen can be captured in the visual field. Additionally, once the focal distance (working distance (WD)) is adjusted, the constant working distance is always maintained even if the observation device 10 is rotated, so that the observation can be performed from different angles while the focused state is substantially maintained. That is, because a visual field loss caused by the movement of the observation device 10 can extremely be reduced, advantageously a beginner user who is not used to the operation can easily perform the operation.

(Specimen Stage Driving Section 34)

The observation position is determined by physically moving the specimen stage 33 on which the specimen SA is placed. The specimen SA is moved by the horizontal surface moving mechanism 74 and the height adjusting mechanism 80, which constitute the specimen stage driving section 34 that drives the specimen stage 33. The specimen stage driving section 34 is controlled by the specimen stage controller 34. The specimen stage 33 can be moved and adjusted in various directions such that the observation position of the specimen SA can be adjusted. Specifically, the horizontal surface moving mechanism 74 is provided in order to move the specimen stage 33 in the horizontal plane. The horizontal surface moving mechanism 74 can perform the movement and the fine adjustment in the X-axis and Y-axis directions that are the planar direction of the specimen stage 33. An R-axis (rotation) direction may be added to the horizontal surface moving mechanism 74. The specimen stage driving section 34 acts as an observation positioning section that determines the observation position with respect to the specimen.

(Horizontal Surface Moving Mechanism 74)

As illustrated in FIGS. 6 to 7, in the horizontal surface moving mechanism 74, an X-axis operation knob 74X, a Y-axis operation knob 74Y, and an R-axis operation knob 74R are provided on the right side of the body portion 24 so as to be projected frontward. The X-axis operation knob 74X, the Y-axis operation knob 74Y, and the R-axis operation knob 74R manually adjust the moving amounts of the specimen stage 33 in the X-axis direction, the Y-axis direction, and the R-direction. As illustrated in FIGS. 6 to 7, in the movement of the specimen stage 33 in the X-axis direction, the Y-axis direction, and the R-axis direction, a torque is transmitted according to a rotation amount of each operation knob by a caterpillar belt drive tensioned at a rear end of each operation knob and gear drive, thereby moving the specimen stage 33 by a predetermined amount.

(Operation Knob)

In the height adjusting mechanism 80, a Z-axis operation knob 80Z that adjusts the moving amount of the specimen stage 33 in the Z-axis direction is provided so as to be projected upward from the back surface of the fixing plate 23. The operation knobs are unified to a rotation type, which allows the user to adjust the movement of the specimen stage 33 with a unified operation feeling. In the examples of FIGS. 6 and 7, the X-axis operation knob 74X, the Y-axis operation knob 74Y, and the R-axis operation knob 74R are provided on the right side of the body portion 24 while projected from the vertical surface. However, the present invention is not limited to such disposition and position, and the X-axis operation knob 74X, the Y-axis operation knob 74Y, and the R-axis operation knob 74R may be provided in an arbitrary position and an arbitrary disposition of the magnifying observation apparatus. For example, in the magnifying observation apparatus of the modifications illustrated in FIGS. 2B and 2C, the X-axis operation knob 74X, the Y-axis operation knob 74Y, and the R-axis operation knob 74R are arrayed in the horizontal plane. A projection that is held by fingers to facilitate the continuous rotation during the rotation may be provided in each operation knob. Further, the Z-axis operation knob 80Z is fixed such that the rotation axis is projected from the side surface while the knob part becomes the vertical posture, which allows the user to sensuously recognize the adjustment in the height direction from the posture of the knob to easily distinguish the Z-axis operation knob 80Z from another knob.

(Non-Tilt)

In the specimen stage 33, the movement can be performed only in the horizontal plane, while the tilt angle (T-axis direction) adjustment that can be performed in the conventional specimen stage is eliminated. In other words, the specimen stage driving section 34 does not include a tilt section that tilts the specimen stage 33. The specimen stage 33 is fixed to the horizontal posture in the non-tilted state in which the tilt action of the specimen stage 33 is prohibited, so that the specimen placed on the upper surface of the specimen stage 33 can prevented from being moved or sliding down due to the tilt. Advantageously, the conventionally-required work that fixes the specimen to the specimen stage using a double-sided adhesive tape is eliminated, and the breakage of the specimen caused by the adhesion and peel-off of the adhesive can also be avoided.

The observation device side is tiled, namely, rotated instead of tilting the specimen stage 33, whereby advantageously the user can easily recognize the change of the visual field in the tilt observation. Conventionally, because the observation device side such as the electron gun is fixed while the specimen side is tilted, the change of the visual field emerges as the change of the observation target, and it is difficult for the user to recognize which posture the specimen is in, which direction the specimen is viewed from, and which axis is to be adjusted in which direction in order to obtain the desired visual field. Therefore, it has been necessary for a skillful person to perform the fine adjustment. On the other hand, in the configuration in which the specimen is fixed while the observation device side is moved (rotated), the user physically tilts the observation device by hand, and the position of the specimen is fixed, so that the user can easily recognize the positional relationship between the specimen and the observation device side. In other words, similarly to the general observation, the configuration is close to the action in which the viewpoint of the user is moved with respect to the fixed specimen, the relative positional relationship becomes extremely clear in addition to the manual adjustment of the observation device by the user. Since the relative position between the specimen and the observation device can also be recognized in changing the visual field, the user can easily understand that the desired visual field is adjusted by moving which axis in which direction, and even the user who is not used to the specimen stage driving section 34 can intuitively recognize the operation.

(Height Adjusting Mechanism 80)

In the specimen stage 33, the height adjusting mechanism 80 that adjusts the horizontal position can adjust the Z-axis direction that is the vertical direction in order to adjust the distance (working distance) between the objective lens 59 and the specimen. The focal point variable ranges of the electron beam imaging device 11 and the optical imaging device 12 are included in the moving locus of the height adjusting mechanism 80, which allows the focal point adjustments of the electron beam imaging device 11 and the optical imaging device 12. In this case, the height adjusting mechanism 80 can be shared by the microscopic focus adjusting section 37 that adjusts the focal distance of the electron beam imaging device 11 and the optical focus adjusting section 38 that adjusts the focal distance of the optical imaging device 12. When each observation device 10 includes the focus adjusting section, the height adjusting mechanism 80 can be used in conjunction with the focus adjusting section. When one of the observation devices 10 is a focal point fixed type including no focus adjusting section, the height adjusting mechanism 80 acts as the focus adjusting section. For example, when the electron beam imaging device 11 includes the microscopic focus adjusting section 37 while the optical imaging device 12 is the focal point fixed type, the height adjusting mechanism 80 can be used as the optical focus adjusting section 38.

The positioning of the observation image and the movement of the observation visual field are not limited to the method of physically moving the specimen stage. For example, a method (image shift) of shifting the scanning position of the electron beam emitted from the electron gun may be used. Alternatively, the virtual movement may be used in conjunction with the physical movement. Alternatively, a method of capturing the image data once in a wide range to process the image data in a software manner may also be used. In this method, because the data is captured once and processed, the observation position can be moved in the software manner, and the hardware movement such as the specimen stage movement and the electron beam scanning is not performed. As to the method of previously capturing the large image data, there is a method of obtaining a plurality of pieces of image data in various positions and combining the pieces of image data to obtain the wide-area image data. Alternatively, the area can widely be obtained by obtaining the image data at the low magnifying power.

(Optical Imaging Device 12)

Figure 21A:
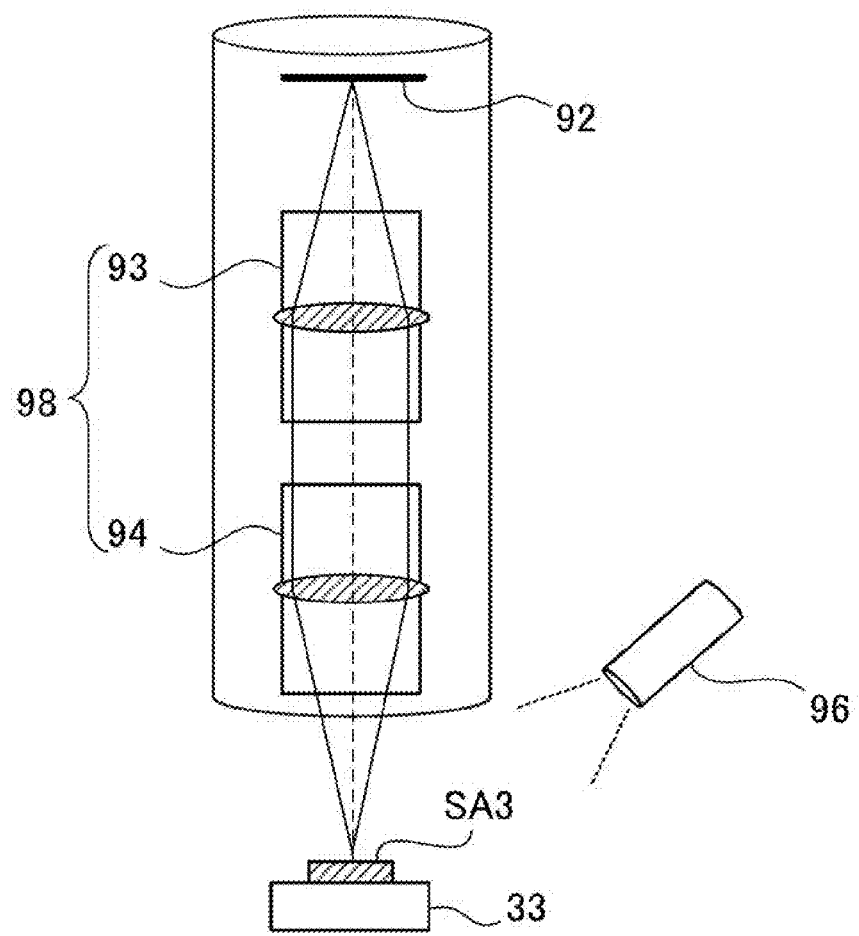
FIG. 21A is a block diagram illustrating a configuration of an optical lens system of the optical imaging device.

The optical imaging device 12 will be described below. FIG. 21A illustrates a configuration example of the optical lens system of the optical imaging device 12. The optical lens includes an optical imaging element 92 that is disposed in the optical lens barrel and an optical zoom lens 93 and an objective lens 94, which constitute an optical lens group 98. Each lens includes a plurality of optical lenses. The optical zoom lens 93 is driven in the manual or motor-driven manner to adjust a gap between the lenses, thereby adjusting the magnifying power. For the motor drive, a motor is provided to move the position of the optical zoom lens 93, and an optical zoom magnifying power is adjusted by the rotation of the motor. The optical imaging device 12 includes an optical magnifying power adjusting section 95 in order to adjust the optical magnifying power. For the variable focal position, the optical focus adjusting section 38 may be provided in order to adjust the focal position. For the fixed focal position, the optical focus adjusting section can be eliminated. An illumination portion 96 is disposed in order to illuminate a specimen SA3 placed on the specimen stage 33.

A CCD, a CMOS, and the like can be used as the optical imaging element 92. In the optical imaging element 92, the reflected light or the transmitted light of the light incident to the specimen SA3 through the optical system is electrically read as an imaging signal in each of two-dimensionally arrayed pixels to form an optical image. The image data electrically read by the optical imaging element 92 is transmitted to and processed by an information processing section 101.

(Optical Imaging System)

In the configuration of the magnifying observation system 1000 illustrated in FIG. 1, the controllers are provided to control the optical imaging device 12 and the electron beam imaging device 11, respectively. Herein, the electron microscope image device is controlled by the controller 1, and the optical imaging device 12 is controlled by the information processing section 101 incorporated in the display section. In the present embodiment, the controller 1 is configured to perform the image processing such as image synthesis. Instead of the configuration in which the controller separately controls the observation device, the plurality of observation devices may be controlled by one controller. The use of the common controller can reduce the number of necessary members, and the user can operate one controller to control the plurality of observation devices. In the operation of the observation devices, the operability is improved by providing the unified environment and user interface.

Figure 21B:
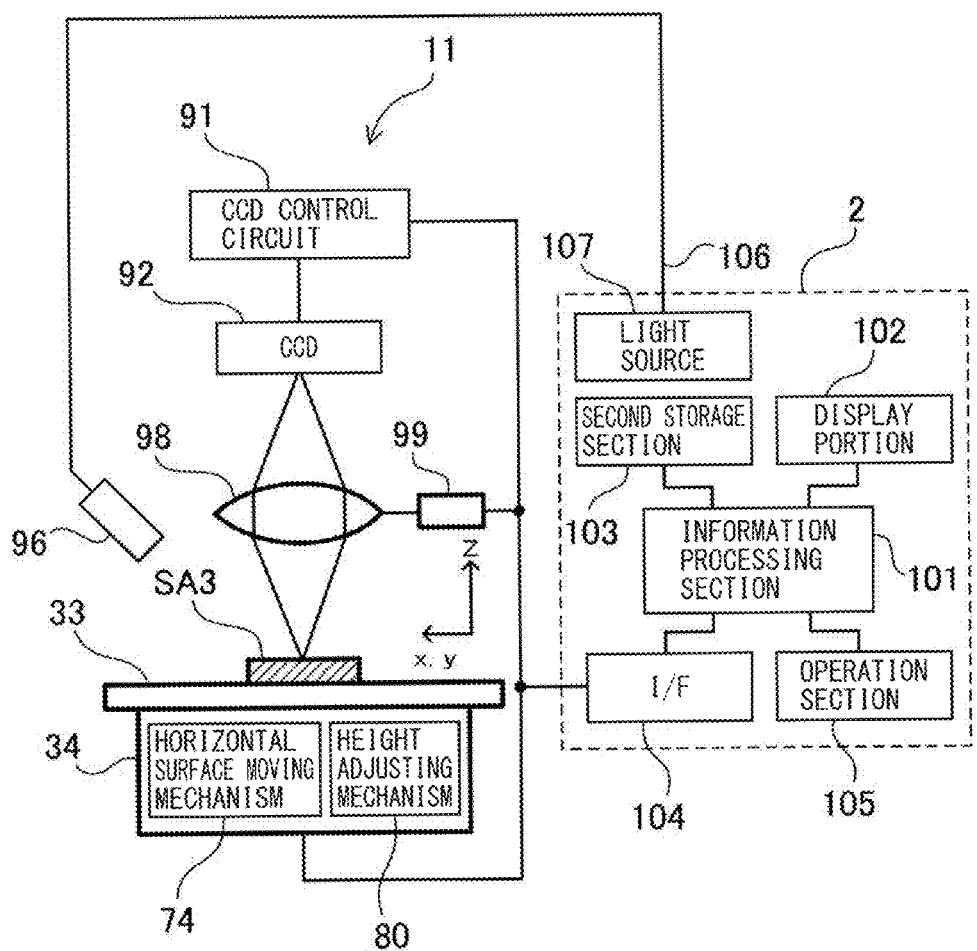
FIG. 21B is a block diagram illustrating an optical imaging system in which the optical imaging device is controlled by an information processing section.

FIG. 21B is a block diagram illustrating an optical imaging system in which the optical imaging device 12 is controlled by the information processing section 101 of the display section 2. The optical imaging device 12 illustrated in FIG. 21B includes a light-receiving element, such as the CCD, as the optical imaging element that obtains the image of the specimen SA3, a CCD control circuit 91 that drives and controls the CCD, and the optical lens group 98 that forms an image of the transmitted light or reflected light of the light, with which the specimen SA3 placed on the specimen stage 33 is illuminated from the illumination portion 96, on the CCD. The configuration illustrated in FIG. 21A can be utilized in the optical lens group 98. As described in FIG. 4 and the like, the horizontal surface moving mechanism 74 and the height adjusting mechanism 80 are provided as the specimen stage driving section 34 that drives the specimen stage 33 on which the specimen SA3 is placed. A mechanism that moves the optical lens group 98 in the optical axis direction may be provided as the optical focus adjusting section, or the height adjusting mechanism may also be used as the optical focus adjusting section that changes the relative distance in the optical axis direction to adjust the focal point.

The display section 2 includes a memory 103 as a mode of the image data storage portion in which the image data electrically read by the imaging element is stored, a display portion 102 that displays the image based on the image data electrically read by the imaging element, an operation portion 105 that operates input and the like based on a screen displayed on the display portion 102, the information processing section 101 that performs various pieces of processing such as the image processing based on the information inputted from the operation portion 105, and an interface 104 through which the information processing section 101 transmits and receives information to and from the optical imaging device 12. The display portion 102 is a monitor that can perform high-resolution display, and the CRT or the liquid crystal panel is used as the display portion 102.

In the memory 103, for example, focal distance information on the relative distance in the optical axis direction between the specimen stage 33 and the optical lens group 98 in adjusting the focal point with the optical focus adjusting section is stored along with two-dimensional position information on the specimen SA3 in a plane substantially perpendicular to the optical axis direction. When an arbitrary point or region is set on the image displayed on the display portion 102 using the operation portion 105, the information processing section 101 computes the average height in the optical axis direction of the specimen SA3 corresponding to the set region based on the focal distance information, stored in the memory, on part or whole of the specimen SA3 corresponding the set region. In the magnifying observation apparatus, the imaging element electrically reads the reflected light or transmitted light of the light incident through the optical lens group 98 to the specimen stage 33 on which the specimen SA3 is placed, and the average height or depth in the optical axis direction of the specimen SA3 corresponding to the specified region can be computed. The information processing section 101 can also act as an image synthesizing section that synthesizes the electron microscope image and the optical image.

The operation portion 105 is connected to the computer in the wired or wireless manner, or the operation portion 105 is fixed to the computer. For example, the general operation portion 105 includes various pointing devices such as a mouse, a keyboard, a slide pad, a track point, a tablet, a joystick, a console, a jog dial, a digitizer, a light pen, a numerical keypad, a touch pad, and accu-point. The operation portion 105 can be used to operate the magnifying observation apparatus and peripheral devices thereof in addition to the operation of the magnification observation operation program. The touch screen or the touch panel is used in the display that displays an interface screen, and the user directly touches the screen to enable input or operation. Alternatively, sound input and other existing input sections may be used or commonly used. In FIG. 21B, the operation portion 105 includes the pointing device such as the mouse.

The computer can be connected to the display section 2, and the magnification observation operation program can additionally be installed in the computer to operate the magnifying observation apparatus from the computer. Alternately, the display section may be implemented by the computer. In this case, the monitor connected to the computer acts as the display portion of the display section.

(Pixel Shifting Section 99)

The optical imaging device 12 includes a pixel shifting section 99 that shifts the pixels to obtain a resolution higher than a resolution possessed by the CCD. In the pixel shift, the high resolution is achieved by synthesizing the image that is obtained while a subject is shifted by a half of pixel pitch and the pre-shift image. Examples of the typical image shift mechanism include a CCD drive method of moving the imaging element, an LPF tilt method of tilting the LPF, and a lens movement method of moving the lens. In FIG. 21B, there is provided an optical path shift portion that optically shifts an incident optical path of the reflected light or transmitted light incident to the CCD through the optical lens group 98 from the specimen SA3 mounted on the specimen stage 33 in at least one direction at a distance smaller than a gap between pixels of the CCD in the direction. The mechanism or technique of implementing the image shift is not limited to the above-described configurations, but other well-known methods can be used as appropriate.

The CCD can electrically read a light-receiving amount in each of the pixels two-dimensionally arrayed in the x-direction and the y-direction. The image of the specimen SA3 formed on the CCD is converted into the electric signal by each pixel of the CCD according to the light-receiving amount and further converted into the digital data by the CCD control circuit 91. The information processing section 101 stores the digital data converted by the CCD control circuit 91 as the light receiving data in the memory 103 along with pixel disposition information (x, y) that is two-dimensional position information on the specimen SA3 in a plane (x- and y-directions in FIG. 21B) substantially perpendicular to the optical axis direction (z-direction in FIG. 21B). Herein, the plane substantially perpendicular to the optical axis direction is not exactly a plane having a right angle with respect to the optical axis, but an observation surface located within a tilt range to a degree in which the shape of the specimen can be recognized in the resolution of the optical system and the imaging element.

As described above, in the configuration of the magnifying observation system 1000 of FIG. 1, the optical imaging device 12 is controlled by the information processing section 101 incorporated in the display section 2 while the electron beam imaging device 11 is controlled by the controller. That is, the controller is separately provided in each observation device. The present invention is not limited to such a configuration, and one controller may control the plurality of observation devices.

(Illumination Portion 96)

In the illumination portion 96 illustrated in FIG. 21B, epi-illumination that illuminates the specimen SA3 with the light incident from the viewing direction is illustrated. The present invention is not limited thereto, and transmission illumination that illuminates the specimen SA3 with the transmitted light may also be used. The illumination portion 96 is connected to the display section 2 through an optical fiber 106. The display section 2 includes a connector that connects the optical fiber 106, and the display section 2 incorporates a light source 107 that outputs the light to the optical fiber 106 through the connector therein. A halogen lamp, a xenon lamp, the LED, or the like is used as the light source 107.

As illustrated in FIGS. 4 and 7, the illumination portion 96 is disposed at a light source port 97 in the specimen chamber 21. In the illumination portion 96 connected to the light source port 97, the optical axis of the illumination light is set such that the illumination light is oriented toward the specimen stage 33. Preferably, as illustrated in FIG. 4, the illumination portion 96 is located on a plane different from the rotation plane in which each observation device 10 is provided, and the optical axis is set at an angle intersecting the rotation plane. By tilting the illumination light in this manner, the direction in which the shadow is generated in the specimen by the illumination light does not become in parallel with the rotation plane but intersects the rotation plane, so that the dark shadow part can effectively be reduced in the tilt observation.

Preferably, the inner surface of the specimen chamber 21 has reflectiveness. Therefore, the illumination light is reflected in the specimen chamber 21 as much as possible, and effectively a shade of the illumination can be decreased by irregular reflection. For example, the inner surface of the specimen chamber 21 is coated with a high-reflectance metal such as Ag coat.

The light source port 97 is provided on the rotation part side. Therefore, because the illumination portion 96 is also rotated along with the rotating of the body portion 24, the positional relationship between the optical imaging device 12 and the illumination portion 96 can be kept constant, and the specimen is continuously illuminated at the same angle in the radial direction irrespective of the position of the optical imaging device 12. As a result, advantageously the illumination state does not change according to the rotating of the optical imaging device 12.

(In-Specimen-Chamber Observation Device 13)

In the present embodiment, an in-specimen-chamber observation device 13 is provided as a third observation device in order to observe an environment in the specimen chamber 21. The in-specimen-chamber observation device 13 that is the additional optical imaging device can obtain an optical image as an in-specimen-chamber image. The optical image includes at least the specimen stage 33, the specimen placed on the specimen stage 33, and the leading end portion of the electron beam imaging device 11 in the visual field. Therefore, the specimen in the specimen chamber 21, and the positional relationship between the optical imaging device 12 and the electron beam imaging device 11 can easily be recognized. Particularly the position in which specimen is placed is advantageously confirmed. For example, in the configuration in which the specimen stage 33 is pulled out frontward from the specimen chamber 21, although the specimen placement work is easy to perform, it cannot be previously confirmed how the specimen is viewed by the observation device according to the specimen placement position. On the other hand, by providing the in-specimen-chamber observation device 13, the user can place the specimen in the desired position on the specimen stage 33 before the evacuation while confirming the in-specimen-chamber image that is the optical image of the in-specimen-chamber observation device 13 in real time. That is, advantageously the specimen can be placed while confirming the specimen placement position. The in-specimen-chamber observation device 13 may include the imaging element such as the CCD and the CMOS, and is also referred to as a Chamber View Camera (CVC).

Preferably, the optical axis of the in-specimen-chamber observation device 13 is substantially parallel to the rotation axis. Therefore, the rotational transfer of the body portion 24 can be recognized from above, and the rotation state can easily be recognized as the arc locus. The rotation axis can be included in the optical image by an offset disposition in which the optical axis is offset so as to become parallel to the rotation axis, so that the rotation can more easily be recognized. Preferably, an offset amount of the optical axis of the in-specimen-chamber observation device 13 is set in a range of about ±10% of the cylindrical radius based on the rotation axis of the body portion 24. As used herein, that "the specimen stage 33 is substantially the same to a height of the rotation axis" is used in the sense of including the offset position. Herein, "parallel" is used in the sense of including the angle difference up to about 20° with respect to the rotation axis. When the in-specimen-chamber observation device 13 is disposed at the offset position in the specimen chamber, more preferably the optical axis of the in-specimen-chamber observation device 13 is located above the rotation axis. Therefore, the specimen observation surface aligned with the rotation axis can be included in the lower portion of the in-specimen-chamber image, and the positional relationship between the specimen and the electron gun can securely be recognized.

When the electron beam imaging device 11 is rotated along with the body portion 24, the position in which the in-specimen-chamber observation device 13 is fixed is desirably located on the fixed part side that does not rotate, because the electron beam imaging device 11 and the body portion 24 are rotated while the presence or absence or a risk of the interference between the specimen stage 33 and the specimen placed on the specimen stage 33 is confirmed.

However, the in-specimen-chamber observation device 13 can also be provided on the rotation part side. In this case, rotation angle information on the body portion 24 is obtained by the angle sensor or the like to control the correction of the image rotation, which allows the acquisition of the still image in which the rotation motion is cancelled. For example, the controller 1 computes a rotation amount of the rotating portion and the moving amount of the visual field, and the image processing is performed such that the display part of the observation visual field is moved in the reverse direction by the moving amount of the visual field. Therefore, the in-specimen-chamber image is displayed as the rotation correction image in which the correction is performed so as to cancel the tilt caused by the rotation of the body portion, so that the visual field of the image displayed on the display section 2 can be kept constant irrespective of the rotation position.

Figure 22A:
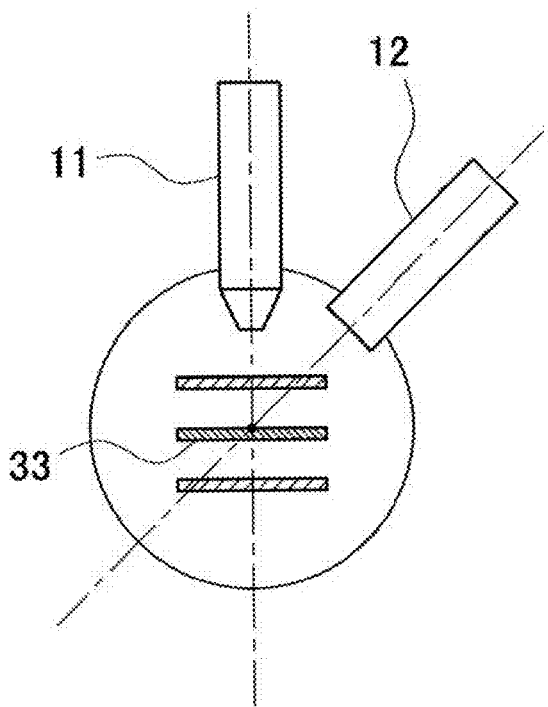
FIG. 22A is a schematic sectional view illustrating a relative movement of the specimen stage and an observation device in the specimen chamber.
Figure 22B:
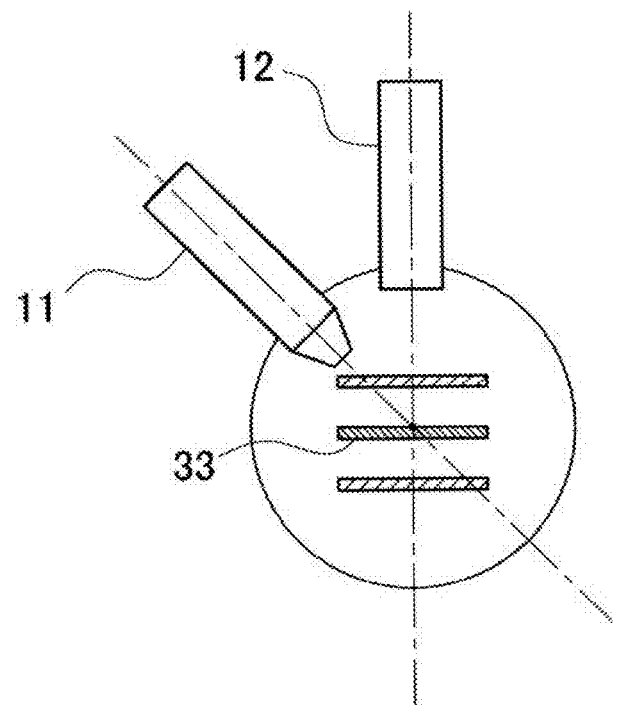
FIG. 22B is a schematic sectional view illustrating a state in which the observation device is rotationally moved in the specimen chamber of FIG. 22A.

FIGS. 22A and 22B are schematic sectional views illustrating relative movement between the specimen stage 33 and the observation device 10 in the specimen chamber 21. As described above, only the specimen stage 33 is vertically moved by the height adjusting mechanism 80 while maintained in the horizontal posture, and the tilt and oscillation, in which the specimen placement surface of the specimen stage 33 is inclined, are prohibited in the specimen stage 33. In order to implement the tilt observation with this configuration, the specimen stage 33 is configured to tilt the side of the observation device 10. When the specimen side is fixed while the side of the observation device 10 is tilted, advantageously the user can easily recognize the positional relationship of the tilt posture in the observation image that is obtained by the observation device 10 and displayed on the display section 2. Conversely, in the conventional structure in which the camera side is fixed while the specimen stage 33 is tilted, namely, in a eucentric structure illustrated in FIGS. 23A and 23B, when the tilt angle of the tilt observation is changed in the currently observed image, it is difficult to recognize the positional relationship as to which direction the tilt should be adjusted to obtain the desired image. On the other hand, in the configuration of the present embodiment in which the specimen side that is the observation target is fixed while the side of the observation device 10 that becomes the viewpoint of the observation, namely, an eye line is moved, advantageously the positional relationship can be recognized with a sense of moving the eye line, similar to when the user actually observes the object, and therefore the direction in which the angle should be adjusted can quickly be recognized.

Because the specimen stage 33 is not tilted, a risk that the specimen slides down from the specimen stage 33 is eliminated, the structure to fix the specimen to the specimen stage 33 and the work to fix the specimen with the adhesive tape are eliminated, and a risk of breaking the specimen is eliminated in peeling of the adhesive tape. Therefore, workability and safeness are improved.

Figure 23A:
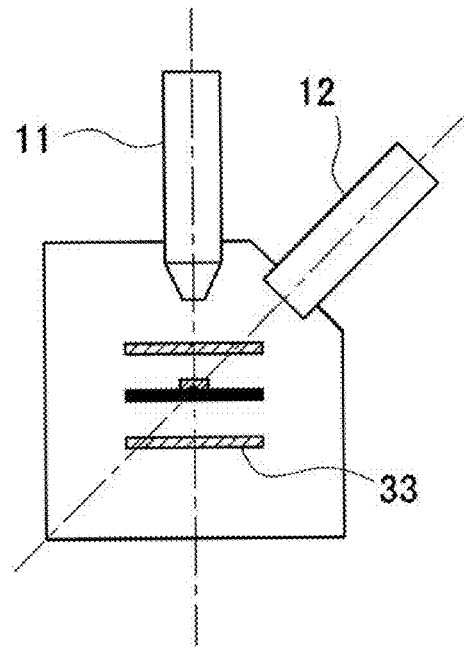
FIG. 23A is a schematic sectional view illustrating the specimen stage moved by a conventional eucentric structure.
Figure 23B:
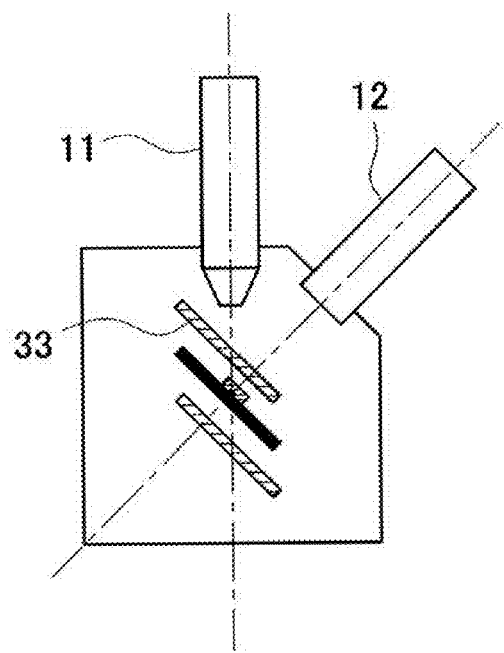
FIG. 23B is a schematic sectional view illustrating a state in which the specimen stage is tilted in the specimen chamber of FIG. 23A.

In the conventional eucentric structure, when the height (Z-axis) of the specimen stage 33 is changed while the specimen stage 33 is tilted, the specimen stage 33 is moved from the black position illustrated in FIG. 23B to the hatching position, and the optical axis of the optical imaging device 12 fixed in the tilt posture is relatively moved on the specimen stage 33, which results in a problem in that the observation visual field is unintentionally moved. Particularly, in the focal point fixed type in which the optical imaging device 12 does not include the optical focus adjusting section that adjusts the focal position, it is necessary that the working distance be changed only by adjusting the height of the specimen stage 33, and the observation visual field may not be matched with that of the electron microscope depending on the focused position.

When the angle between the observation device 10 and the specimen is changed, it is necessary to correct the focal position since the focal distance between the observation device 10 and the specimen varies every time the angle is changed. Additionally, in obtaining the tilt observation images of the same specimen at the same tilt angle by the two observation devices 10, it is necessary to store the angle used in one of the observation devices 10, and it is necessary to reproduce this angle to adjust the focal position after the specimen stage 33 is moved onto the side of the other observation device 10.

On the other hand, in the present embodiment, as illustrated in FIGS. 22A and 22B, the observation visual field can be kept constant irrespective of the height of the specimen stage 33 by performing the rotational transfer of the observation device 10 to the vertical position. In the present embodiment, the observation device 10 to be used is located in the vertical posture, namely, the optical axis of the selected observation device 10 is substantially aligned with the moving direction (Z-axis) of the height adjusting section. Therefore, the movement of the observation visual field caused by the height adjustment can be avoided. As a result, the eucentric working distance becomes only one point. When the observation is performed while the observation device 10 is located in the vertical posture, the optical axis of the observation device 10 is aligned with the axis of the vertical movement of the specimen stage 33, and the visual field is not moved even if the working distance is adjusted. Therefore, advantageously the eucentric position can easily be adjusted.

Obviously, the specimen can be observed even if the observation device 10 is located in the tilt posture. In this case, although the observation visual field is moved by the height adjustment of the specimen stage 33, the movement of the observation visual field can be cancelled through the image processing. For example, a computation portion computes the change in height and the moving amount of the visual field, and the computation portion performs the image processing such that the display part of the observation visual field (the optical image and the electron microscope image on the display) is moved in the reverse direction by the movement of the visual field. Therefore, the visual field of the image displayed on the display section 2 can be kept constant irrespective of the change in height. As a result, there can be implemented the magnifying observation apparatus in which the observation visual field does not change irrespective of the angle and the observation position of the specimen stage 33 even if the observation device 10 is switched.

Particularly, in the conventional design concept, the observation with the optical imaging device 12 is sacrificed due to a high priority to the electron microscope observation, and the tilt observation is restricted due to a high priority to the resolution (maximum magnifying power) of the electron microscope. As a result, although both the electron beam imaging device 11 and the optical imaging device 12 are provided, the user cannot take advantage of the electron beam imaging device 11 and the optical imaging device 12 to a maximum extent to utilize the optical image and the tilt observation without limitation.

Specifically, the resolution of the electron microscope becomes better with decreasing working distance that is the distance to the specimen from the leading end of the objective lens of the electron beam imaging device 11. However, when the specimen is observed from the tilted angle, unfortunately the specimen comes into contact with the objective lens of the electron beam imaging device 11 when the working distance is too short. Conventionally, the observation is performed while the working distance is set to the minimum distance in which the specimen does not collide with the objective lens. The minimum distance is determined by a size of the specimen and the desired tilt angle. As a result, in the conventional electron microscope, the observation is performed at the working distance that is determined by the size of the specimen and the desired tilt angle. In order to comfortably perform the observation at various working distances, it is desirable that the observation visual field does not change at any working distance when the tilt angle of the specimen stage 33 changes. Therefore, in the conventional electron microscope, there is adopted the configuration in which the visual field is not moved at any working distance even if the specimen stage 33 is tilted, namely, the tilt mechanism of the eucentric type specimen stage 33 in which, as illustrated in FIG. 23B, the visual field is not shifted irrespective of the position of the Z-axis of the specimen stage 33 on the optical axis of the electron microscope.

According to this configuration, the adjustment is previously performed such that the specimen surface is located at the black position of FIGS. 23A and 23B, which allows the observation to be performed in the same visual field at the same tilt angle with the optical imaging device 12 and the electron beam imaging device 11 only by one action to perform the tilted rotation of the specimen stage 33. However, it is necessary that the optical imaging device 12 having a shallow depth of field perform the visual field search and the position adjustment, and the visual field is shifted between the electron beam imaging device 11 and the optical imaging device 12 in performing the position adjustment, which results in a problem in that the adjustment is hard to perform.

In view of the above circumstances, as described above in the present embodiment, the side of the specimen stage 33 is fixed while the side of the observation device 10 is tilted as illustrated in FIGS. 22A and 22B. As a result, since not the specimen stage 33 but the side of the observation device 10 is tilted, the images can easily be switched in the same observation position at the same tilt angle irrespective of the height of the specimen stage 33. Therefore, both the electron microscope observation and the optical microscope observation are emphasized, and the tilt observation is also emphasized, which allows the implementation of the convenient magnification observation.

In the conventional electron microscope, the Z-stage as the height adjusting mechanism 80 is provided in the member on which the electron lens and the optical lens are mounted, and the mechanism that tilts and rotates the specimen stage 33 is provided on the Z-stage. The electron lens and the optical lens are mounted on the fixed part side.

On the other hand, in the magnifying observation apparatus of the present embodiment, the mechanism that rotates the specimen stage 33 is provided in the member on which the electron lens and the optical lens are mounted, and the height adjusting mechanism 80 is further mounted on the member. That is, the rotation axis mechanism and the Z-axis moving mechanism are provided at the reverse positions compared with the conventional electron microscope. The electron lens and the optical lens are mounted on the rotation part side.

(Alignment of Moving Direction of Optical Axis and Specimen Stage 33)

In the magnifying observation apparatus of the present embodiment, the rotational transfers of the electron beam imaging device 11 and the optical imaging device 12 are performed by the rotating device 30, which allows both the observation devices 10 to be disposed in one observation position by switching. That is, the imaging can be performed while the optical axes of both the observation devices 10 are aligned with each other by the switching. On the other hand, the specimen stage 33 can vertically be moved by the height adjusting mechanism 80 while maintained in the horizontal posture. As a result, the optical axis can be aligned with the moving direction of the specimen stage 33 by locating the observation device 10 in the vertical posture.

Therefore, the tilt observation can be performed by the electron beam imaging device 11 and the optical imaging device 12, which are rotated along the cylindrical shaped outer surface, and the rotation axis is aligned with the height direction of the specimen stage 33, namely, the height of the observation surface of the specimen placed on the specimen stage 33 to enable the observation without changing the visual field. The observation image can be obtained in the substantially same visual field at the substantially same tilt angle and at the substantially same magnifying power while the optical axes of the observation devices 10 are aligned with each other, and the comparative observation of the two obtained observation images can be performed.

(Magnifying Power Conversion Function)

The magnifying observation apparatus further has a magnifying power conversion function. In the magnifying power conversion function, when different observation devices have different decision criteria of magnifying power, the different observation device is displayed at a unified magnifying power, or the magnifying power expressed by the different decision criterion is automatically adjusted to the unified magnifying power. When performing observation with the magnifying observation apparatus, how much magnification is necessary for the observation is generally indicated by the magnifying power. However, because a definition of the magnifying power depends on the size of the display range, the magnifying power often varies in each observation device. Generally, the magnifying power is defined and computed by the following equation.

Magnifying power=display range of observation image/observation visual field range In the above equation, the display range is a parameter determined by not the user but a designer of the observation device. On the other hand, as to the observation visual field range, the user arbitrary selects a desired visual field range in the settable visual field range determined by performance of the observation device. A magnifying power determining method will be described below.
(Electron Microscope Magnifying Power)

For example, in the electron beam imaging device 11 constituting the scanning electron microscope, generally the display range means a photograph size (for example, 124 mm×94 mm). The observation visual field range means an actual size of the range where the specimen is scanned with the electron beam emitted from the electron gun through the electron lens.
(Optical Magnifying Power)

On the other hand, in the structure of the optical imaging device 12 such as the digital microscope, the light reflected from the specimen illuminated with the illumination light forms an image on the optical imaging element such as the CCD and the CMOS through the optical lens. Generally, the display range of the optical imaging device 12 becomes a monitor size (for example, 15-inch monitor screen size) of the display portion 102. The monitor size varies based on whether the display portion 102 is the LCD or the CRT. The observation visual field range becomes (effective imaging range of optical imaging element)/(optical magnifying power of optical lens). The optical magnifying power becomes a magnification factor with respect to the size of the object.

There is no limitation to the magnifying power determining method. In a specific example, not the whole but part of the image data obtained from the observation visual field range may be displayed in the display range. In such a method, when a blur or deformation is generated in the periphery of the image, the image is displayed while the blur or deformation is cut. Alternatively, although the resolution becomes coarse, the apparent magnifying power may be increased by a so-called digital zoom. In such cases, the magnifying power is increased.

On the other hand, the observation visual field range may be moved in the horizontal and vertical directions or an XY-direction to obtain plurality of pieces of image data, and the pieces of image data may be coupled to display the wide visual field range in the display range. For example, the image having the magnifying power lower than the observable minimum magnifying power may be obtained, or the high-resolution image may be obtained so that the digital zoom may be performed to the high-resolution image later. In such cases, the magnifying power is decreased.

As described above, when the observation images in the same observation visual field range are obtained by at least two kinds of the observation devices while the magnifying powers of the observation devices differ from each other in the definition, inconveniently the desired observation images in the same observation visual field range cannot be obtained even if the images are obtained at the same "magnifying power". That is, even if the magnification observation is performed in the same visual field range, the magnifying observation apparatus in which the image is displayed on the large screen has the high magnifying power, and the magnifying observation apparatus in which the image is displayed on the small screen has the low magnifying power. As a result, when only the magnifying power is used as a reference, the size actually displayed by the observation device is variable, and it is unsuitable to the comparative observation.

Therefore, conventionally a method of previously observing the specimen whose size is well known to perform calibration work that confirms the magnifying power definition of each observation device, a method in which, in consideration of the difference of the magnifying power definition, the user manually computes the magnifying power at which the same observation visual field range can be observed, and a method of using not the same magnifying observation apparatus but the different electron microscope and optical digital microscope are taken as countermeasures. Unfortunately, a large amount of time and effort is required in any of the methods.

On the other hand, in the present embodiment, the unified magnifying power is defined in both the observation devices such that the same display size is obtained in the same observation visual field range. In other words, a value in which the same display range is divided by the observation visual field range is defined as the magnifying power. Therefore, even in the different observation devices, the designer defines the same display range to add the magnifying power conversion function, which allows the user to utilize the magnifying power defined in the same way. Therefore, when the magnifying power is set to one of the observation devices, the value that is converted into the magnifying power of the other observation device is displayed along with the set magnifying power. Alternatively, the magnifying power display of the other observation device may be changed, and the magnifying power of the other observation device may be displayed while converted into the magnifying power of one of the observation devices, or the magnifying power of the other observation device and the value converted into the magnifying power of one of the observation devices may be displayed together.

In addition to the fact that the magnifying power converted by one of the observation devices is converted by the magnifying power conversion section, the magnifying power reference can be converted into a third-reference magnifying power that is different from the magnifying powers of the observation devices. In this case, the optical image and the electron microscope image are displayed while unified by the third-reference magnifying power.
(Rotation Axis in Focal Point Variable Range)

The height adjusting section is set such that the rotation axis of the rotating device 30 is included in a height variable range in which the height can be adjusted. Thus, the specimen stage 33 is located in the center of the rotation axis, and the distance from the observation device 10 in each position to the specimen stage 33 can be kept constant even if the observation device 10 is rotated along the rotation axis. Therefore, once the focal distance is adjusted, the focused distance can be maintained even if the observation device 10 is moved, the visual field angle can always be changed in the focused state, and it is extremely advantageous to the tilt observation.

Figure 24:
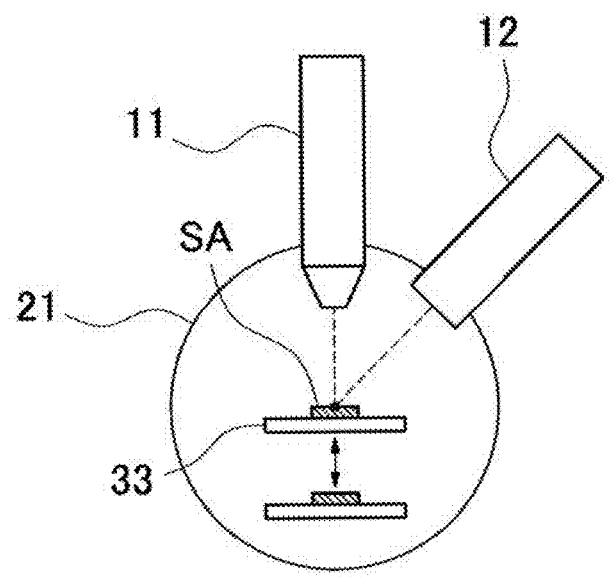
FIG. 24 is a schematic sectional view of the specimen chamber illustrating a state in which the specimen stage is lowered to align a surface on which a specimen is placed or an observation surface with a rotation axis.

More accurately, as illustrated in a schematic sectional view in FIG. 24 illustrating the setback, the specimen stage 33 is lowered from the rotation axis by the specimen height such that the observation position of the specimen surface, namely, the observation surface that is the upper surface of the specimen is the same to a height of the rotation axis, which allows the achievement of the working distance retaining state. Therefore, the height adjusting mechanism 80 can be lowered in the desired range from the position in which the specimen stage 33 is the same to a height of the rotation axis. This enables the specimen stage 33 to be lowered according to the height of the observation surface to correctly align the observation surface with the rotation axis.

Accordingly, in the movement of the specimen stage 33 in the Z-axis direction, an upper end stroke position of the specimen stage 33 can be elevated up to the position including at least the rotation axis, and the specimen stage 33 can be lowered to the position below at least the rotation axis.

(Adjustment of Setback)

The optical lens having the depth of field shallower than that of the electron lens is used in order to align the specimen surface with the rotation axis. The optical lens mounting position is previously adjusted such that the focal position of the optical lens is aligned with the rotation axis. The body portion 24 is rotated such that the optical axis of the optical lens becomes perpendicular to the specimen placement surface of the specimen stage 33, and the Z-axis position of the specimen stage 33 is adjusted such that the image of the optical lens is focused. At this time, because only the distance between the optical lens and the specimen is changed while the visual field is not moved, the adjustment is easy to perform. Then the focal point adjustment of the electron lens is performed in the similar procedure. Therefore, regardless of how the body portion 24 is rotated and tilted, the visual fields of the electron microscope and the optical microscope are not shifted.

(Presence or Absence of Focus Adjusting Section, Focal Point Fixed Type)

Figure 25:
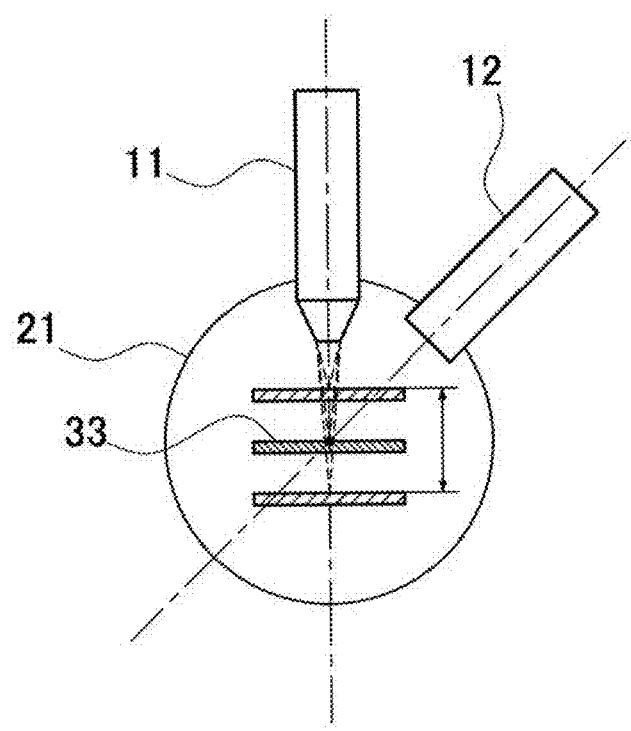
FIG. 25 is a schematic side view illustrating a positional relationship between a focal position of an electron lens and a rotation axis.
Figure 26:
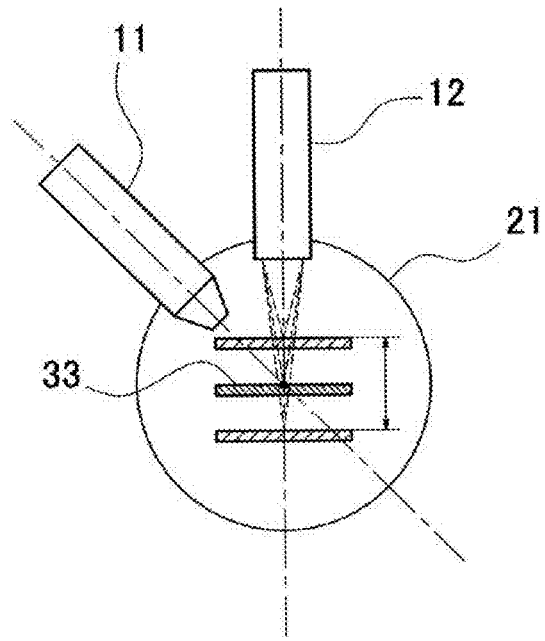
FIG. 26 is a schematic side view illustrating a positional relationship between a focal position of an optical lens and the rotation axis.
Figure 27:
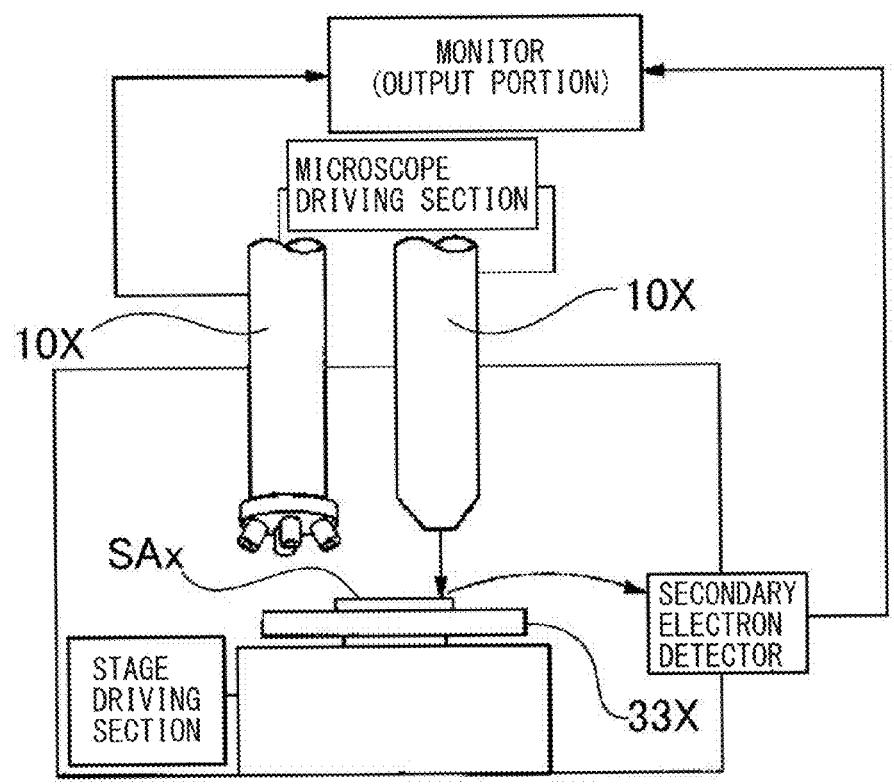
FIG. 27 is a block diagram illustrating a conventional apparatus including an electron microscope and an optical microscope.
Figure 28:
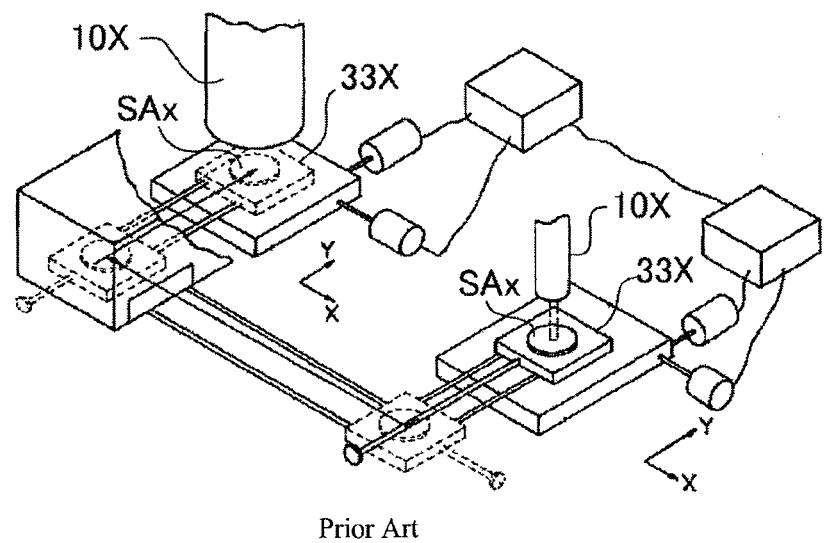
FIG. 28 is a perspective view illustrating another conventional apparatus in which the electron microscope and the optical microscope are switched.
Figure 29:
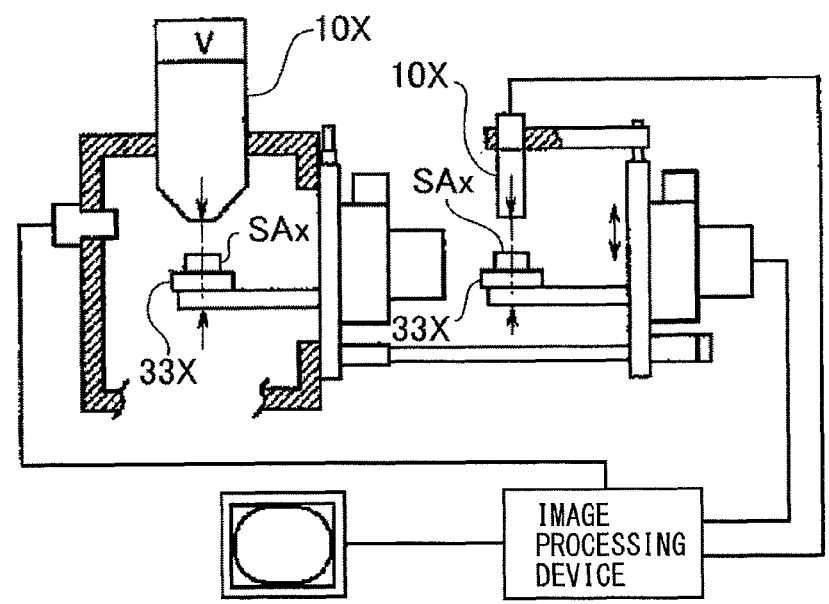
FIG. 29 is a block diagram illustrating another conventional apparatus including the electron microscope and the optical microscope.

When the focal distance of the observation device 10 is the fixed type, the working distance can correctly be adjusted to the focal position by adjusting the height of the specimen stage 33 with this configuration. Alternatively, when the observation device 10 includes the focus adjusting section, the working distance is set such that the rotation axis of the rotating device 30 is included in the focal distance range that can be adjusted by the focus adjusting section. For example, the electron beam imaging device 11 often includes the microscopic focus adjusting section 37 that can adjust the focal distance along the optical axis. In such cases, as illustrated in FIG. 25, the setting is previously performed such that the rotation axis is included in the focal position variable range, and the focal position of the electron lens is matched with the rotation axis position by adjusting the focal distance using the microscopic focus adjusting section 37. Similarly, when the optical imaging device 12 includes the optical focus adjusting section 38 that can adjust the focal distance along the optical axis, as illustrated in FIG. 26, the setting is previously performed such that the rotation axis is included in the focal position variable range, and the optical focus adjusting section 38 is adjusted such that the focal position is matched with the rotation axis.

(Second Embodiment)

In the above example, the optical imaging device 12 and the electron beam imaging device 11 are combined by way of example. The present invention can be applied to not only the configuration in which the optical imaging device 12 and the electron beam imaging device 11 are combined but also the configuration in which the optical imaging device 12 and the electron beam imaging device 11 are added if needed. For example, as described above, the magnifying observation system illustrated in the block diagram in FIG. 18 can be configured by detachably mounting the optical imaging device 12 on the magnifying observation system with the mount 39 interposed therebetween. Thus, the optical imaging device 12 can be added if needed while the magnifying observation system is used as the electron microscope. Therefore, the useful magnifying observation system having excellent flexibility and extendibility in which options can be added and removed according to the observation application can be constructed.

The magnifying observation apparatus of the present invention can suitably be applied to the function of performing scaling display of the obtained observation image in an electron beam appearance inspection apparatus, an electron beam length measuring apparatus, a particle beam inspection apparatus, and the like, which are used in a process of evaluating and measuring a characteristic of a semiconductor element with the electron beam or the ion beam that are the charged particle. In addition to the SEM, the magnifying observation apparatus of the present invention can be applied as the lens of the electron beam imaging device 11 to a TEM, Scanning Probe Microscopes (SPM) such as a Scanning Tunneling Microscope (STM) and an Atomic Force microscope (AFM), a laser microscope, and an X-ray microscope.

What is claimed is:

1. A magnifying observation apparatus comprising:
a body portion has a substantially cylindrical shaped outer surface and an internal space of the body portion being able to decompress as a specimen chamber;
a pair of end-face plates that closes end faces of the body portion, the end faces being disposed opposite to each other;
an electron beam imaging device as a first observation device, the electron beam imaging device being mounted on a first position of the cylindrical shaped outer surface of the body portion to obtain an electron microscope image in the specimen chamber and having a first optical axis;
an optical imaging device as a second observation device, the optical imaging device being mounted on a second position in the cylindrical shaped outer surface of the body portion to obtain an optical image in the specimen chamber, the second position being different from the first position and having a second optical axis having an intersection with the first optical axis of the electron beam imaging device within the specimen chamber;
a rotating device configured to rotate the body portion, and the electron beam imaging device and the optical imaging device along the cylindrical shaped outer surface of the body portion and around the intersection of both of the first optical axis and the second optical axis as a rotation axis such that a distance from each of the electron beam imaging device and the optical imaging device to the rotation axis of the electron beam imaging device and the optical imaging device is kept constant, wherein the rotating device is configured a) to rotate the electron imaging device to a position that provides a same visual field as the optical imaging device or b) to rotate the optical imaging device to a position that provides a same visual field as the electron imaging device;
a specimen stage that is disposed in the specimen chamber to place a specimen of an observation target; and
a specimen stage adjusting section that adjusts a height of an observation surface for the specimen placed on the specimen stage to a position that is at substantially the same height as a height of the rotation axis.

2. The magnifying observation apparatus according to claim 1, wherein the rotating device is configured to simultaneously rotate the electron beam imaging device and the optical imaging device, and
a range in which the electron beam imaging device and the optical imaging device is rotated by the rotating device is configured such that loci of the electron beam imaging device and the optical imaging device at least partly overlap each other.

3. The magnifying observation apparatus according to claim 1, wherein the first position is on a first plane and the second position is provided on substantially the same plane as the first plane, and the first plane is substantially orthogonal to the rotation axis on the cylindrical shaped outer surface of the body portion.

4. The magnifying observation apparatus according to claim 1, wherein the first position and the second position are positioned to a degree to which the optical imaging device and the electron beam imaging device do not interfere with each other.

5. The magnifying observation apparatus according to claim 1, wherein at least part of the cylindrical shaped outer surface of the body portion and one of the end-face plates constitute a rotation part that is rotated by the rotating device,
the other end-face plate constitutes a fixed part that is not rotated irrespective of rotation motion of the rotating device, and
the specimen stage is mounted on the fixed part.

6. The magnifying observation apparatus according to claim 5, wherein the rotating device is disposed between the rotation part of the body portion and the fixed part of the end-face plate.

7. The magnifying observation apparatus according to claim 5, wherein any one of the end-face plates forms an opening and closing cover portion.

8. The magnifying observation apparatus according to claim 7, wherein the cover portion is the fixed part, and the specimen stage is mounted on the cover portion.

9. The magnifying observation apparatus according to claim 5, wherein the specimen stage includes a horizontal surface moving mechanism that moves the specimen stage in a horizontal plane while the specimen stage is maintained in a non-tilted state in a horizontal posture and a height adjusting mechanism that adjusts the height of the specimen stage.

10. The magnifying observation apparatus according to claim 9, wherein the horizontal surface moving mechanism and the height adjusting mechanism of the specimen stage are mounted on the fixed part side.

11. The magnifying observation apparatus according to claim 9, wherein the horizontal surface moving mechanism includes rotary operation knobs that adjust moving amounts of the specimen stage in an X-axis direction and a Y-axis direction, and
the height adjusting mechanism further includes a rotary operation knob that adjusts a moving amount of the specimen stage in a Z-axis direction.

12. The magnifying observation apparatus according to claim 7, wherein the cover portion is mounted on the body portion so as to be opened and closed in a sliding manner, and
the cover portion is configured to pull out the specimen stage together with the cover portion from an inside of the specimen chamber.

13. The magnifying observation apparatus according to claim 9, wherein a moving locus of the height adjusting mechanism includes focal point variable ranges of the electron beam imaging device and the optical imaging device.

14. The magnifying observation apparatus according to claim 1, wherein the electron beam imaging device includes an electron gun that irradiates the specimen with an electron beam, and
a detector is further provided in the specimen chamber in order to detect secondary electrons and/or reflection electrons irradiated from the electron gun and reflected by the specimen.

15. The magnifying observation apparatus according to claim 1, wherein a suction port is provided in one of the end-face plates, the suction port that sucks air in the specimen chamber to a decompression pump that decompresses the specimen chamber.

16. The magnifying observation apparatus according to claim 1, further comprising an in-specimen-chamber observation device as a third observation device to observe an environment in the specimen chamber, wherein
the in-specimen-chamber observation device obtains an optical image in which at least the specimen stage, the specimen placed on the specimen stage, and a leading end part of the electron beam imaging device are included in a visual field.

17. The magnifying observation apparatus according to claim 16, wherein an optical axis of the in-specimen-chamber observation device is substantially parallel to the rotation axis.

18. The magnifying observation apparatus according to claim 17, wherein the optical axis of the in-specimen-chamber observation device is located above the rotation axis.

19. The magnifying observation apparatus according to claim 1, further comprising a display section that displays an electron microscope image obtained by the electron beam imaging device and/or an optical image obtained by the optical magnifying observation device.

20. The magnifying observation apparatus according to claim 1, wherein an angle formed by the first position and the second position and a rotating center ranges from 30° to 50°.

21. The magnifying observation apparatus according to claim 2, wherein the range of the optical imaging device and the range of the electron beam imaging device overlap each other and are capable of rotating to a position previously occupied by either the electron beam imaging device or optical imaging device.

22. The magnifying observation apparatus according to claim 1, wherein the electron beam imaging device includes an electrostatic type or magnetic field type electron lens.

23. The magnifying observation apparatus according to claim 1, wherein a handgrip is provided in the body portion in order to manually rotate the body portion.

24. The magnifying observation apparatus according to claim 1, wherein the electron beam imaging device is mounted on the first position in a non-exchangeable manner, and
the optical imaging device is detachably mounted on the second position.

* * * * *